(12) United States Patent
Hayashi et al.

(10) Patent No.: US 8,029,877 B2
(45) Date of Patent: *Oct. 4, 2011

(54) CURABLE RESIN COMPOSITION, CURABLE RESIN COMPOSITION FOR FORMING PHOTOSENSITIVE PATTERN, COLOR FILTER, LIQUID CRYSTAL PANEL SUBSTRATE AND LIQUID CRYSTAL PANEL

(75) Inventors: Shinji Hayashi, Tokyo (JP); Shunsuke Sega, Tokyo (JP); Hiromu Taguchi, Aichi (JP); Mitsutaka Hasegawa, Aichi (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/796,063

(22) Filed: Jun. 8, 2010

(65) Prior Publication Data

US 2010/0238388 A1    Sep. 23, 2010

Related U.S. Application Data

(62) Division of application No. 12/426,423, filed on Apr. 20, 2009, now Pat. No. 7,758,930, which is a division of application No. 10/550,577, filed as application No. PCT/JP2004/004001 on Mar. 24, 2004, now Pat. No. 7,537,810.

(30) Foreign Application Priority Data

Mar. 24, 2003  (JP) ................................ 2003-080943
Mar. 24, 2003  (JP) ................................ 2003-080961
Mar. 24, 2003  (JP) ................................ 2003-080977
Mar. 24, 2003  (JP) ................................ 2003-080991

(51) Int. Cl.
*G02B 5/20* (2006.01)
*G03F 7/00* (2006.01)
*G02F 1/00* (2006.01)
*C09K 19/00* (2006.01)

(52) U.S. Cl. ................ 428/1.1; 428/1.6; 430/7; 430/20; 430/286.1; 522/121; 522/39; 522/65

(58) Field of Classification Search .......... 428/1.5–1.55, 428/1.1, 3, 1.6; 430/20, 281.1, 286.1, 7; 522/10, 39, 121, 142, 65
See application file for complete search history.

(56) References Cited

U.S. PATENT DOCUMENTS 4,079,041 A    3/1978  Baumann et al.
(Continued)

FOREIGN PATENT DOCUMENTS

JP    10-176014 A    6/1998
(Continued)

OTHER PUBLICATIONS

H. Kamiya; et al; "56.3: Development of One Drop Fill Technology for AM-LCDs", SID 01 Digest 56.3, pp. 1354-1357, 2007 (Exact date note given).

*Primary Examiner* — Susan W Berman
(74) *Attorney, Agent, or Firm* — Ladas & Parry LLP

(57) ABSTRACT

There are provided: a curable resin composition having a high exposure sensitivity and a good developing property, and thereby capable of forming an accurate and precise pattern; a liquid crystal panel substrate on which a protective film for covering a color layer or spacers for a liquid crystal layer, by using the curable resin composition, hardly causing a color irregularity and contrast irregularity; and a liquid crystal panel using the liquid crystal panel substrate and having a superior display quality. The curable resin composition of the present invention comprises: a copolymer (a) having a molecular structure in which a constitutional unit including an acidic functional unit and a constitutional unit including a photocurable functional group are linked at least; a photopolymerization initiator (h) having a tertiary amine structure; and a photocurable compound (c) having at least one acidic functional group and at least three photocurable functional groups.

9 Claims, 8 Drawing Sheets

U.S. PATENT DOCUMENTS

| | | |
|---|---|---|
| 5,319,101 A | 6/1994 | Long, II et al. |
| 5,362,603 A * | 11/1994 | Katoh et al. ............. 430/281.1 |
| 5,445,919 A * | 8/1995 | Wakata et al. ............ 430/287.1 |
| 6,013,415 A | 1/2000 | Sakurai et al. |
| 6,028,123 A | 2/2000 | Hirayama et al. |
| 6,048,653 A * | 4/2000 | Ochiai et al. .................... 430/7 |
| 6,120,973 A * | 9/2000 | Itano et al. ............... 430/285.1 |
| 6,140,019 A | 10/2000 | Sakurai et al. |
| 6,255,034 B1 | 7/2001 | Shimada et al. |
| 6,410,206 B1 | 6/2002 | Ueda et al. |
| 6,730,763 B1 | 5/2004 | Okazaki et al. |
| 7,371,783 B2 | 5/2008 | Tatsuzawa et al. |
| 7,399,574 B2 | 7/2008 | Hayashi et al. |
| 7,537,810 B2 | 5/2009 | Hayashi et al. |
| 7,758,930 B2 * | 7/2010 | Hayashi et al. ................ 428/1.1 |
| 2009/0202749 A1 | 8/2009 | Hayashi et al. |

FOREIGN PATENT DOCUMENTS

| | | |
|---|---|---|
| JP | 10-221848 A | 8/1998 |
| JP | 10-287822 A | 10/1998 |
| JP | 10-332929 A | 12/1998 |
| JP | 11-172150 A | 6/1999 |
| JP | 11-212262 A | 8/1999 |
| JP | 11-337949 A | 12/1999 |
| JP | 2000-105456 A | 4/2000 |
| JP | 2000-250217 A | 9/2000 |
| JP | 2000-298340 A | 10/2000 |
| JP | 2001-091954 A | 4/2001 |
| JP | 2002-116538 A | 4/2002 |
| JP | 2002-293837 A | 10/2002 |
| JP | 2002-341530 A | 11/2002 |
| JP | 2002-341531 A | 11/2002 |
| JP | 2003-015288 A | 1/2003 |
| JP | 2003-021839 A | 1/2003 |
| JP | 2004-027209 A | 1/2004 |
| JP | 2004-177498 A | 6/2004 |

* cited by examiner

SEM Picture (Example A3)

SEM Picture (Comparative Example A4)

SEM Picture (Example C3)

SEM Picture (Comparative Example C4)

CURABLE RESIN COMPOSITION, CURABLE RESIN COMPOSITION FOR FORMING PHOTOSENSITIVE PATTERN, COLOR FILTER, LIQUID CRYSTAL PANEL SUBSTRATE AND LIQUID CRYSTAL PANEL

TECHNICAL FIELD

The present invention relates to: a curable resin composition having high exposure sensitivity and good developing property; a color filter made of the curable resin composition having reduced color irregularity or reduced contrast irregularity provided with a color layer, a protective film for covering the color layer or a spacer for a liquid crystal layer; a liquid panel substrate capable of obtaining a uniform cell gap; and a liquid panel having an excellent display quality provided with the color filter or the liquid crystal panel substrate.

BACKGROUND ART

In a liquid crystal panel, a display side substrate (front side substrate) and a liquid crystal driving side substrate (rear side substrate) are faced with each other and a liquid crystal compound is filled and sealed between these substrates to form a thin liquid crystal layer. The liquid crystalline alignment in the liquid crystal layer is electrically controlled through the liquid crystal driving side substrate to selectively change the amount of light transmitted through the display side substrate or light reflected thereon, thereby performing display.

For a liquid crystal panel, various driving systems are known, examples of which include a static driving system, a simple matrix system, and an active matrix system. In recent years, color liquid crystal display devices using a liquid crystal panel according to an active matrix system or a simple matrix system have spread rapidly as flat displays for personal computers, portable information terminals and so on.

FIG. 1 illustrates an example of a liquid crystal panel according to an active matrix system. A liquid crystal panel 101 has a structure wherein a color filter 1, which is a display side substrate, is faced with a TFT array substrate 2, which is a liquid crystal driving side substrate, to form a gap part 3 of about 1 to 10 μm; the gap 3 is filled with a liquid crystal L; and the periphery thereof is sealed up with a sealant 4. The color filter 1 has a structure including a black matrix layer 6 formed in a predetermined pattern for shading light from the boundary part between the pixels, a color layer 7 with a plurality of colors (in general, the three primary colors of red. (R), green (G), and blue (B)) arranged in a predetermined order for forming each pixel or, recently, a color layer using a hologram, a protective film 8, and a transparent electrode film 9 successively laminated on a transparent substrate 5 in this order from the side close to the transparent substrate. On the other hand, the TFT array substrate 2 has a structure wherein TFT elements are arranged on the transparent substrate and the transparent electrode film is disposed (not illustrated). Moreover, an alignment film 10 is provided, respectively, on both inner surface sides of the color filter 1 and the TFT array substrate 2 facing thereto. Furthermore, spherical or rod-like particles 11, which have a constant size and are made of glass, alumina, a plastic or the like, are dispersed as spacers in the gap part 3 for constantly and homogeneously maintaining the cell gap between the color filter 1 and the electrode substrate 2. A color image can be obtained by controlling the light transmittance of the pixels colored in respective colors or the liquid crystal layer behind the color filter.

The protective film 8 formed in the color filter has both functions for planarizing the color filter and for protecting the color layer when a color layer is provided in the color filter. In a color liquid crystal display device, when the flatness of the transparent electrode film 9 deteriorates due to the existence of gap unevenness derived from waviness on the surface of the transparent substrate of the color filter, gap unevenness among the R, G and B pixels, or gap unevenness within each pixel, color irregularity or contrast irregularity is generated so as to give rise to a problem of image quality deterioration. Therefore, a high flatness is required for the protective film.

In the case that the fine particles 11 as shown in FIG. 1 are dispersed as the spacers, the particles 11 are randomly dispersed whether they are behind the black matrix layer 6 or behind the pixels. In the case that the particles 11 are disposed behind the display region, that is, behind the color layer, a back lighting beam transmits through the particle 11 part and further the orientation of the liquid crystal is disturbed in the vicinity of the particles 11. As a result, the display image quality is remarkably deteriorated. Thus, as shown in FIG. 2, instead of dispersing the particles 11, column-shaped spacers 12 having a height corresponding to the cell gap are formed on the inner surface side of the color filter and in the region correspondingly to the positions where the black matrix layer 6 is formed (namely, non-display region).

The color layer 7, the protective film 8 and the column-shaped spacers 12 can be made of a resin. The color layer 7 is required to be formed in a predetermined pattern for each color pixel. Considering the adhesion property and the sealing property of the sealing part, the protective film 8 is preferably one capable of covering only the region of the transparent substrate with the color layer formed thereon. Moreover, the column-shaped spacers 12 are required to be formed accurately in the region where the black matrix layer 6 is formed, that is, in the non-display region. Therefore, it is proposed that the color layer 7, the protective film 8 and the column-shaped spacers 12 are formed with the use of a photosensitive composition which can be alkali-developed after regions to be cured is selectively exposed to light.

In recent years, an increase in the area of liquid crystal display devices have been advancing, and the necessity that their cell gap should be kept even over the whole of their wide substrate has been becoming larger. When the area of the substrate is large, the substrate is distorted even by a relatively small external force. Therefore, the necessity that the unevenness of the gap based on such a distortion should be prevented has also been generated. In recent years, the thickness of the liquid crystal layer, that is, the cell gap has become smaller in order to improve display responsibility. Thus, the necessity that the small gap should be precisely maintained has also been generated.

Furthermore, in recent years, in order to remove a heating process and a slow cooling process from the process for assembling a color filter and a TFT array substrate (cell bonding) so as to make the process simpler and improve productivity, a method of performing cell bonding at a room temperature (room-temperature cell bonding method) has been proposed (Hiroyuki Kamiya et al., "Development of One Drop Fill Technology for AM-LCDs", SID 01 DIGEST, 56.3, p. 1354-1357).

Furthermore, in order to improve the productivity of the cell bonding process, a One Drop Fill Technology (ODF technique) is proposed. In this method, a predetermined amount of a liquid crystal droplet is dropped into a liquid crystal sealing face of a liquid crystal panel substrate such as a color filter or a TFT array substrate, and another liquid crystal panel substrate is opposed and adhered thereto in a vacuum in the state that a predetermined cell gap can be kept. This method can make the processes thereof simpler than any conventional cell bonding process. According to any conventional cell bonding process, a color filter and a IFT array substrate are opposed and adhered to each other in the state that a predetermined cell gap can be kept, and subsequently a liquid crystal is filled and sealed into the cell gap via a filling-opening made in an end of the adhesion product, using a capillary phenomenon and a pressure difference between inside and outside of the cell gap. Following the above-mentioned increase in the display region and the reduction in the cell gap, it has been becoming difficult that the liquid crystal is smoothly filled into the gap. On the other hand, according to the ODF technology, a liquid crystal is easily filled into a cell gap even if the area of a liquid crystal panel substrate becomes large and its cell gap is narrow. This new method, which is superior in productivity, may become the main current hereafter.

Thus, along with recent advances of expanding the display area and narrowing the cell gap of the liquid crystal display device, only a slight failure in the uniformity or evenness of the cell gap greatly affects on the display performance, and thereby is apt to cause a deterioration of the display quality such as the display unevenness. Therefore, a request for the accurate and uniform cell gap is becoming more severe. For this reason, there is an increasing demand for forming and maintaining the cell gap with column-shaped spacers, accurately, precisely and uniformly.

Patterning layers of the color filter such as a color layer, a protective film and column-shaped spacers can be formed by forming a coating film of a photocurable resin composition on a substrate, and selectively exposing with light a desired region to be cured, and then alkali-developing, and further curing by heating or the like.

As the photocurable resin compatible for the alkali development, a composition in which a polyfunctional acryl monomer and a photopolymerization initiator are compounded in an alkali soluble binder can be used.

Japanese Patent Application Laid-Open No. 2000-105456 discloses a copolymer suitable for an alkali soluble binder, which has an alkali soluble carboxyl group and a radical polymerizing (meth)acryloyl group and has a photocurability per se.

In the case that the color layer such as pixel and black matrix is formed by using the photocurable resin composition compatible for the alkali development, a higher color concentration can be obtained by increasing the content ratio of the colorant. In the case that a pigment is used as the colorant, the content ratio of a pigment dispersing agent also increases. As well, if the content ratio of the photopolymerization initiator is increased, the sensitivity of the photocurable resin increases, so that it can be cured for a short time with less light exposure. However, if the content ratio of the colorant, the dispersing agent and/or the photopolymerization initiator and the like is high, the content ratio of the alkali soluble binder decreases. Thereby, the curability, the alkali developing property of the resin, and the shape after development and the like deteriorate.

If a polyfunctional monomer is compounded in the photocurable resin in accordance with an increase of the colorant, the curability increase, and the sensitivity, the hardness, the strength, the adhesiveness and the like of the color pattern are improved. However, compounding or increasing the polyfunctional monomer further decreases the content ratio of the alkali soluble binder. Thereby, the developing property of the photocurable resin further deteriorates. If the alkali developing property of the photocurable resin deteriorates, various problems become noticeable, such as the deterioration of the pattern edge shape, the formation of the inverse tapered shape, the elongation of the developing time, the residue on the exposed surface via the development of the substrate and so on.

On the other hand, the polymerization initiator having the tertiary amine structure in its molecule is very effective as a polymerization initiator, because the tertiary amine structure part acts as an oxygen quencher, so that a radical generated from the polymerization initiator is not likely to be deactivated by oxygen. However, if the content of this initiator is excessively increased in order to improve the sensitivity, the amount of the alkali soluble binder and the polyfunctional monomer decreases relatively in the composition. This may cause deterioration in the curability such as the hardness or strength after curing, or in the alkali developing property such as the developing speed, the plate making property (pattern accuracy) and residue.

In the case that a large amount of the polymerization initiator having the tertiary amine structure in its molecule is mixed with the copolymer disclosed in the aforementioned Japanese Patent Application Laid-Open No. 2000-105456, another problem arises in addition to the above problems. That is, in this case, the tertiary amine structure coordinates with a carboxyl group of the copolymer, and the acidity and the alkali solubility of the copolymer decreases. Thereby, a superior alkali developing property of the copolymer having the carboxyl group and the (meth)acryloyl group cannot be fully exerted. If it is contemplated compensating the alkali developing property of the copolymer itself, taking into account increasing the amount of the polymerization initiator having the tertiary amine, another problem may arise. That is, if the amount of the carboxyl group to be incorporated into the copolymer increases, the solubility of the binder in the solvent decreases.

On the other hand, Japanese Patent Application Laid-Open No. 2001-91954 discloses a photosensitive composition for column-shaped spacers which is a photosensitive composition mainly comprising resin, monomer, photopolymerization initiator and solvent, and characterized in that a specific structured polyfunctional acryl monomer having a carboxyl group and a specific structured polyfunctional acryl monomer having no carboxyl group are contained as the monomer. In Japanese Patent Application Laid-Open No. 2001-91964, it is contemplated improving the developing property when the column-shaped spacers are formed, by using a monomer represented by the following formula (101), and contemplated improving the adhesiveness between the column-shaped spacers and a glass substrate by using a monomer represented by the following formula (102).

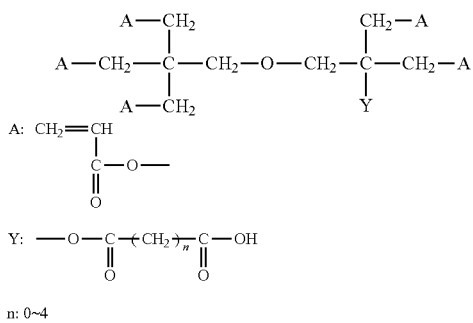

-continued

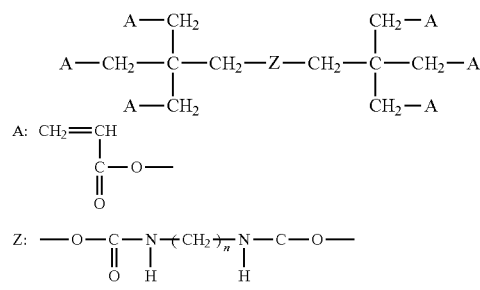

Formula (102)

n: 1~4

However, it cannot be said that the alkali developing property is sufficient even in the case of the photosensitive composition disclosed in Japanese Patent Application Laid-Open No. 2001-91954.

Meanwhile, the liquid crystal display device today becomes more advanced in their image quality and resolution. Along with this, display pixels become finer, and the concentration of the pigment to be contained in the color filter (color layer) becomes higher.

In order to obtain the liquid crystal display device with a high image quality and a high resolution, individual pixels are required to be finer, while the displacement of the column-shaped spacer and the color layer, respectively, in the liquid crystal panel is prevented, and the cell gap unevenness is prevented as much as possible. For this purpose, it is required that both a patterning accuracy during formation of the column-shaped spacers and a patterning accuracy during formation of the color layer are improved, and the strength of the column-shaped spacers is improved.

The strength of the column-shaped spacers can be improved by increasing the amount of the monomer (including oligomers) to be used as a material thereof in the photosensitive composition, and thereby increasing the cross-link density. However, along with the increase of the monomer amount to be used, typically deterioration arises in the alkali developing property after selectively exposing with light the coating film made of the photosensitive composition by a photolithography or the like, for example.

As well, the concentration of the pigment to be contained in the color layer can be increased, by increasing the amount of the dispersing agent to be used. However, in the case of amine dispersing agent which is often used as a dispersing agent, along with the increase of the amount to be used, typically deterioration arises in the alkali developing property of the coating film made of the photosensitive composition (with the pigment dispersed).

The deterioration in the alkali developing property causes deterioration in the patterning accuracy. This is a factor of deteriorating the positioning accuracy and the shape accuracy of the color layer or the column-shaped spacers. As the result, this causes a reduction of the yield ratio, when a liquid crystal display device with a high image quality and a high resolution is produced.

DISCLOSURE OF INVENTION

The first object of the present invention is to provide a curable resin composition having a high exposure sensitivity and a good developing property, and thereby capable of forming an accurate and precise pattern; a liquid crystal panel substrate on which a protective film for covering a color layer or spacers for a liquid crystal layer, by using the curable resin composition, hardly causing a color irregularity and contrast irregularity; and a liquid crystal panel using the liquid crystal panel substrate and having a superior display quality.

The second object of the present invention is to provide a photosensitive composition capable of forming a coating film having a superior alkali developing property even if a pigment is contained, and easy to increase strength after curing.

The third object of the present invention is to provide a color filter easy to improve a patterning accuracy.

The fourth object of the present invention is to provide a liquid crystal panel substrate including spacers easy to improve strength and a patterning accuracy.

The fifth object of the present invention is to provide a liquid crystal panel easy to improve image quality and a resolution.

The sixth object of the present invention is to provide a curable resin composition having a high exposure sensitivity and a good developing property, and thereby capable of forming an accurate and precise pattern, and superior in various physical properties after curing, such as a coating film strength, a heat resistance and a chemical resistance; a liquid crystal panel substrate on which a protective film for covering a color layer or spacers for a liquid crystal layer, by using the curable resin composition, hardly causing a color irregularity and contrast irregularity; and a liquid crystal panel using the liquid crystal panel substrate and having a superior display quality.

The seventh object of the present invention is to provide a curable resin composition having a high elasticity after curing, particularly an elastic behavior suitable for column-shaped spacers; a liquid crystal panel substrate on which the protective film or convex spacers are formed by using the resin composition; and a liquid crystal panel.

The eighth object of the present invention is to provide a curable resin composition for color pattern having a high developing property, and capable of forming a fine pattern color layer with a high concentration, a suitable edge shape and a suitable tapered shape, and having a high exposure sensitivity; a color filter with a high image quality and a high resolution, on which a color layer is formed by using the curable resin composition; and a liquid crystal panel using the color filter and having a superior display quality.

The present invention solves one or more of the above problems.

The curable resin composition provide by the first aspect of the present invention comprises: a copolymer (a) having a molecular structure in which a constitutional unit including an acidic functional group and a constitutional unit including a photocurable functional group are linked at least; a photopolymerization initiator (b) having a tertiary amine structure; and a photocurable compound (c) having at least one acidic functional group and at least three photocurable functional groups.

Since the copolymer (a) has a molecular structure in which a constitutional unit including an acidic functional group and a constitutional unit including a photocurable functional group are linked at least, it has a function of improving both the alkali solubility and the cross-link density. However, there is a limit for the amount of the acidic functional group and the photocurable functional group which can be incorporated into the molecule of the copolymer (a). As well, if the content of the copolymer (a) is excessively increased in the composition, the viscosity of the composition disadvantageously rises.

On the contrary, in the present aspect, since the acidic polyfunctional photocurable compound (c) is added to the copolymer (a), the viscosity of the composition does not excessively rise. Because there is a large amount of the acidic functional group and the photocurable functional group in the composition, even if the content of the photopolymerization initiator (b) having the tertiary amine structure is increased in order to improve the sensitivity. As well, since there is a large amount of the acidic functional group in the composition, a disadvantageously influence of the tertiary amine structure on the alkali developing property becomes small relative to an entire composition. Therefore, it is possible to obtain the curable resin composition superior in any of the sensitivity, the photocurability and the alkali developing property.

The constitutional unit having the photocurable functional group of the copolymer (a) preferably includes an ethylenically unsaturated bond as the photocurable functional group, form the viewpoint of improving the sensitivity and the physical properties of the coating film.

In an embodiment, the copolymer (a) may include a constitutional unit represented by a following formula (1) and/or a constitutional unit represented by a following formula (2), as the constitutional unit having the photocurable unit.

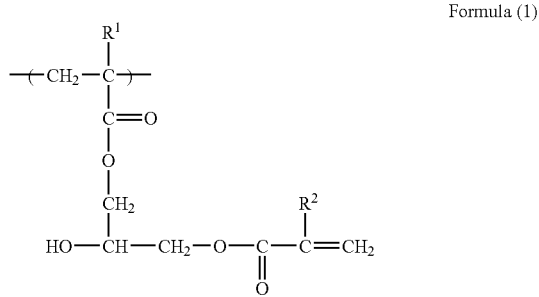

Formula (1)

In the above formula, R1 is a hydrogen or an alkyl group having 1 to 5 carbon atoms, and R2 is a hydrogen or a methyl group.

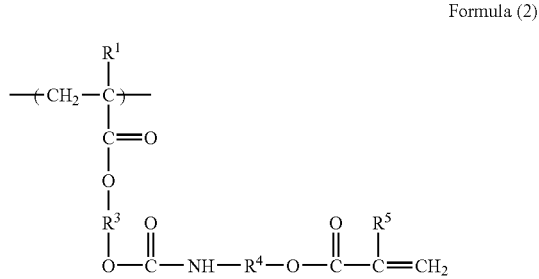

Formula (2)

In the above formula, R1 is the same as defined above, R3 is an alkylene group having 2 to 4 carbon atoms, R4 is an alkylene group, and R5 is a hydrogen or a methyl group.

Preferably, the copolymer (a) has a molecular weight of 3,000 to 1,000,000, from the viewpoint of obtaining the appropriate coating viscosity and the sufficient plate making property.

The curable resin composition may further comprise a photocurable compound (d) having at least two photocurable functional groups.

Preferably, a weight ratio ((a)/{(c)+(d)}) of the copolymer (a) to a total of the photocurable compound (c) and the photocurable compound (d) is up to 1.5, on the basis of solid content, from the viewpoint of obtaining the sufficient curability of the coating film to be formed, and obtaining suitable various physical properties such as the adhesive strength and the heat resistance.

Preferably, in the curable resin composition, the photopolymerization initiator (b) having the tertiary amine structure is contained at least 10% by weight, on the basis of solid content, in order to improve the sensitivity sufficiently.

The curable resin composition for photo-patterning of the first aspect, is suitable for fabricating a liquid crystal panel substrate, particularly, suitable for forming a protective film for covering a color layer of a color filter or forming column-shaped spacers to maintain a cell gap of a liquid panel. That is, by using the curable resin composition of the present invention, it is possible to obtain the column shaped-spacers having a superior developing property and thereby having a superior accurate dimensional stability, and having a high productivity owing to the high sensitivity, and the protective film having a high flatness.

In the liquid crystal panel substrate provided by the first aspect comprises: a transparent substrate; and a colorant layer disposed on the transparent substrate, and optionally comprises: a protective film for covering the colorant layer; and/or a spacer disposed in a non-display region on the substrate, and characterized in that at least one of the protective layer and the spacer is formed by curing the curable resin composition according to the present invention.

In the liquid crystal panel substrate of the first aspect, since the protective film or spacers are formed by using the curable resin composition of the present invention, a high flatness protective film or an accurate convex spacer having a suitable pattern edge shape can be obtained. Therefore, the display unevenness hardly causes when the liquid crystal panel is assembled.

In the liquid crystal panel of the first aspect, at least one of the display side substrate such as a color filter and the liquid crystal driving side substrate such as a TFT array substrate is the liquid crystal panel substrate according to the present invention. Thereby; it is possible to maintain the cell gap accurately and uniformly, during a cell bonding and thereafter handling. Therefore, the liquid crystal panel hardly causes the display unevenness and is superior in the image quality.

According to the first aspect, the first object among the above listed objects can be mainly achieved.

Next, the curable resin composition provided by the second aspect is characterized in that the photocurable compound (c) is an acidic group-containing monomer (c3) represented by a following formula (ii).

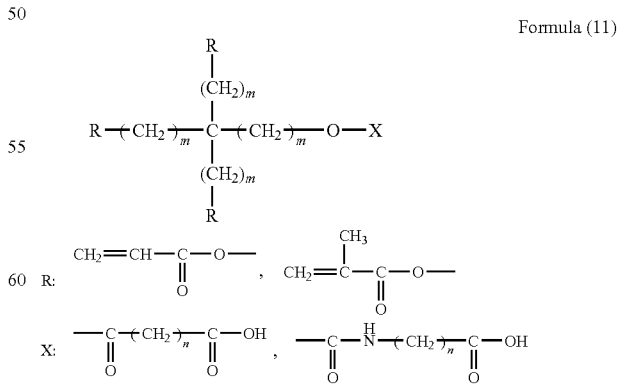

Formula (11)

In the above formula, each of m and n is an integer equal to 1 or more than 1, independently.

The acidic group-containing monomer (c3) is a trifunctional monomer having three ethylenically unsaturated bonds, into which carboxyl groups are incorporated as acidic groups.

Containing this trifunctional monomer in the curable resin composition makes it possible to improve the exposure sensitivity of the curable resin composition and improve the developing property after the selective exposure. As well, incorporating the acidic groups into the trifunctional monomer makes it possible to improve the alkali developing property after the selective exposure. Furthermore, the acidic group-containing monomer (c3) represented by the formula (11) has a hydrophobic part and a hydrophilic part, which are distinctly divided. Thereby, it is superior in the dispersibility of the pigment.

Therefore, using the acidic group-containing monomer (c3) makes it possible to improve obtain the curable resin composition capable of forming the coating film having a high alkali developing property not only in the case that no pigment is contained but also in the case that a pigment is contained. As well, it is possible to obtain the curable resin composition capable of forming the coating film having a superior alkali developing property, even in the ease that the content of the acidic group-containing monomer (c3) is increased in order to improve the cross-link density during curing.

In an embodiment of the present aspect, it is possible to form a convex pattern (so-called a forward tapered shape convex pattern) having a lower area S1 and an upper area S2 satisfying a relationship S2≦S1, in processes including: forming a coating film and subjecting the coating film sequentially to a selective exposure and an alkali developing treatment.

In another embodiment of the present aspect, the composition further comprises a photocurable compound (d) having at least two photocurable functional groups (however, other than the photocurable compound (c)).

In another embodiment, the curable resin composition further comprises at least one kind of colorant (e), wherein a weight ratio ((e)/(c3)) of the acidic group-containing monomer (c3) to the colorant (e) satisfies a relationship $0.3<((e)/(c3))<0.6$.

The curable resin composition of each embodiment is suitable as a material for forming the color layer of the color filter, the protective film for covering the color layer, and the column-shaped spaces to maintain the cell gap of the liquid crystal panel. Thereby, a desired thickness of the color layer or the protective film, or a desired height of the column-shaped spacers can be easily formed with a high patterning accuracy.

The color filter according to the second aspect comprises: a transparent substrate; and a colorant layer disposed on the transparent substrate, and optionally comprises: a protective film for covering the colorant layer; and/or a spacer disposed in a non-display region on the transparent substrate, wherein at least one of the colorant layer, the protective layer and the spacer is formed by curing the photosensitive composition according to any one of the above-mentioned embodiments.

The curable resin composition of the second aspect makes it possible to form the coating film having a superior alkali developing property not only in the case that no pigment is contained but also in the case that a pigment is contained. Thereby, by using this curable resin composition, the color layer of the color filter, the protective film and the spacer can be formed with a high patterning accuracy.

In the case that the color layer is formed from the curable resin composition, a high patterning accuracy can be easily obtained even if the concentration of the pigment is increased in the color layer. As well, in the case that the spacer, particularly the column-shaped spacer, is formed from this curable resin composition, a forward taper shaped and high strength spacer can be easily formed with a high patterning accuracy.

The liquid crystal panel substrate according to the second aspect has a plurality of spacers disposed in a non-display region on a substrate, wherein the spacers are formed by curing the photosensitive composition according to any one of the above listed embodiments. Forming the spacer, especially column-shaped spacer, from the curable resin composition above mentioned makes it possible to easily form a high strength spacer with a high accuracy. Thereby, the cell gap irregularity of the liquid crystal panel can be prevented.

The first liquid crystal panel according to the second aspect is a liquid crystal panel comprising: a display side substrate; a liquid crystal driving side substrate opposite to the display side substrate; and a liquid crystal filled and sealed between these two substrates, wherein the display side substrate is the color filter mentioned above.

The second liquid crystal panel according to the second aspect is a liquid crystal panel comprising: a display side substrate; a liquid crystal driving side substrate opposite to the display side substrate; and a liquid crystal filled and sealed between these two substrates, wherein the liquid crystal driving side substrate is the liquid crystal panel substrate mentioned above.

In these first and second liquid crystal panels, it is possible to easily improve a patterning accuracy for parts formed from at least the photosensitive composition mentioned above. Thereby, it is easy to improve an image quality and a resolution. Particularly, forming the color layer or the column-shaped spacers from the above-mentioned photosensitive composition makes it possible to easily improve an image quality and a resolution.

According to the second aspect, the second to fifth objects among the above-listed objects can be mainly achieved.

Next, the curable resin composition provided by the third aspect is characterized in that an imide group-containing copolymer (a1) containing a constitutional unit including a cyclic imide group represented by a following formula (19) is used as the copolymer (a) in the first aspect.

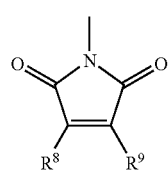

Formula (19)

In the above formula, each of R8 and R9 is an alkyl group having 4 or less carbon atoms independently, or one of R8 and R9 is a hydrogen atom and the other is an alkyl group having 4 or less carbon atoms, or both R8 and R9 together form a carbon ring.

When the curable resin composition of the third aspect is applied to some substrate to form a coating film, and the coating film is irradiated with an activation energy beam such as UV ray or electron beam, the cyclic imide group of the imide group-containing co-polymer (a1), and the photocurable group of the acidic polyfunctional photocurable compound (c), and if contained, the photocurable group contained in the imide group-containing copolymer (a1), and the photocurable compound (d) which may be contained if needed cause a photoradical polymerization reaction, and cyclic imide groups cause a dimerization reaction to each other, so that the cross-linkage is formed in the molecule of the imide group-containing copolymer, and cured. After curing, a fine pattern can be formed by an alkali developing, because both imide group-containing copolymer (a1) and the acidic polyfunctional photocurable compound (c) have the acidic functional group, respectively.

The photopolymerization initiator (c) having the tertiary amine structure has the tertiary amine structure as an oxygen structure. Thereby, a radical generated from the initiator hardly be deactivated, so that the sensitivity can be improved.

There is a limit for the amount of the photocurable group and the acidic functional group which can be incorporated into the molecule of the binder in order to improve the alkali solubility and the cross-link density of the curable resin composition. Additionally, if it is contemplated improving the cross-link density and the alkali solubility by simply increasing the amount of the binder polymer having the photocurable group and the acidic functional group, the viscosity of the curable resin composition increases and thereby the coating property is easily deteriorated. As well, if the polyfunctional monomer is compounded in the curable resin composition, the alkali solubility cannot be improved, although the cross-link density can be increased.

On the contrary, in the present aspect, since the acidic polyfunctional photocurable compound (c) is added to the imide group-containing copolymer (a1), the reaction site density of the cross-linking reaction can be increased without deteriorating the alkali developing property, and furthermore the viscosity of the composition does not excessively increase. Additionally, since the cyclic imide group is highly reactive, the sensitivity of the resin composition can be improved. Furthermore, the imide group contained in the imide-group-containing copolymer (a1) used in the present invention has a nature of generating a radical with a light irradiation and causing a photodimerization reaction. That is, the imide group itself has a photopolymerization initiating function. Thereby, the curable resin composition of the present aspect containing the imide group-containing copolymer has a merit that the amount of the polymerization initiator (b) can be reduced, and thereby the content of the cross-linking component can be relatively increased. Therefore, it is possible to obtain the curable resin composition superior in any of the sensitivity, the photocurability and the alkali developing property. Additionally, since the curable resin composition of the present aspect is superior in a point that the plastic deformation of pattern hardly causes, because the cyclic imide group is incorporated and thereby the elasticity at a room temperature after curing is high. Particularly, it is suitable for forming a convex spacer.

Preferably, the imide group-containing copolymer (a1) further contains a constitutional unit including another photocurable functional group other than the cyclic imide group, from the viewpoint of the high reactive site density of the cross-linking reaction, and various superior physical properties such as the coating film strength, the heat resistance and the chemical resistance after curing.

Preferably, the constitutional unit including the photocurable functional group of the imide group-containing copolymer (a1) contains an ethylenically unsaturated bond as the photocurable functional group, from the viewpoint of improving the reactivity and the coating film strength after curing.

In an embodiment, the imide group-containing copolymer (a1) may contain a constitutional unit represented by a following formula (21) as the constitutional unit including the cyclic imide group and a constitutional unit represented by a following formula (3) as the constitutional unit including the acidic functional group.

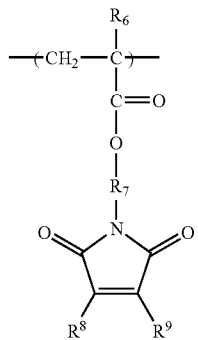

Formula (21)

In the above formula, R6 is a hydrogen or an alkyl group having 1 to 5 carbon atoms, R7 is an alkylene having 1 to 6 carbon atoms, R8 and R9 are the same as defined above.

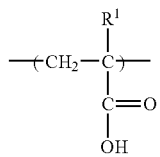

Formula (3)

In the above formula, R1 is a hydrogen or an alkyl group having 1 to 5 carbon atoms.

Preferably, the imide group-containing copolymer (a1) contains an alcoholic hydroxy group in its molecule.

In an embodiment, the curable resin composition may have at least 60% of an elastic deformation ratio [(elastic deformation amount/total deformation amount)×100] against a compressive load of 2.0 GPa at a room temperature after curing. In this case, the composition can be used as a pattering material having a high elastic deformation modulus and a low plastic deformation modulus at a room temperature after curing, especially suitable for forming a convex spacer of a liquid crystal panel.

In the curable resin composition of the present aspect, a photocurable compound (d) having at least two photocurable functional groups other than the photocurable compound (c) may be contained.

Preferably, the photocurable compound (d) contains at least three ethylenically unsaturated bonds, as well as an alcoholic hydroxy group, from the viewpoint of improving the reactivity and thereby the sensitivity and the curability.

Preferably, a solid content weight ratio ((a1)/(c)) of the photocurable compound (c) to the imide group-containing copolymer (a1) in a case that the curable resin composition includes no photocurable compound (d), or a solid content weight ratio ((a1)/{(c)+(d)}) of a total of the photocurable compound (c) and the photocurable compound (d) to the imide group-containing copolymer (a1) in a case that the curable resin composition includes the photocurable compound (d), is 0.7 or less, from the viewpoint of obtaining the sufficient curability of the coating film to be formed, and obtaining suitable various physical properties such as the adhesive strength and the heat resistance.

In the curable resin composition of the present aspect, the reaction can be proceeded sufficiently by containing the photopolymerization initiator (b) of 0.05 to 5% by weight, on the basis of solid content.

The curable resin composition for forming a photosensitive pattern of the present aspect is suitable for fabricating a liquid crystal panel substrate. Particularly, it is suitable for forming a protective film for covering a color layer of a color filter, and forming a column-shaped spacer to maintain a cell gap of a liquid crystal panel. That is, using the curable resin composition makes it possible to form a high flatness protective film and an accurate column-shaped spacer superior in various physical properties and the dimensional stability owing to the superior developing property, and having a high productivity owing to the high sensitivity.

The liquid crystal panel substrate provided by the present aspect comprises: a transparent substrate; and a colorant layer disposed on the transparent substrate, and optionally comprises: a protective film for covering the colorant layer; and/or a spacer disposed in a non-display region on the substrate, and characterized in that at least one of the protective layer and the spacer is formed by curing the curable resin composition according to the present aspect.

In the liquid crystal panel substrate of the present aspect, the protective film or the spacer is formed by using the curable resin composition of the present invention. Thereby, it is possible to obtain a high flatness protective film or an accurate convex spacer having a suitable pattern edge shape and suitable physical properties, as well the display unevenness hardly causes when the liquid crystal panel is assembled.

Particularly, the liquid crystal panel substrate according to the present aspect has a sufficient hardness hardly causing a plastic deformation against a compressive load at a room temperature and has a flexibility followable contraction and expansion of the liquid crystal in a temperature range of a use environment of the liquid crystal display device, in the case that the spacer has at least 60% of an elastic deformation ratio [(elastic deformation amount/total deformation amount)× 100] against a compressive load of 2.0 GPa at a room temperature. Therefore, the liquid crystal panel substrate of the present invention makes it possible to form an accurate and uniform cell gap without any plastic deformation during the lamination process by a room temperature cell bonding method. Particularly, it can be suitably used, even in the case that the room temperature cell bonding is performed by the ODF method at a room temperature.

In the liquid crystal panel according to the present aspect, at least one of the display side substrate such as a color filter and the liquid crystal driving side substrate such as a TFT array is the liquid crystal panel substrate according to present invention. Thereby, it is possible to maintain the cell gap accurately and uniformly, during the cell bonding and thereafter handling. Therefore, the liquid crystal panel of the present aspect hardly causes the display unevenness and is superior in its image quality.

According to the third aspect, the sixth or seventh object among the above-listed objects can be mainly achieved.

Next, the curable resin composition provided by the fourth aspect of the present invention is characterized in that the composition further comprises a colorant (e) and is used for forming a colorant pattern.

The curable resin composition of the present aspect contains a large amount of the photopolymerization initiator (b) having a tertiary amine structure as an oxygen quencher in its molecule. Additionally, if a large amount of the colorant and the dispersing agent is compounded, the cross-link density and the alkali solubility can be improved, owing to compounding the acidic polyfunctional photocurable compound (c). Therefore, the composition of the present aspect is superior in the curability and the alkali developing property, and having a high sensitivity during the light exposure and a high developing speed during the development. Furthermore, it is possible to form a fine color pattern with a high accuracy, a high color concentration and a forward tapered shape. Additionally, there is little residue on the exposed part.

The curable resin composition may further comprise a photocurable compound (d) having at least two photocurable functional groups, in addition to the compound (c). The acidic polyfunctional photocurable compound (c) has an acidic functional group and thereby increases both the cross-link density and the alkali solubility. On the contrary, the photocurable compound (e) increases the cross-link density only. Therefore, a combination of these compounds makes it possible to control the cross-link density and the alkali solubility.

Preferably, the curable resin composition contains the photocurable compound (c) of 3 to 30% by weight, on the basis of solid content, in order to improve sufficiently the cross-link density and the alkali solubility.

Preferably, the curable resin composition contains the photopolymerization initiator (b) at least 5% by weight, on the basis of solid content, in order to improve sufficiently the sensitivity.

Preferably, the copolymer (a) has a molecular weight of 3,000 to 1,000,000.

The curable resin composition for forming the colorant pattern according to the present aspect is suitable for a use in fabricating a liquid crystal panel substrate, especially, suitable for forming a color layer such as pixel or black matrix of a color filter. That is, using the curable resin composition for color pattern of the present invention makes it possible to form a high concentration fine color pattern with a suitable edge shape and a suitable tapered shape, and with a high productivity owing to the high sensitivity.

The color filter provided by the present aspect is a color filter comprising: a transparent substrate; and a pixel disposed on the transparent substrate, and optionally comprising a black matrix layer, wherein the pixel and/or the black matrix layer are formed by curing the curable resin composition for color pattern according to the present invention, and providing a high image quality and a high resolution.

The liquid crystal panel of the present aspect is a liquid crystal panel comprising: a display side substrate; a liquid crystal driving side substrate opposite to the display side substrate; and a liquid crystal filled and sealed between these two substrates, and providing a superior image quality.

According to the fourth aspect, the eighth object among the above-listed objects can be mainly achieved.

Figure 1:
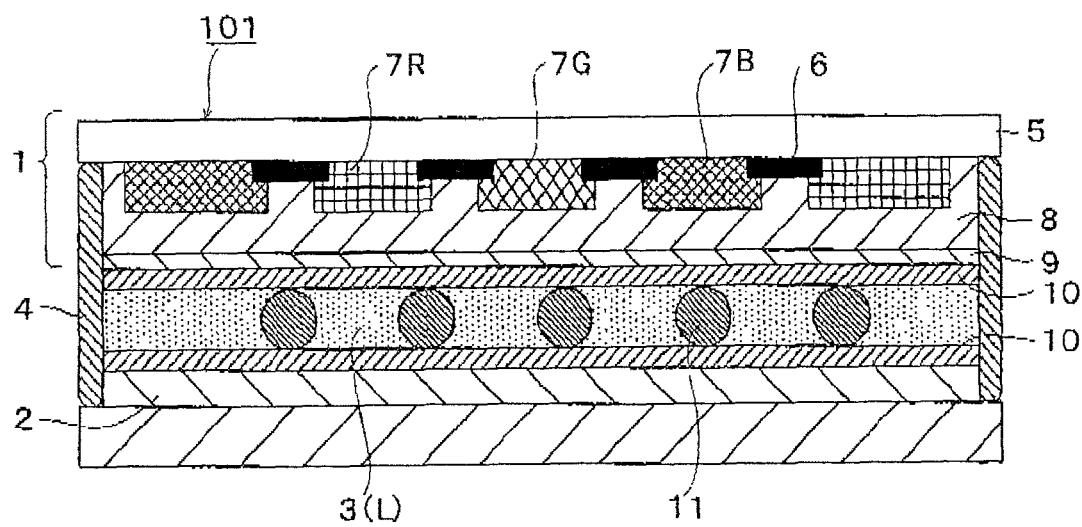
FIG. 1 is a schematic sectional view of one example of conventional liquid crystal panels.
Figure 2:
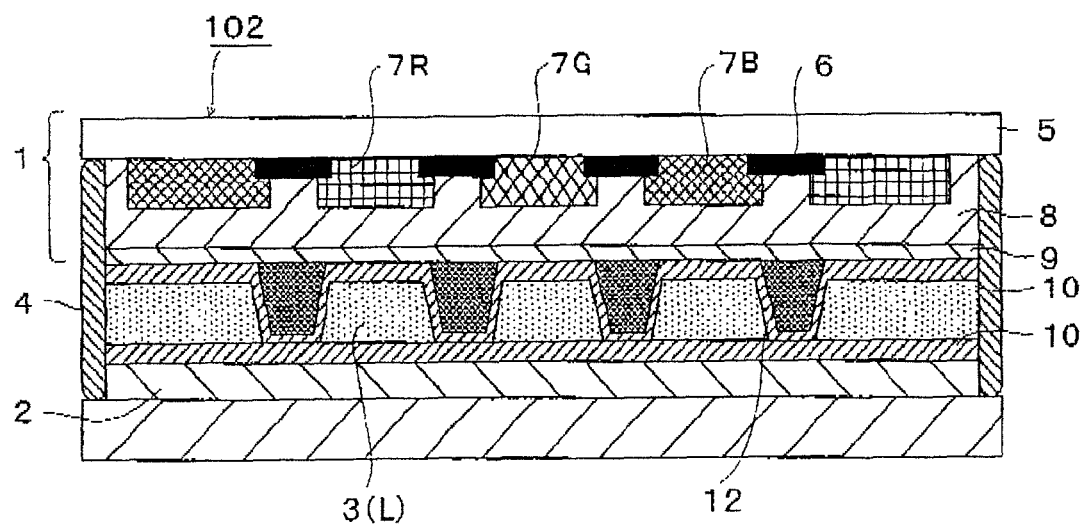
FIG. 2 is a schematic sectional view of another example of conventional liquid crystal panels.

In these drawings, each reference number is used in the following meanings, respectively: color filter (1); color filter (103); TFT array substrate (liquid crystal driving side substrate) (2); gap part (3); sealant (4); transparent substrate (5); black matrix layer (6); color layer (7 (7R, 7G, 7B)); protective film (8); transparent electrode film (9); alignment film (10); particle-shaped spacer (11); and column-shaped spacer (12).

BEST MODE FOR CARRYING OUT THE INVENTION

The present invention will be described in detail hereinafter. In the present invention, (meth)acryl means either of an acryl group or a methacryl group, and (meth)acrylate means either of acrylate or methacrylate. (Meth)acryloyl means either of an acryloyl group or a methacryloyl group.

The solid content ratio of each component in the curable resin composition is a value relative to a total solid content. The total solid content means a total amount of all nonvolatile components other than volatile solvents and thereby includes a liquid monomer component.

<First Aspect>

The curable resin composition provided by the first aspect of the present invention comprises: a copolymer (a) having a molecular structure in which a constitutional unit including an acidic functional group and a constitutional unit including a photocurable functional group are linked at least; a photopolymerization initiator (b) having a tertiary amine structure; and a photocurable compound (c) having at least one acidic functional group and at least three photocurable functional groups.

Since the copolymer (a) has a molecular structure in which the constitutional unit including the acidic functional group and the constitutional unit including the photocurable functional group are linked at least, it has both functions for improving the alkali solubility and improving the cross-link density. However, the acidic functional group and the photocurable functional group which can be incorporated into the molecule of the copolymer (a) are limited in their amounts. Furthermore, there is a problem of increasing the viscosity of the composition, if the amount of the copolymer (a) is excessively increased in the composition.

In the present invention, the amount of the acidic functional group and the photocurable functional group in the composition can be remarkably increased, owing to an addition of the acidic polyfunctional photocurable compound (c) to the copolymer (a). Thereby, the alkali solubility and the cross-link density can be remarkably improved.

Furthermore, in the present invention, even in the case that the amount of the photopolymerization initiator (b) having the tertiary amine structure is increased in order to improve the sensitivity of the composition, the curable resin composition having an excellent sensitivity, an excellent photocurable property, an excellent alkali developing property can be obtained. This is because a large amount of the acidic functional group and the photocurable functional group exist in the composition owing to the addition of the acidic polyfunctional photocurable compound (c), so that a harmful influence of the tertiary amine structure to the alkali developing property is weakened in the whole composition, since the composition contains a large amount of the acidic functional group.

Therefore, the curable resin composition of the present invention has the high exposure sensitivity and the good developing property, and can form an accurate and fine pattern, and still can reduce the residue and shorten the time required for the patterning, and can improve the production rate of the color filter product line.

(Copolymer (a))

In the present invention, the copolymer (a) having a molecular structure in which the constitutional unit including the acidic functional group and the constitutional unit including the photocurable functional group is linked is used as a binder component.

The constitutional unit including the acidic functional group (the acidic functional group-containing unit) is an component contributing to the alkali solubility, and the content ratio thereof is controlled by the extent of the alkali solubility required for the curable resin. The monomer to be used in order to incorporate the constitutional unit including the acidic functional group into a main chain of the copolymer (a) may be a compound having the ethylenically unsaturated bond and the acidic functional group. The acidic functional group is not limited to any special one insofar as it can be alkali-developed, but may be carboxyl group, sulfonic acid group, phosphoric acid group and the like. The carboxylic group is preferable, from the viewpoint of the alkali developing property and the easiness in handling of the resin composition.

As the constitutional unit having the acidic functional group, a constitutional unit represented by the following formula (3) is preferable.

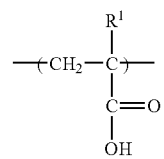

Formula (3)

In the above formula, R1 is hydrogen or an alkyl group having 1 to 5 carbon atoms.

R1, which is included in the formula (3) or other formulae described later, is hydrogen, or an alkyl group having 1 to 5 carbon atoms. The alkyl group may be methyl group, ethyl group, n-propyl group, isopropyl group, n-butyl group, isobutyl group, sec-butyl group, tert-butyl group, n-pentyl group and so on. The monomer to be used in order to incorporate the constitutional unit represented by the formula (3) may be acrylic acid, methacrylic acid, 2-carboxy-1-butene, 2-carboxy-1-pentene, 2-carboxy-1-hexene, 2-carboxy-1-heptene and so on.

The constitutional unit including the photocurable functional group (the photocurable functional group-containing unit) is a component contributing to the photocurable property of the resin, and the content ratio thereof is controlled by the extent of the required photocurable property.

As the photocurable functional group, there may be used a functional group to start or promote a photocurable reaction by the photopolymerization initiator (b) having the tertiary amine structure. Specifically, a functional group curable by a photoradical reaction such as photoradical polymerization or photoradical dimerization is preferable, especially a photoradical polymerizing functional group such as (meth)acrylic group having an ethylenically unsaturated bond is more preferable.

The synthesis of the copolymer (a) from a monomer having a photocurable functional group tends to cause a side reaction. Therefore, it is preferable that the photocurable functional group is incorporated via an appropriate functional group, after a linkage of a main chain of the copolymer (a) is formed.

As the constitutional unit including the ethylenically unsaturated bond as the photocurable functional group (ethylenically unsaturated bond-containing unit), a unit represented by the following formula (1) is preferable.

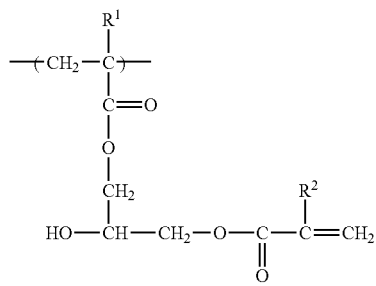

Formula (1)

In the above formula, R1 is hydrogen or an alkyl having 1 to 5 carbon atoms, R2 is a hydrogen atom or methyl group.

In order to incorporate the constitutional unit represented by the formula (1) into the copolymer (a), firstly, the main chain portion of the copolymer (a) is formed by polymerizing at least (meth)acrylic acid as a monomer, and then a carboxyl group from the (meth)acrylic acid is reacted with glycidyl (meth)acrylate. In this case, however, the amount of glycidyl (meth)acrylate is required to be adjusted as appropriate, since an excessive low content of the carboxyl group from the (meth)acrylic acid causes a lack of the alkali solubility.

Furthermore, as the ethylenically unsaturated bond-containing unit, a constitutional unit represented by the following formula (2) is one of the preferable units.

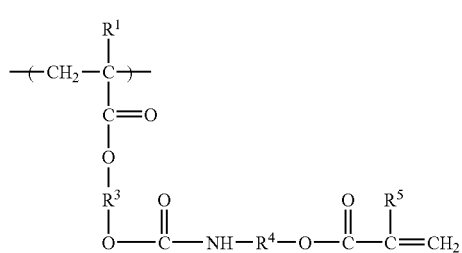

Formula (2)

In the above formula, R1 is the same as defined above, R3 is an alkylene group having 2 to 4 carbon atoms, R4 is an alkylene group, R5 is a hydrogen atom or methyl group.

R3 (alkylene group having 2 to 4 carbon atoms) included in the formula (2) may be ethylene group, propylene group, butylenes group and so on, R4 (alkylene group) included in the formula (2) is preferably an alkylene group having 2 to 6 carbon atoms.

In order to incorporate the constitutional unit represented by the formula (2) into the copolymer (a), firstly, a main chain portion of the copolymer is formed by copolymerizing hydroxy alkyl(meth)acrylate represented by the following formula (4) with other monomers.

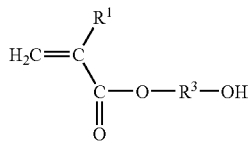

Formula (4)

In the above formula, R1 and R3 are the same as defined for the formula (2).

Hydroxy alkyl(meth)acrylate represented by the formula (4) may be 2-hydroxy ethyl acrylate, 2-hydroxy ethyl methacrylate, 3-hydroxy propyl acrylate, 3-hydroxy propyl methacrylate, 4-hydroxy butyl acrylate, 4-hydroxy butyl methacrylate and so on.

Then, a hydroxy group from the hydroxy alkyl(meth)acrylate is reacted with an isocyanate compound represented by the following formula (5).

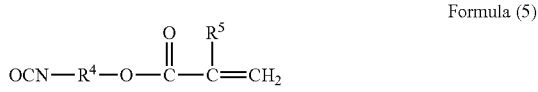

Formula (5)

In the above formula, R4 and R5 are the same as defined for the formula (2).

Among the (meth)acryloyl oxyalkyl isocyanate represented by the formula (5), it is preferable to use one in which (meth)acryloyl group is linked with isocyanate group (—NCO) via an alkylene group having 2 to 6 carbon atoms. Specifically, it may be 2-acryloyl oxy ethyl isocyanate, 2-methacryloyl oxy ethyl isocyanate and so on. For example, 2-methacryloyl oxy ethyl isocyanate is offered commercially under the name of "KarenzMOI" from SHOWA DENKO.

When the polymer, which is obtained by reacting the isocyanate compound with the copolymer (a) having the main chain comprising the constitutional unit at least including the acidic functional group and the constitutional unit as shown by the formula (4) including a hydroxy group, is dissolved or dispersed into a solvent, the molecular weight and the viscosity are often increased. Therefore, in the case that the photocurable functional group is incorporated into the copolymer (a) by reacting the isocyanate compound therewith, it is preferable, from the viewpoint of preventing the molecular weight or the viscosity from increasing, that the copolymer (a) is treated with alcohol after the reaction, so that an ester link is established between alcohol and at least a part of the acidic functional group of the copolymer (a).

The treatment of the copolymer (a) with alcohol may be achieved by adding alcohol into a solution, obtained by dissolving or dispersing the copolymer (a) into a solvent, before the viscosity of the solution starts to increase or before the increase of the viscosity completes. Alternatively, it is possible that each monomer for the copolymer (a) is polymerized in a synthesized solvent such as MBA (3-metoxybutyl acetate, $CH_3CH(OCH_3)CH_2CH_2OCOCH_3$)), and then the photocurable group-containing isocyanate compound is dropped into the obtained copolymer solution so as to cause a reaction, and then alcohol is added to the reacting solution. The reaction condition during the addition is not limited to any special condition. Alcohol may be added while the reacting solution is hot, or may be added at a room temperature, or may be thrown into the reacting solution at one time.

The kind of alcohol to be used for preventing the increase of the viscosity is not limited to any special kind, insofar as the compound has the alcoholic hydroxy group, but may include N, O, S, P and so on. Usually, relatively low molecular alcohols are easy to handle. For example, it may be an alcohol having 1 to 20 carbon atoms with or without N, O, S, P and so on, more specifically, alcohol solvent such as methanol, ethanol, propanol, butanol, pentanol, hexanol, heptanol, octanol and decanol; cellosolve solvent such as methoxy alcohol and ethoxy alcohol; carbitol solvent such as methoxyethoxy ethanol and ethoxyethoxy alcohol; ether solvent such as ethylene glycol monomethyl ether, diethylene glycol monomethyl ether, ethylene glycol monopropyl ether and propylene glycol monomethyl ether; unsaturated bond-containing solvent such as 2-hydroxy ethyl(meth)acrylate, 2-hydroxy propyl(meth)acrylate, 2-hydroxy butyl(meth)acrylate, 4-penten-1-ol, tetramethylol methane tri(meth)acrylate, tetratrimethylolpropane tri(meth)acrylate, and dipentaerythritol hexacrylate.

Alternatively, it is possible that alcohol is added to the copolymer (a) solution, and then the solution is mixed into a coating solvent with other materials to obtain a coating liquid, so that alcohol is evaporated with the coating solvent in a dry process after the coating liquid is coated. Like as this example, in the case that the residual alcohol is evaporated with other solvents, it is preferable that the difference between a boiling point of alcohol and a boiling point of the solvent to be mixed with the alcohol, or the difference between an evaporation rate of alcohol and an evaporation rate of the solvent to be mixed with the alcohol is as small as possible, ideally there is no difference. Additionally, it is preferable that both the boiling point difference between the alcohol and the solvent, and the evaporation rate difference between the alcohol and the solvent are small. From such a viewpoint, the boiling point difference between the alcohol and the solvent to be mixed therewith is preferably 75° C. or less, more preferably 40° C. or less. Furthermore, the evaporation rate difference between the alcohol and the solvent for the coating liquid is preferably 90 [n-BuOAc=100], more preferably 30 [n-BuOAc=100]. It is preferable that both the boiling point and the evaporation rate of the alcohol satisfy the above-mentioned conditions. In this regard, the evaporation rate (unit; [n-BuOAc=100]) is represented by a specific evaporation rate relative to an evaporation rate of n-butyl acetate (n-BuOAc) at 25° C. based on a gravimetric method, which is assumed as 100.

The amount of alcohol to be used for preventing the increase of the viscosity is adjusted as appropriate, depending on the amount of acid anhydride group contained in the copolymer (a). Preferably, the amount is in a range of about 10 to 120% by weight of the copolymer (a).

In order to completely stop, in effect, the increase of the viscosity of the copolymer (a) solution, it is necessary that the reacting solution is left for a predetermined time after alcohol is added, so as to reduce sufficiently the amount of the acid anhydride group and thereby subject the alcohol-treated copolymer (a) to aging. The reacting solution may be left at a room temperature, or may be heated so as to complete the aging for a shorter time. It is preferable that the alcohol-added reacting solution is left for the aging, at a temperature of 30 to 170° C. for a time period of 72 hours or less. In this regard, for example, if the aging time at 90° C. is shorter than 4 hours, it is not possible to stabilize the resin completely, so that the effect of preventing the increase of the viscosity is diluted.

The above-mentioned copolymer (a) may further include a constitutional unit including an alcoholic hydroxy group (an alcoholic hydroxy group-containing unit). The alcoholic hydroxy group is an component for controlling the developing property of the curable resin.

As the monomer to be used for incorporating the constitutional unit having the alcoholic hydroxy group into the main chain of the polymer, a compound having an ethylenically unsaturated bond and an alcoholic hydroxy group may be used.

As the alcoholic hydroxy group-containing unit, a constitutional unit represented by the following formula (6) is preferable.

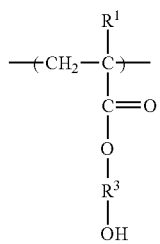

Formula (6)

In the above formula, R1 and R3 are the same as defined above.

As the monomer to be used for incorporating the constitutional unit represented by the formula (6), the hydroxy alkyl (meth)acrylate represented by the formula (4) may be used. As described above, the hydroxy alkyl(meth)acrylate represented by the following formula (4) may be used also for incorporating the ethylenically unsaturated bond by reacting with the ethylenically unsaturated bond-containing isocyanate compound such as (meth)acryloyl oxy alkyl isocyanate represented by the formula (5).

The above-mentioned copolymer may further a constitutional unit including an aromatic carbon ring (an aromatic carbon ring-containing unit). The aromatic carbon ring-containing unit is an component for providing a coating property to the curable resin composition. As the aromatic carbon ring-containing unit, a unit represented by the following formula (7) is preferable.

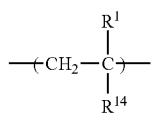

Formula (7)

In the above formula, R1 is the same as defined above, R14 is an aromatic carbon ring.

R14 (aromatic carbon ring) included in the formula (7) may be phenyl group, naphthyl group and so on. A monomer to be used for incorporating the constitutional unit represented by the formula (7) may be styrene or α-methylstyrene. The aromatic ring thereof may be substituted by a halogen atom such as chlorine or bromine; an alkyl group such as methyl group or ethyl group; an amino group such as amino group or dialkylamino group; cyano group; carboxyl group; sulfonic acid group; phosphoric acid group and so on.

The above-mentioned copolymer may further include a constitutional unit including an ester group (an ester group-containing unit). The ester group-containing unit is an component for inhibiting the alkali solubility of the curable resin. As the ester group-containing unit, a unit represented by the following formula (8) is preferable.

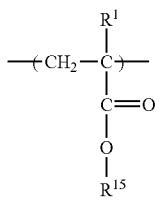

Formula (8)

In the above formula, R1 is the same as defined above, R15 is an alkyl group or an aralkyl group.

R15 (alkyl group or aralkyl group) included in the formula (8) may be an alkyl group having 1 to 12 carbon atoms; an aralkyl group such as benzyl group or phenylethyl group. The monomer to be used for incorporating the constitutional unit represented by the formula (8) may be (meth)acrylic esters such as methyl(meth)acrylate, ethyl(meth)acrylate, butyl (meth)acrylate, 2-ethylhexyl(meth)acrylate, phenyl(meth) acrylate, cyclohexyl(meth)acrylate, dicyclopentanyl(meth) acrylate, dicyclopentanyl oxy ethyl(meth)acrylate, isobonyl (meth)acrylate, and benzyl(meth)acrylate, phenylethyl (meth)acrylate.

As the monomer to be used for incorporating each constitutional unit into the main chain of the copolymer (a), the above listed monomers may be used solely for each constitutional unit, or two or more monomers among them may be used as a mixture.

In the present invention, a content ratio of each constitutional unit constituting the molecular structure of the copolymer (a) is adjusted as appropriate. A usual content ratio of each constitutional unit can be represented as a feed amount ratio relative to a whole amount, which is a total use amount (a total feed amount) of: monomers for forming the main chain; and photocurable functional group-containing compounds such as isocyanate compound. It can be represented as follows.

Firstly, if the content of the acidic functional group-containing unit is too low, the alkali solubility becomes insufficient, or if too high, the solvent solubility decreases. Thereby, the content ratio thereof is adjusted to satisfy the required alkali solubility and the required solvent solubility, for example, adjusted to usually 5 mol % to 55 mol %, preferably 10 mol % to 30 mol %, on the basis of the feed amount.

Also, there is a problem that if the content ratio of the photocurable functional group-containing unit is too low, the curability becomes insufficient, or if the content ratio of the constitutional unit having an ethylenically unsaturated bond as the photocurable functional group is too high, the adhesiveness to the substrate decreases. Thereby, the content ratio of the photocurable functional group-containing unit is adjusted to satisfy the required photocurable extent (sensitivity), for example, adjusted to usually 5 mol % to 95 mol %, preferably 14 mol % to 50 mol %, on the basis of the feed amount.

The content ratio of the aromatic carbon ring-containing unit is adjusted to usually 0 mol % to 75 mol %, preferably 5 mol % to 50 mol %, on the basis of the feed amount, in order to control the coating property.

The content ratio of the ester group-containing unit is adjusted to usually 0 mol % to 75 mol %, preferably 5 mol % to 50 mol %, on the basis of the feed amount, in order to inhibit, if needed, the alkali developing property.

The amount of the acidic functional group and the photocurable functional group to be incorporated into the copolymer (a) is limited due to a limitation of a range of the copolymer content. Nevertheless, in the present invention, the amount of the acidic functional group and the photocurable functional group in the curable composition can be remarkably increased, by adding the acidic polyfunctional photocurable compound (c).

The above-mentioned copolymer (a) can be synthesized in accordance with a known method. For example, in accordance with procedures and conditions described in the above-mentioned Japanese Patent Application Laid-Open No. 2000-105456, a polymer (feed polymer) is firstly produced having a main chain comprising: the constitutional unit as shown by the formula (3) including the acidic functional group; and the constitutional unit including a functional group allowing an incorporating a pendant structure having the photocurable functional group in the later process, and further comprising: if needed, the constitutional unit as shown by the formula (6) including the alcoholic hydroxy group; the constitutional unit as shown by the formula (7) including the aromatic carbon ring; the constitutional unit as shown by the formula (8) including the ester group; or other constitutional units. Secondly, the feed polymer is reacted with a compound having a photocurable functional group such as un ethylenically unsaturated bond and any other functional unit to incorporate a pendant structure of the photocurable functional group therein.

The copolymer (a) may be a random copolymer, or may be a block copolymer.

The copolymer (a) has a polystyrene-based weight-average molecular weight (hereinafter merely called "weight-average molecular weight" or "Mw") determined by GPC (Gel Permeation Chromatography), preferable adjusted to 3,000 to 1,000,000, preferably 5,000 to 1,000,000, more preferably 5,000 to 100, 000. If the weight-average molecular weight is less than 3,000, the alkali solubility becomes too high which causes the difficulty in controlling the patterning shape during pattern-exposure. Even in the case that the patterning is possible, the final film thickness may be reduced (makuheri). On the other hand, if the weight-average molecular weight is more than 1,000,000, the viscosity of the resist thereof becomes too high, which may deteriorate the coating property or may deteriorate the developing property, resulting in an insufficient patterning.

The acid value of the copolymer (a) is 5 mgKOH/g to 400 mgKOH/g, preferably 10 mgKOH/g to 200 mgKOH/g. The acid value relates to the alkali solubility: if the acid value is too low, the developing property deteriorates, or the adhesiveness to the substrate and the color filter resin deteriorates. On the other hand, if the acid value is too high, the alkali solubility becomes excessively high which cause the difficulty in controlling the patterning shape during the pattern exposure.

It is preferable that the curable resin compound of the present invention contains the copolymer (a) of usually 3 to 60% by weight, preferably 5 to 40% by weight, on the basis of solid content (i.e. a ratio relative to total solid components).

If the content of the copolymer (a) is more than 60% by weight, the viscosity of the coating liquid becomes excessively high which deteriorates the coating ability and may cause the gap unevenness when assembling the cell, particularly in the case of forming spacers. On the other hand, if the content of the copolymer (a) is less than 3% by weight, the viscosity of the coating liquid becomes too low which may cause the insufficient stability of the coating film after coating and dry, and thereby deteriorate the exposure suitability or the developing suitability.

(Other Binder Resins)

In the present invention, binder resins other than the copolymer (a) may be additionally used within a range to achieve the object of the invention. Other binder resins may be a resin having no polymerization reactivity per se, or may be a resin having polymerization reactivity per se, otherwise may be a blend of two or more binder resins.

In the case that the resin having no polymerization reactivity per se is used as the binder resin, the acidic polyfunctional photocurable compound (c) and other polymerizing monomers, which are optional components, (herein the polymerizing monomers refer to monomers and/or oligomers having the polymerization reactivity) are polymerized spontaneously, or polymerized with the aid of effects of other components such as photopolymerization initiator activated by light irradiation, and then cured.

Such a non-polymerizing binder may be a copolymer comprising at least two kinds of monomer selected from acrylic acid, methacrylic acid, methyl acrylate, methyl methacrylate, 2-hydroxy ethyl acrylate, 2-hydroxy ethyl methacrylate, benzyl acrylate, benzyl methacrylate, styrene, polystyrene macromonomer, and poly methyl methacrylate macromonomer.

Among these non-polymerizing binders, a copolymer of methacrylic acid and benzyl methacrylate, a copolymer of methacrylic acid, benzyl methacrylate and styrene, a copolymer of benzyl methacrylate and styrene, a copolymer of benzyl methacrylate macromonomer and styrene, a copolymer of benzyl methacrylate and styrene macromonomer and so on are particularly preferable.

On the other hand, the binder resin having the polymerization reactivity per se may be an oligomer or a polymer having a larger molecular weight than that of the oligomer, obtained by incorporating a polymerizing functional group such as an ethylenically unsaturated bond into the non-polymerizing binder resin molecule. Specifically, it may be a copolymer obtained by adding glycidyl methacrylate into a part of carboxyl group of a copolymer having a molecular structure in which a constitutional unit including an acidic functional group such as carboxyl group and a constitutional unit having no polymerization reactivity are linked.

The molecular of the polymerizing binder resin polymerizes with each other, and polymerizes also with the acidic group-containing monomer represented by the formula (1) and other polymerizing monomers as optionally components, and then cured.

Furthermore, a pre-polymer compounded in a UV curable resin composition conventionally used in various fields, such as ink, coating material, and adhesive, may be used as the polymerizing binder resin. The conventionally known pre-polymer may be a radical polymerization type pre-polymer, a cationic polymerization type pre-polymer, a thiol-ene addition type pre-polymer and so on, but any conventional pre-polymer may be used.

Among them, the radical polymerization type pre-polymer is available most readily from a market, and various kinds of the radical polymerization type pre-polymer can be used such as ester acrylates, ether acrylates, urethane acrylates, epoxy acrylates, amino resin acrylates, acrylic resin acrylates, unsaturated polyesters and so on.

(Photopolymerization Initiator (b))

The curable resin composition of the present invention contains a photopolymerization initiator (b) having a tertiary amine structure, as an essential component. Since the photopolymerization initiator (b) has a tertiary amine structure as an oxygen quencher in the molecule, radicals generated from the initiator are not easily deactivated by oxygen. Therefore, it is a suitable polymerization initiator to improve the sensitivity of the curable resin composition.

The photopolymerization initiator (b) having the tertiary amine structure may be: for example, 2-benzyl-2-dimethylamino-1-(4-morpholinophenyl)-butanone-1,2-methyl-1-[4-(methylthio)phenyl]-2-morpholino-propanone-1,4,4'-bis(dimethylamino)benzophenone; 4,4'-bis(diethylamino)benzophenone 4-methyl-4'-diethylaminobenzophenone; 4-methoxy-4'-diethyl amino benzophenone; 4,4'-bis(dipropylamino)benzophenone; 4,4'-bis(diisopropylamino)benzophenone; 2,2'-bis(o-chlorophenyl)-4,5,4',5'-tetraphenyl-1,2'-bisimidazole; 2,2'-bis(2-chlorophenyl)-4,4',5,5'-tetrakis(4-ethoxycarbonylphenyl)biimidazole; 2,2'-bis(2-chlorophenyl)-4,4',5,5'-tetrakis(4-phenoxycarbonylphenyl)biimidazole; 2,2'-bis(2,4-dichlorophenyl)-4,4',5,5'-tetrakis(4-ethoxycarbonylphenyl)biimidazole; 2,2'-bis(2,4-dichlorophenyl)-4,4',5,5'-tetrakis(4-phenoxycarbonylphenyl)biimidazole; 2,2'-bis(2,4,6-trichlorophenyl)-4,4',5,5'-tetrakis(4-ethoxycarbonylphenyl)biimidazole; 2,2'-bis(2,4,6-trichlorophenyl-4,4',5,5'-tetrakis(4-phenoxycarbonylphenyl)biimidazole; 2,2'-bis(2-cyanophenyl)-4,4',5,5'-tetrakis(4-ethoxycxarbonylphenyl)biimidazole; 2,2'-bis(2-cyanophenyl)-4,4',5,5'-tetrakis(4-phenoxycarbonylphenyl)biimidazole; 2,2'-bis(2-methylphenyl)-4,4',5,5'-tetrakis(4-methoxycarbonylphenyl)biimidazole; 2,2'-bis(2-methylphenyl)-4,4',5,5'-tetrakis(4-ethoxycarbonylphenyl)biimidazole; 2,2'-bis(2-methylphenyl)-4,4'5,5'-tetrakis(4-phenoxycarbonylphenyl)biimidazole; 2,2'-bis(2-ethylphenyl)-4,4',5,5'-tetrakis(4-methoxycarbonylphenyl)biimidazole; 2,2'-bis(2-ethylphenyl)-4,4'5,5'-tetrakis((4-ethoxycarbonylphenyl)biimidazole; 2,2'-bis(2-ethylphenyl)-4,4',5,5'-tetrakis(4-phenoxycarbonylphenyl)biimidazole; 2,2'-bis(2-phenylphenyl)-4,4',5,5'-tetrakis(4-methoxycarbonylphenyl)biimidazole; 2,2'-bis(2-phenylphenyl)-4,4',5,5'-tetrakis(4-ethoxycarbonylphenyl)biimidazole; 2,2'-bis(2-phenylphenyl)-4,4',5,5'-tetrakis(4-phenoxycarbonylphenyl)biimidazole; 2,2'-bis(2-chlorophenyl)-4,4',5,5'-tetraphenylbiimidazole; 2,2'-bis(2,4-dichlorophenyl)-4,4,'5,5'-tetraphenylbiimidazole; 2,2'-bis(2,4,6-trichlorophenyl)-4,4',5,5'-tetraphenylbiimidazole; 2,2'-bis(2-boromophenyl)-4,4'5,5'tetraphenylbiimidazole; 2,2'-bis(2,4-dibromophenyl)-4,4',5,5'-tetraphenylbiimidazole; 2,2'-bis(2,4,6-triboromophenyl)-4,4',5,5'-tetraphenylbiimidazole; 2,2'-bis(2-cyanophenyl)-4,4',5,5'-tetraphenylbiimidazole; 2,2'-bis(2,4-dicyanophenyl)-4,4',5,5'-tetraphenylbiimidazole; 2,2'-bis(2,4,6-tricyanophenyl)-4,4',5,5'-tetraphenylbiimidazole; 2,2'-bis(2-methylphenyl)-4,4',5,5'-tetraphenylbiimidazole; 2,2'-bis(2,4-dimethylphenyl)-4,4',5,5'-tetraphenylimidazole; 2,2'-bis(2,4,6-trimethylphenyl)-4,4',5,5'-tetraphenylbiimidazole; 2,2'-bis(2-ethylphenyl)-4,4',5,5'-tetraphenylbiimidazole; 2,2'-bis(2,4-diethylphenyl)-4,4'5,5'-tetraphenylbiimidazole; 2,2'-bis(2,4,6-triethylphenyl)-4,4',5,5'-tetraphenylbiimidazole; 2,2'-bis(2,4-diphenylphenyl)-4,4',5,5'-tetraphenylbiimidazole; 2,2'-bis(2,4,6-triphenylphenyl)-4,4',5,5'-tetraphenylbiimidazole; 4-diazophenylamine; 4-diazo-4'-methoxydiphenylamine; 4-diazo-3-methoxydiphenylamine and so on. From the viewpoint of the solvent solubility and the plate making property, it is preferable to use 2-benzyl-2-dimethylamino-1-(4-morpholinophenyl)-butanone-1,2-methyl-1-[4-(methylthio)phenyl]-2-morpholino-propanone-1,4,4'-bis(dimethylamino)benzophenone; 4,4'-bis(diethylamino)benzophenone; 4-methyl-4'-diethylaminobenzophenone; and 4-methoxy-4'-diethylaminobenzophenone.

As commercial products, there are IRGACURE 907, IRGACURE 369 (available from Ciba Specialty Chemicals), HighCure ABP (available from KAWAGUCHI CHEMICAL CO., LTD,), biimidazole (available from KUROGANE KASEI Co., Ltd.), for example.

The polymerization initiator (b) may be used solely or as a blend of two or more kinds. In the case of using the blend of two or more kinds, it is preferable to prevent the absorption spectroscopic property from being inhibited.

The polymerization initiator (b) is compounded in the curable resin composition, usually in a range from 5 to 25% by weight, on the basis of solid content. In order to obtain the sufficient sensitivity, however, it is preferably compounded at 10% by weight or more, more preferably at 13% by weight or more, particularly at 20% by weight or more. In the present invention, since the below-mentioned acidic polyfunctional photocurable compound (c) is contained, it is possible that the content of the polymerization initiator (b) is increased over 10% by weight so as to improve the sensitivity, so that the excellent curability and the excellent alkali developing property are obtained, without deteriorating the cross-link density and the alkali solubility of the curable resin compound.

Meanwhile, for preparing the curable resin composition, the photopolymerization initiator (b) may be added into the polymer (a) from the first. In the case that it is stored for a relatively long time, the photopolymerization initiator (b) is preferably dispersed or dissolved in the curable resin composition immediately before its use.

(Photopolymerization Initiator other than Compound (b))

The curable resin composition of the present invention may contain a photopolymerization initiator other than the photopolymerization initiator (b) having the tertiary amine structure.

The photopolymerization initiator other than the photopolymerization initiator (b) may be a compound which generates free radicals by energy of UV rays: including a benzophenone derivative such as benzoin and benzophenone, or a derivative such as ester thereof; xanthone and thioxanthone derivatives; a halogen-containing compound such as chlorosulfonyl, chloromethyl polynuclear aromatic compound, chloromethyl heterocyclic compound, chloromethylbenzophenones; triazines; fluorenones; haloalkanes; redox couples of photoreductive colorants and reductants; an organic sulfur compound; peroxides. Preferably; it may be ketons, biimidazole compounds and the like, such as IRGACURE 184, IRGACURE 651, DAROCURE 1173 (all available from Ciba Specialty Chemicals), and ADEKA 1717 (available from ASAHI DENKA CO., LTD.). These initiators may be used solely or as a blend of at least two kinds of them. In the case of using two or more kinds of them, it is preferable to prevent the absorption spectroscopic property from being inhibited.

Meanwhile, for preparing the curable resin composition, the photopolymerization initiator other than the photopolymerization initiator (b) may be also added into the polymer (a) from the first. In the case that it is stored for a relatively long time, however, the photopolymerization initiator other than the photopolymerization initiator (b) is preferably dispersed or dissolved in the curable resin composition immediately before its use.

(Acidic Polyfunctional Photocurable Compound (c))

The curable resin composition of the present invention contains a photocurable compound (c) having at least one acidic functional group and at least three photocurable functional groups (acidic polyfunctional photocurable compound (c)), as an essential component.

The acidic polyfunctional photocurable compound (c), which has at least one acidic functional group and at least three photocurable functional groups in one molecule, is a compound having a relatively small molecular size. The polystyrene based weight-average molecular weight of the compound (c) is usually less than 3,000.

If the content of the copolymer (a) having the acidic functional group and the photocurable functional group is excessively increased, in order to improve the cross-link density and the alkali solubility of the photocurable composition, the viscosity increases and thereby the coating property deteriorates. Also, if an excessively amount of photocurable monomer having no acidic functional group is added to the copolymer (a), the good developing property can be hardly obtained because the alkali solubility deteriorates although the cross-link density increases.

On the contrary, the acidic polyfunctional photocurable compound (c) includes, in its molecule, the acidic functional group contributing to the alkali solubility and at least three photocurable functional groups for improving the cross-link density of the curable resin composition, and has a relatively small molecular weight. Thereby, by compounding the acidic polyfunctional photocurable compound (c) in addition to the copolymer (a) having the acidic functional group and the photocurable functional group in the composition, the alkali solubility and the cross-link density can be improved without increasing the viscosity of the composition, so that a good coating property, a good curability and a good alkali developing property can be obtained.

In the case that the curable resin composition containing the acidic polyfunctional photocurable compound (c) is used, the flatness of the protective film improves. Especially, in the case of forming the column-shaped spacers, the accuracy of the pattern edge shapes of the column-shaped spacers improves and thereby the good edge shapes can be obtained. Furthermore, it is possible to form a good forward tapered shape in which the upper area (S2) and the lower area (S1) of each column-shaped spacer has the ratio (S2/S1) from 0.4 to 1 ($0.4 \leq (S2/S1) \leq 1$), more preferably from 0.5 to 1 ($0.5 \leq (S2/S1) \leq 1$).

The acidic functional group and the photocurable functional group of the acidic polyfunctional photocurable compound (c) may be the same as the acidic functional group and the photocurable functional group of the copolymer (a).

The acidic polyfunctional photocurable compound (c) as mentioned above may be (1) a polyfunctional photocurable compound into which a carboxyl group is incorporated by modifying a hydroxy group-containing polyfunctional photocurable compound with a dibasic acid anhydride, or (2) a polyfunctional photocurable compound into which a sulfonic acid group is incorporated by modifying an aromatic polyfunctional photocurable compound with concentrated sulfuric acid or fuming sulfuric acid.

The hydroxy group-containing polyfunctional photocurable compound may be a compound having at least one hydroxy group and at least three ethylenically unsaturated groups. Specific examples of such a compound include: pentaerythritol(meth)acrylate; ditrimethylolpropane tri(meth)acrylate; and tri-, tetra-or penta(meth)acrylate of dipentaerythritol; and so on The dibasic acid anhydride may be: succinic anhydride; tetrahydrophthalic anhydride; methyl-tetrahydrophthalic anhydiride; methyl-hexahydrophthalic anhydride; phthalic anhydride; maleic anhydride; and the like.

The polyfunctional photocurable compound (c) may be for example a monomer (c1) represented by the following general formula (9), or a monomer (c2) represented by the general formula (10), or may be a monomer (c3) represented by the general formula (11) as mentioned later. In the present aspect, the monomer represented by the general formula (9) or (10) is preferable among them. In this regard, if T or G is an oxyalkylene group in the general formula (9) or (10), a carbon atom side end is linked to R, X and W.

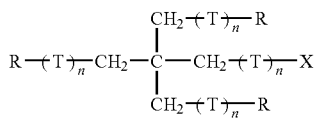

Formula (9)

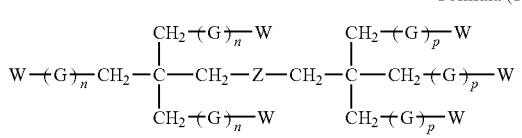

Formula (10)

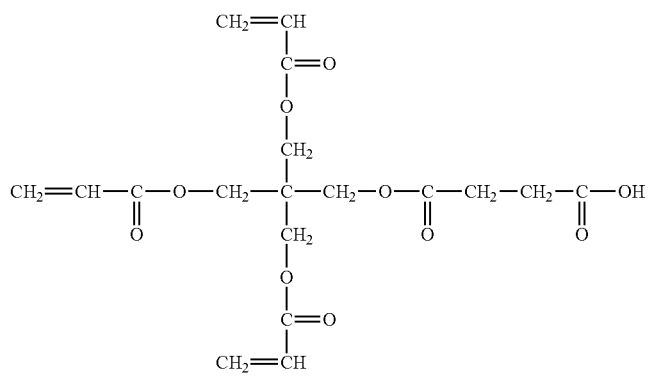

In the formula (9), n is 0-14, m is 1-8. In the formula (10), W is the same as R or X of the formula (9), and at least three of six Ws are Rs. P is 0-14, q is 1-8. R, X, T, G which exist in their multiple numbers in one molecule may be the same to each other, or may be different from each other.

Specifically, the acidic polyfunctional photocurable compound (c) represented by the formulae (9) and (10) may be a compound represented by the following formulae (12) to (17), preferably the formulae (12) and (13).

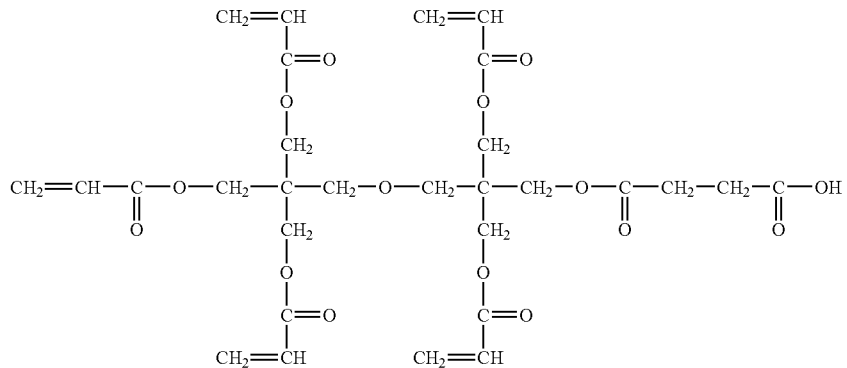

Formula 12

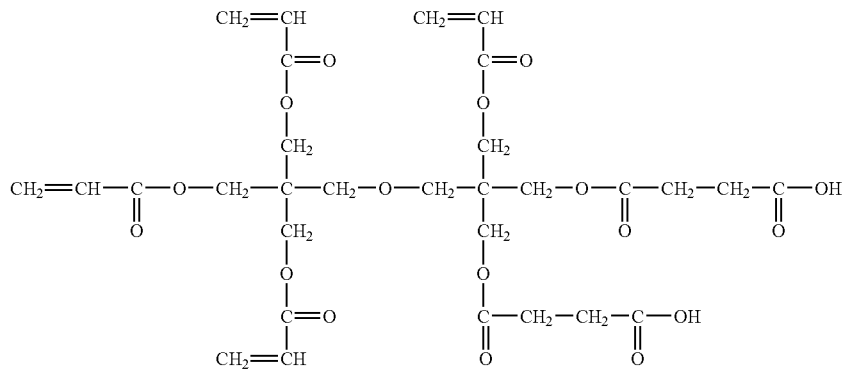

Formula 13

Formula 14

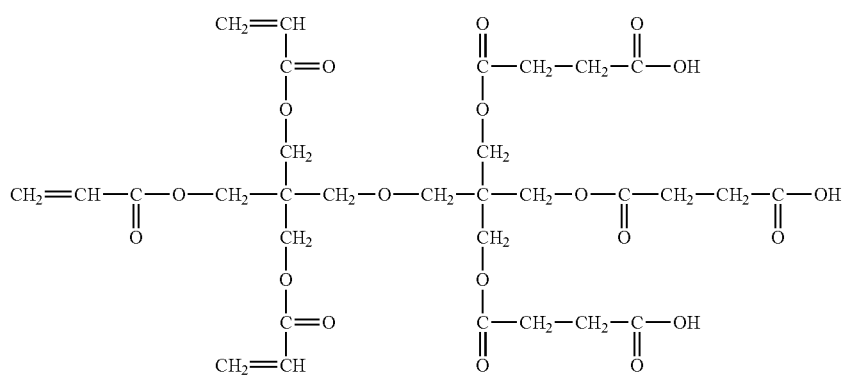

Formula 15

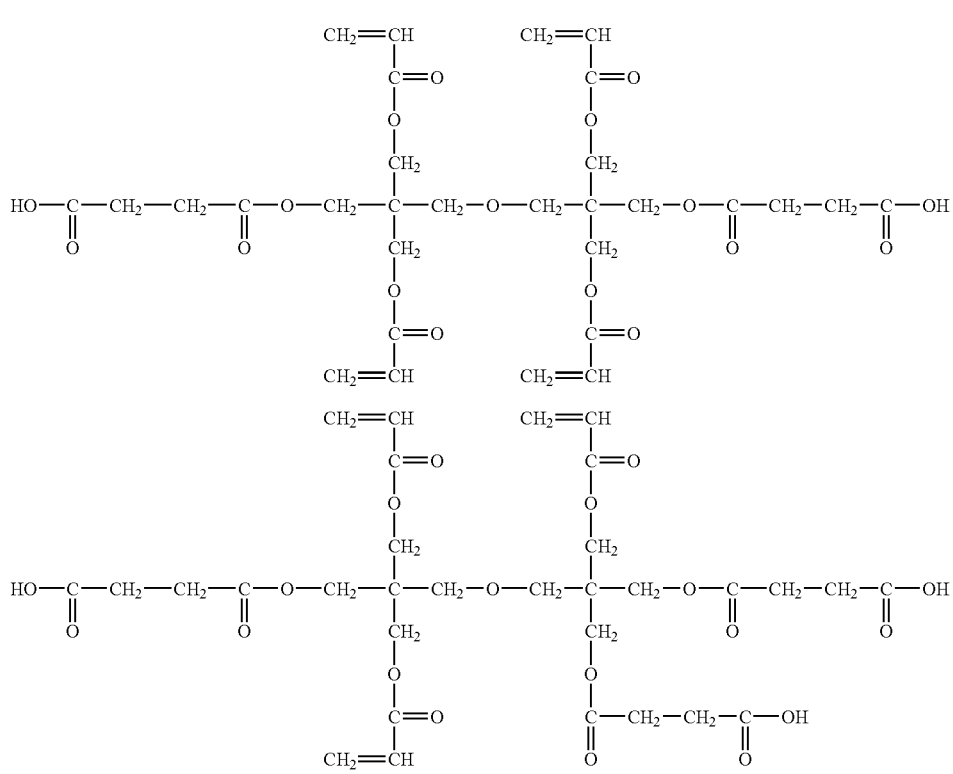

Formula 16

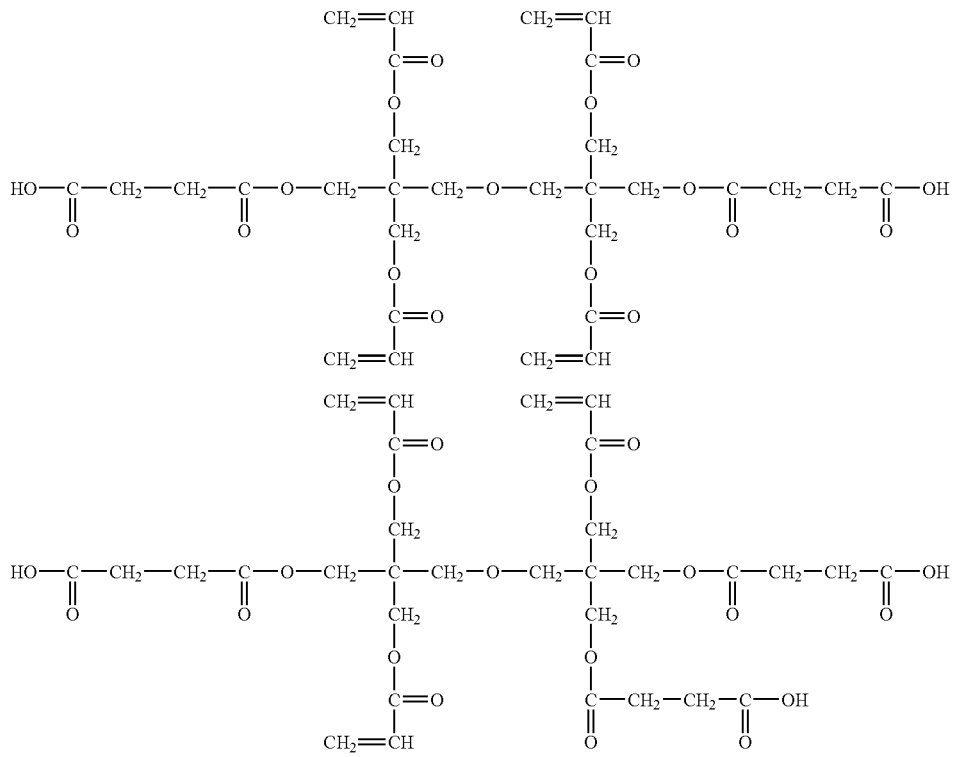

Formula 17

As commercial products of the acidic polyfunctional compound (c) represented by the formulae (9) and (10), there are, for example, TO-756, which is a carboxyl group-containing trifunctional acrylate available from TOAGOSEI CO., LTD., and TO-1382, which is a carboxyl group-containing pentafunctional acrylate available from TOAGOSEI CO., LTD.

The curable resin composition of the present invention preferable contains the acidic polyfunctional photocurable compound (c), at 3 to 30% by weight, more preferably 10 to 30% by weight, on the basis of solid content. If the content is within the above range, the cross-link density can be improved when the resin composition cures, and the alkali developing property can be improved, without sacrificing the coating property.

(Polyfunctional Photocurable Compound (d) Other than Compound (c))

The curable resin composition of the present invention may further contain a photocurable compound (d) having at least two photocurable functional groups (hereinafter referred to as "polyfunctional photocurable compound (d)").

The acidic polyfunctional photocurable compound (c) increases both the cross-link density and the alkali solubility. On the contrary, the polyfunctional photocurable compound (d) increases only the cross-link density. By combining these compounds, the cross-link density and the alkali solubility can be controlled.

In the present invention, the polyfunctional photocurable compound (d), which has at least two, preferably at least three, photocurable functional groups in one molecule, is a compound having a relatively small molecular size. The polystyrene-based weight-average molecular weight of the compound (d) is usually less than 3,000. The photocurable functional groups of the polyfunctional photocurable compound (d) may be the same as the photocurable functional groups of the copolymer (a).

The compound having at least two ethylenically unsaturated bonds as photocurable functional groups in one molecule may be polyfunctional acrylate monomers or oligomers: such as ethylene glycol(meth)acrylate; diethylene glycol di(meth)acrylate; propylene glycol di(meth)acrylate; dipropylene glycol di(meth)acrylate; polyethylene glycol di(meth)acrylate; polypropylene glycol di(meth)acrylate; hexane di(meth)acrylate; neopentyl glycol di(meth)acrylate; glycerin di(meth)acrylate; glycerin tri(meth)acrylate; glycerin tetra (meth)acrylate; tetratrimethylolpropane tri(meth)acrylate; 1,4-butanediol diacrylates; pentaerythritol triacrylate; trimethylolpropane triacrylate; pentaerythritol(meth)acrylate; and dipentaerythritol hexa(meth)acrylate. These components may be used as a blend of two or more kinds.

In the case that the polyfunctional photocurable compound (d) is contained, the content thereof is usually 27% by weight or less, preferably 20% by weight or less, on the basis of solid content, in the curable resin composition. From the viewpoint of the easy control of the plate making property and the curability of the coating film, the content ratio between the acidic polyfunctional photocurable compound (c) and the polyfunctional photocurable compound (d) preferably satisfies a relationship that a weight ratio $((c)/\{(c)+(d)\})$ of the acidic polyfunctional photocurable compound (c) to a total of the acidic polyfunctional photocurable compound (c) and the polyfunctional photocurable compound (d) is in a range from 0.1 to 1, on the basis of solid content.

Also, the content ratio among the copolymer (a) and a total of the acidic polyfunctional photocurable compound (c) and the polyfunctional photocurable compound (d) preferably satisfies a relationship that a weight ratio $((a)/\{(c)\pm(d)\})$ of the copolymer (a) to a total of the acidic polyfunctional photocurable compound (c) and the polyfunctional photocurable compound (d) is 1.5 or less, more preferable 1 or less, on the basis of solid content. When the weight ratio $((a)/\{(c)+(d)\})$ is 1.5 or less, there are merits that the curability of the coating film to be formed becomes sufficient and various physical strengths such as the adhesiveness and the heat resistance become suitable.

Furthermore, in the curable resin composition of the present invention, a monofunctional monomer such as methyl (meth)acrylate; ethyl(meth)acrylate; propyl(meth)acrylate; butyl(meth)acrylate; pentyl(meth)acrylate; ethylhexyl(meth) acrylate; styrene; methylstyrene; and N-vinylpyrrolidone, may be added as a reactive diluent.

(Sensitizer)

In the case that the photosensitivity is required to be improved, a sensitizer may be added. The sensitizer to be used is preferably a styryl compound or a coumarin compound. Specifically, it may be: 2-(p-dimethylaminostyryl)quinoline; 2-(p-diethylaminostyryl)quinoline; 4-(p-dimethylaminostyryl)quinoline; 4-(p-diethylaminostyryl)quinoline; 2-(p-dimethylaminostyryl)-3,3-3H-indole; 2-(p-diethylaminostyryl)-3,3-3H-indole; 2-(p-dimethylaminostyryl) benzoxazole; 2-(p-diethylaminostyryl)-benzoxazole; 2-(p-dimethylaminostyryl)benzimidazole; 2-(p-diethylaminostyryl)-benzimidazole and so on.

Furthermore, the coumarin compound may be 7-diethylamino-4-methylcoumarin; 7-ethylamino-4-trifluoromethylcoumarin; 4, 6-diethylamino-7-ethylaminocoumarin; 3-(2-benzimidazolyl)-7-N,N-diethylaminocoumarin; 7-diethylamino cyclopenta(c)coumarin; 7-amino-4-trifluoromethylcoumarin; 1,2,3,4,5,3H,6H,10H-tetrahydro-8-trifluoromethyl(1)benzopyrano-(9,9a,1-gh)-quinolizin-10-on; 7-ethylamino-6-methyl-4-trifluoromethylcoumarin; 1,2,3,4, 5,3H,6H,10H-tetrahydro-9 -carbethoxy(1)benzopyrano-(9, 9a,1-gh)-quinolizin-10-on; and so on.

(Epoxy Resin)

Furthermore, for a purpose of improving the heat resistance, the adhesiveness and the chemical resistance (particularly alkali resistance), a compound having at least two epoxy groups in its molecule (an epoxy resin) may be compounded in the curable resin composition of the present invention, if needed. The compound having at least two epoxy groups in its molecule may be for example a bisphenol A type epoxy resin such as Epikote 1001, 1002, 1003, 1004, 1007, 1009, 1010 (available from Japan Epoxy Resins Co., Ltd.); a bisphenol F type epoxy resin such as Epikote 807 (available from Japan Epoxy Resins Co., Ltd.); a phenolnovolac type epoxy resin such as EPPN 201, 202 (available from NIPPON KAYAKU CO., LTD.), Epikote 154 (available from Japan Epoxy Resins Co., Ltd.); cresolnovolac type epoxy resin such as EOCN 102, 103S, 104S, 1020, 1025, 1027 (available from NIPPON KAYAKU CO., LTD.); Epikote 180S (available from Japan Epoxy Resins Co., Ltd.); and so on. Furthermore, it may be a cycloaliphatic epoxy resin or aliphatic polyglycidyl ether.

Among them, the bisphenol A type epoxy resin, the bisphenol F type epoxy resin, the phenolnovolac type epoxy resin, the cresolnovolac type epoxy resin, and the cycloaliphatic epoxy resin are preferable. Many of these compounds having at least two epoxy groups in the molecule are high molecular weight materials. Nevertheless, glycidyl ether of the bisphenol A or bisphenol F is a low molecular weight material, which is particularly preferable. Furthermore, an acrylic copolymer containing glycidyl(meth)acrylate, oxetane (meth)acrylate, cycloaliphatic epoxy(meth)acrylate and the like in the resin skeleton is also effective.

Such an epoxy resin is contained at usually 0 to 60% by weight, preferably 5 to 40% by weight, on the basis of solid content, in the curable resin composition. If the content of the epoxy resin is less than 5% by weight, the protective film may not have the sufficient alkali resistance. On the other hand, if the content of the epoxy resin is more than 60% by weight, the amount of the epoxy resin becomes excessive, which causes disadvantageously the deterioration in the storage stability or developing property of curable resin composition. Additionally, the epoxy resin is also effective to remove the tack of the dried coating film of the curable resin composition, and the amount to be added in the order of 3% by weight brings the sufficient effect. The epoxy resin reacts with the acidic group, which did not react and thereby remains in the coating film even after the exposure and the alkali developing, by a heating treatment, so that the superior alkali resistance is provided for the coating film.

(Other Components)

One or more kinds of other additives may be compounded in the photosensitive composition of the present invention, if needed. Such an additive may be as follows.

(a) Curing Accelerator (Chain Transfer Agent): for example, 2-mercaptobenzimidazole, 2-mercaptobenzthiazole, 2-mercaptobenzoxazole, 2,5-dimercapto-1,3,4-thiadiazole and so on.

(b) Photocrosslinking Agent or Photosensitization Agent made of polymer compound: the polymer photocrosslinking agent or photosensitization agent is a polymer compound having a functional group which can act as a photocrosslinking agent or photosensitization agent in the main chain and/or the side chain, such as a condensation product of 4-azidebenzaldehyde and polyvinyl alcohol, a condensation product of 4-azidebenzaldehyde and phenolnovolac resin, a (co)polymer of 4-(meth)acryloyl phenyl cinnamoyl ester, 1,4-polybutadiene, 1,2-polybutadiene and so on.

(c) Auxiliary dispersing agent: for example, a blue pigment derivative such as copper phthalocyanine, a yellow pigment derivative and so on.

(d) Filler: for example, glass, alumina and so on.

(e) Adhesion Accelerator: for example, vinyltrimethoxysilane, vinyltriethoxysilane, vinyltris(2-methoxyethoxy)silane, N-(2-aminoethyl)-3-aminopropylmethyldimethoxysilane, and so on.

(f) Antioxidant: for example, 2,2-thiobis(4-methyl-6-t-butylphenol), 2,6-di-t-butylphenol and so on.

(g) Ultraviolet Absorber: for example, 2-(3-t-butyl-5-methyl-2-hydroxyphenyl)-5-chlorobenztriazole, alkoxybenzophenone and so on.

(h) Aggregation Inhibitor: for example, polysodium acrylate, or various surfactants and so on.

(i) Surfactant.

(j) Silane Coupling Agent.

From the viewpoint of preparing the coating liquid and the coating property, a solvent having a relatively high boiling point is contained in the curable resin composition of the present invention, so as to obtain a good solubility in the copolymer (a), the photopolymerization initiator (b), the acidic polyfunctional photocurable compound (c) and so on, as well as a good spin coating property. The usable solvent may be an organic solvent including for example: an alcohol solvent such as methyl alcohol, ethyl alcohol, N-propyl alcohol, i-propylalcohol; a cellosolve solvent such as methoxy alcohol and ethoxy alcohol; a Carbitol solvent such as methoxyethoxy ethanol and ethoxyethoxy ethanol; an ester solvent such as ethyl acetate, butyl acetate, methyl methoxypropionate, ethyl ethoxypropionate and ethyl lactate; a ketone solvent such as acetone, methyl isobutyl ketone and cyclohexanon; a cellosolve acetate solvent such as methoxy ethyl acetate, ethoxy ethyl acetate and ethyl cellosolve acetate; a Carbitol acetate solvent such as methoxy ethoxy ethyl acetate and ethoxy ethoxy ethyl acetate; an ether solvent such as diethyl ether, ethylene glycol dimethyl ether, diethylene glycol dimethyl ether and tetrahydrofuran; an aprotic amide solvent such as N,N-dimethylformamide, N,N-dimethylacetamide and N-methylpyrrolidone; a lactone solvent such as γ-butyrolactone; an unsaturated hydrocarbon solvent such as benzene, toluene, xylene and naphthalene; and a saturated hydrocarbon solvent such as N-heptane, N-hexane and N-octane. Among these solvents, the cellosolve acetate solvent such as methoxy ethyl acetate, ethoxy ethyl acetate and ethyl cellosolve acetate; the Carbitol acetate solvent such as methoxy ethoxy ethyl acetate and ethoxy ethoxy ethyl acetate; the ether solvent such as ethylene glycol dimethyl ether, diethylene glycol dimethyl ether and propylene glycol diethyl ether; the ester solvent such as methyl methoxypropionate, ethyl ethoxypropionate and ethyl lactate are particularly preferable. Particularly, it is more preferable to use MBA (3-methoxybutyl acetate, $CH_3CH(OCH_3)CH_2CH_2OCOCH_3$), PGMEA (propylene glycol monomethyl ether acetate, $CH_3OCH_2CH(CH_3)OCOCH_3$), DMDG (diethylene glycol dimethyl ether, $H_3COC_2H_4OCH_3$) or the mixture thereof. By using them, the solid concentration is controlled at 5 to 50% by weight.

In order to produce the curable resin composition of the present invention, the copolymer (a), the photopolymerization initiator (b), the acidic polyfunctional photocurable compound (c), and other components are put into a suitable solvent, and these components are dissolved or dispersed in the solvent by an ordinary method using a paint shaker, a bead mill, a sand grind mill, a ball mill, an attriter mill, a two-roll mill, a three-roll mill, or the like. As the curable resin, which is a main polymer, there may be used a resin obtained by isolating and purifying the copolymer (a) as an effective component after synthesis reaction thereof, or a reactant solution or a dried product obtained by synthesis reaction thereof as it is.

When the thus-obtained curable resin composition is applied to some substrate to form a coating film and then the coating film is irradiated with activation energy beams such as ultraviolet rays or electron beam, the photocurable functional group of the copolymer (a), the acidic polyfunctional photocurable compound (c), and, if needed, the polyfunctional photocurable compound (d) cause a photopolymerization reaction, and form cross-link bond between the molecules of the copolymer (a), so that the coating film is cured. The cured coating film can be developed in an alkali developing solution such as sodium hydroxide.

The curable resin composition of the present invention can improve the cross-link density and the alkali solubility, by compounding the acidic polyfunctional photocurable compound (c), even if the content ratio of the polymerization initiator (b) having the tertiary amine structure is high. Furthermore, the viscosity does not become excessively high, even if a large amount of the acidic polyfunctional photocurable compound (c) is compounded. Therefore, it is possible to apply the curable resin composition uniformly on the substrate. Additionally, the curable resin compound has a high sensitivity during the exposure, and thereby can be cured with less light exposure. Furthermore, the coating film after curing has excellent physical properties such as hardness, strength, adhesiveness, elastic deformation modulus and so on, as well as an excellent alkali developing property such as a developing speed, a shape or residue after developing, and so on.

In the present invention, the exposure sensitivity of a photocurable resin composition can be evaluated by the following method. First, a photocurable resin composition is applied on a substrate and dried as needed to form a coating film. As the substrate, any plate can be used without problems insofar as it does not interfere with a series of pattern forming processes including exposure, developing and others. An example thereof is a transparent glass plate. The thickness of the coating film is not especially limited, but usually it should be set to about 1 to 10 μm. This coating film is pre-baked under appropriate conditions, for example, at a temperature of 70 to 150° C. for 1 to 1.0 minutes. After the pre-baking, the coating film is exposed at a known exposure strength and then its thickness is measured. The thickness measured at this stage is referred to as "the film thickness before development".

Next, the pre-baked coating film is caused to contact an appropriate developing solution to dissolve and remove unexposed parts. The remaining exposed part is washed if necessary, so as to develop the coating film. Here, the composition of the developing solution and the developing conditions should be suitably selected depending on a curable resin composition to he tested. It is needless to say that a preferable developing solution is such a developing solution that the exposed part (the cured part) of the photocurable resin composition is hardly dissolved and the unexposed part is completely dissolved. The developed coating film is post-baked under appropriate conditions, for example, at a temperature of 180 to 280° C. for 20 to 80 minutes. After the post-baking, the thickness of the coating film is measured, and the thickness is referred to as "the final film thickness after curing".

From the film thickness before development and the final film thickness after curing, which are measured as described above, the residual film ratio is calculated according to the following equation:

Residual film ratio (%)={(final film thickness after curing (μm))÷(film thickness before development (μm))}×100.

On the other hand, the same photocurable resin composition is applied onto a substrate, dried, and pre-baked in the same way as mentioned above to form a coating film for reference. This coating film for reference is exposed at exposure strength that is sufficient to completely cure the coating film, and then its film thickness is measured. The film thickness measured at this stage is referred to as "the completely exposed film thickness". Next, the coating film that has been completely exposed is post-baked by the same method as used for the sample film, but without developing, and then the film thickness of the obtained film is measured by the same method as mentioned above. This film thickness is referred to as "the final film thickness without the developing process". From the completely exposed film thickness and the final film thickness without the developing process that are measured as described above, the reference residual film ratio is calculated according to the following equation:

Reference residual film ratio (%)={(final film thickness without the developing process (μm))÷(completely exposed film thickness (μm))}×100.

After calculating the residual film ratio and reference residual film ratio in this way, the smallest exposure amount in the case that the residual film ratio is equal to the reference residual film ratio provided that the error limit is 1% is defined as the minimum exposure amount of the photocurable resin composition. It can be evaluated that the smaller the minimum exposure amount is, the higher the sensitivity is.

According to the present invention, it is possible to obtain such a very high sensitive photocurable resin composition of which the minimum exposure amount, which is determined in this way, is 100 mJ/cm$^2$ or less, preferably 80 mJ/cm$^2$ or less, and more preferably 50 mJ/cm$^2$ or less, while maintaining the suitable developing property.

The curable resin composition of the present invention is particularly suitable for forming a protective film for covering the color layer, and a convex spacer for maintaining a cell gap of a liquid crystal panel substrate. Besides, the composition can be suitably used as a material for forming a negative type permanent film in broad fields, for example, a planarized film of a TFT array substrate or an insulation interlayer for semiconductor devices.

The liquid crystal panel substrate of the present invention comprises a transparent substrate; and a color layer disposed on the transparent substrate. The liquid crystal panel substrate optionally comprises: a protective film for covering the color layer; and/or a spacer disposed in a non-display region on the transparent substrate. The liquid crystal panel substrate of the invention is characterized in that at least one of the color layer, the protective film and the spacer is formed by curing the photosensitive composition of the present invention.

Furthermore, the liquid crystal panel of the present invention comprises: a display side substrate; a liquid crystal driving side substrate opposite to the display side substrate; and a liquid crystal filled and sealed between these two substrates, and characterized in that at least one of the display side substrate and the liquid crystal driving side substrate is the liquid crystal panel substrate of the present invention.

Figure 3:
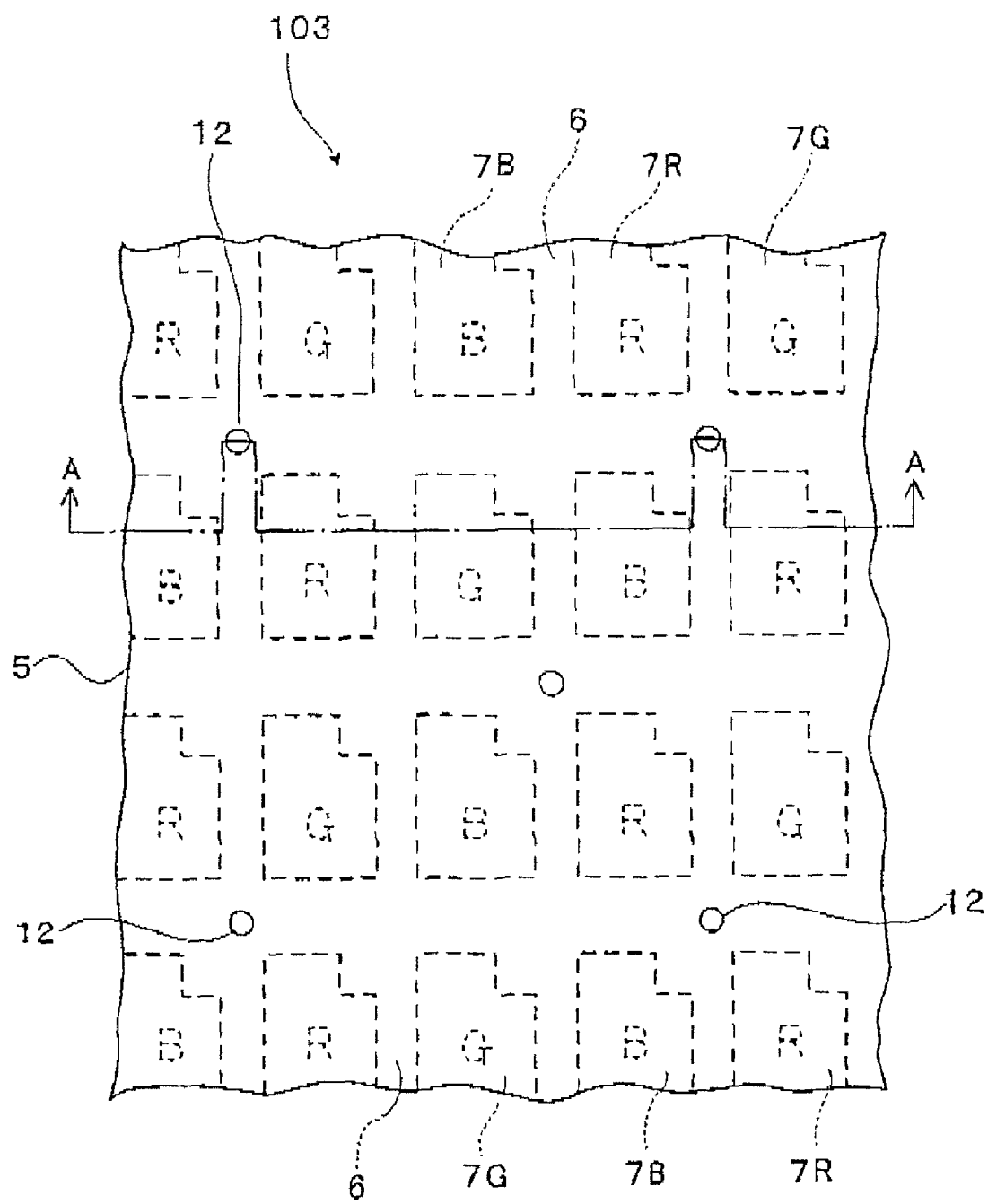
FIG. 3 is a plan view of one example of the liquid crystal panel substrate according to the present invention.
Figure 4:
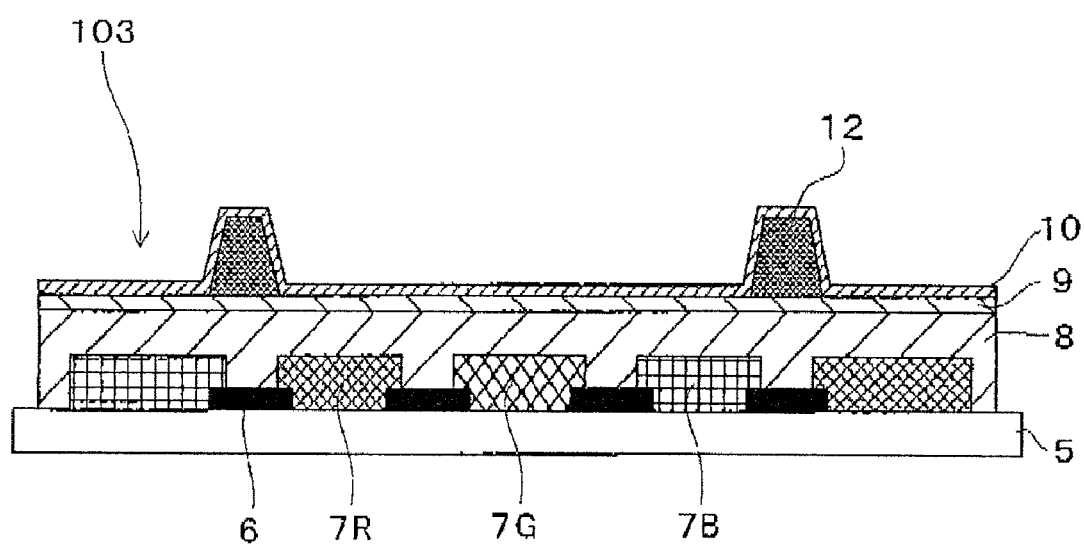
FIG. 4 is a sectional view of the example of the liquid crystal panel substrate according to the present invention.

FIG. 3 is a plan view illustrating an example of the color filter (color filter 103) belongs to the liquid crystal panel substrate of the present invention. FIG. 4 is a vertical section of the same color filter 103 along A-A line in FIG. 3.

This color filter 103 is provided with a black matrix 6 formed in a predetermined pattern on a transparent substrate 5; a color layer 7 (7R, 7G, 7B) formed in a predetermined pattern on the black matrix; and a protective film 8 formed so as to cover the color layer. If needed, a transparent electrode 9 for driving the liquid crystal may be formed on the protective film. An alignment film 10 is formed on an innermost surface of the color filter (on the transparent electrode in this case).

Column-shaped spacers 12, which is in a form of the convex spacers, are formed at a plurality of predetermined positions on the transparent electrode 9 (5 positions in FIG. 3), correspondingly to regions where the black matrix layer 6 is formed. The column-shaped spacers 12 are formed on the transparent electrode 9 or the color layer 7 or the protective film 8. In the color filter 101, the column-shaped spacers 12 are formed like "islands in the sea" on the protective film 8 via the transparent electrode 9. Nevertheless, the column-shaped spacers 12 may be formed integrally with the protective film 8, and the transparent electrode layer may be formed thereon so as to cover them. Furthermore, in the case that the color filter is not provided with the black matrix layer, the column-shaped spacers may be formed in regions where the color layer is not formed.

As the transparent substrate 5 of the color filter 103, there may be used a transparent rigid material having no flexibility such as quartz glass, Pyrex (registered trademark), glass, synthetic quartz plate, a thin film or sheet of glass; or a transparent flexible material having flexibility such as transparent resin film, optical resin plate. Among them, "1737 glass" available from Corning Incorporated. is especially suitable for a color filter of active matrix type color liquid crystal display devices, because that the "1737 glass" is a material having a small thermal expansion coefficient and thereby superior in the dimensional stability and the operability in a high temperature heating process, and because that the "1737 glass" is a non-alkali glass containing no alkali component in the glass.

The black matrix layer 6 is formed in regions between the color layers 7R, 7G, 713 and further formed so as to surround outsides of color layer forming-regions, in order to improve the contrast of the display image. A method of forming the black matrix layer 6 includes a method of etching and patterning with the aid of a photosensitive resist, and a method of patterning with the aid of a photocurable resin composition containing light blocking particles.

In the method using the photosensitive resist, firstly, a metal thin film such as chromium is formed as a light blocking layer on the transparent substrate 5 by a vapor deposition method such as sputtering or vacuum vapor deposition, or a resin layer comprising a resin composition of a resin such as polyimide resin, acrylic resin and epoxy resin containing light blocking particles such as carbon blacks is formed by a coating method such as spin coating, roll coating, spraying, or printing. On such a light blocking layer made of metal thin film or light blocking resin, a known positive or negative type photoresist is applied to form a photoresist layer, and the formed photoresist layer is exposed via a photo mask for the black matrix, and developed. Then, the exposed portions of the light blocking layer owing to the development is etched, and the remaining photoresist is removed, so that the black matrix layer 6 can be formed.

On the other hand, in the method using the curable resin composition containing the light blocking particles, firstly, the curable resin composition containing the light blocking particles such as carbon blacks or metal oxides is applied on the transparent substrate 5, and dried if needed, to form the photosensitive coating film, and the formed coating film is exposed via the photo mask for the black matrix, and developed, and subjected to a heating treatment if needed, so that the black matrix layer 6 can be formed. As the photocurable resin composition to be mixed with the light blocking particles, the photosensitive composition of the present invention may be used.

The thickness of the black matrix layer is in the order of 1000 to 2000 Å for a metal thin film, or in the order of 0.5 to 2.5 µm for a light blocking resin layer.

The color layer 7 forms a display region in which a red pattern, a green pattern and a blue pattern are arranged in a predetermined form such as mosaic type, stripe type, triangle type, four pixel arrangement type and so on. The color layer can be formed by a known method such as a pigment dispersion method, a dyeing method, a printing method, or an electrodepositing method. Among these methods, the pigment dispersion method, in which a curable resin composition containing a colorant such as a pigment is used, is preferable.

In the case of the pigment dispersion method, colorants such as pigments are first dispersed into a curable resin composition to prepare photocurable colored resin compositions for red, green and blue, respectively. Next, any one of the photocurable colored resin compositions, for example, the photocurable red resin composition is applied onto the transparent substrate 5 to cover the black matrix layer 6 by a known method such as spin coating, so as to form a photocurable red resin layer. This layer is exposed to light through a photo mask for a red pattern, alkali-developed, and then cured by heating in a clean oven or the like, to form the red color layer 7R. Thereafter, the photocurable colored resin compositions for green and blue are successively used to pattern the respective color resin layers in the same way. In this way, the green color layer 7G and the blue color layer 7B are formed.

The thickness of the color layer is usually in the order of 0.5 to 2.5 µm. Furthermore, the respective color layers may be set at the respective optimal thickness of a liquid crystal layer for each color by varying their thickness in such a manner that, for example, the red color layer 7R becomes the thinnest, and the green color layer 7G and the blue color layer 7B become sequentially thicker in this order.

The protective film 8 is formed in order to planarize a surface of the color filter, and in order to prevent the components contained in the color layer 7 from eluting into the liquid crystal layer. The protective film 8 can be formed by applying a known negative photocurable transparent resin composition or thermosetting transparent resin composition so as to cover the black matrix layer 6 and the color layer 7, by a method such as spin coating, roll coating, spraying or printing, and then curing the composition by light or heat. It is preferable to use the curable resin composition of the present invention as the photocurable transparent resin composition to form the protective film. In the case of using the curable resin composition of the present invention, the protective film can be formed with a good flatness.

The thickness of the protective film is set, considering the light transmittance of the resin composition, the surface condition of the color filter, and so on. For example, the thickness is set to about 0.1 to 2.0 µm. In the case of using a spin coater, the rotation number thereof is set within the range from 500 to 1500 rotations/minute.

The transparent electrode 9 on the protective film is formed by a common method, such as sputtering, vacuum vapor deposition, and CVD, using tin indium oxide (ITO), zinc oxide (ZnO), tin oxide (SnO), or an alloy thereof, and has a predetermined pattern formed by etching with a photo resist or by using a tool as needed. The thickness of this transparent electrode can be set to about 20 to 500 nm, preferably about 100 to 300 nm.

A plurality of convex spacers are arranged in the non-display region on the substrate in order to maintain a cell gap when the color filter 103 is aligned with (bonded to) a liquid crystal driving side substrate such as a TFT array substrate. The shape and the size of the convex spacers are not particularly limited insofar as the spacers can be selectively arranged in the non-display region on the substrate and the predetermined cell gap can be maintained over the whole of the substrate. When the column-shaped spacers 12 as illustrated are formed as the convex spacers, the spacers 12 have a constant height within the range from about 2 to 10 µm. The projection height (thickness of the pattern) can be appropriately set, considering the thickness required for the liquid crystal layer, and others. The width of each spacer 12 can be appropriately set within the range from about 5 to 20 µm. The density (crowd degree) of the formed column-shaped spacers 12 can be appropriately set, considering the thickness irregularity of the liquid crystal layer, the aperture ratio, the shape of the column-shaped spacers, the material thereof, and so on. For example, the density may be set in such a manner that one of the spacers is formed per one group of respective pixels in red, green and blue, whereby exhibiting a necessary and sufficient spacer function. The shape of such spacers may be cylindrical, prismatic, frustum or the like, insofar as it is column-shaped.

The convex spacer can be formed using the curable resin composition of the present invention. That is, firstly a coating liquid of the curable resin composition of the present invention is applied, directly or via another layer such as a transparent electrode layer, onto a transparent substrate by a method such as spin coating, roll coating, spraying or printing, and then dried to form a photocurable resin layer. It is advisable that the rotation number of a spin coater is set within the range of 500 to 1500 rotations/minute in the same manner as in the case of forming a protective film. Next, this resin layer is exposed to light through a photo mask for a convex spacer, and then developed in a developing solution such as an alkali solution, so as to form a predetermined convex pattern. If necessary, this convex pattern is subjected to a heat treatment (post-baking) in a clean oven or the like, to form the above-mentioned convex spacer.

The convex spacer can be formed directly or indirectly (via another layer) on a color filter. For example, it is allowable to form a transparent electrode such as ITO or a protective film on a color filter and form a convex spacer thereon, or to form a protective film and a transparent electrode, in this order, on a color filter and then form a convex spacer on the transparent electrode.

In the case of using the curable resin composition of the present invention, it is possible to form the convex spacers having a good pattern edge shape, and having a suitable forward taper shape in which a ratio (S2/S1) of the upper area (S2) to the lower area (S1) of the convex spacers satisfies $0.4 \leq (S2/S1) \leq 1$.

The alignment film 10 is formed at the inner side of the color filter, so as to cover the display region containing the color layer 7 and the non-display region containing the black matrix layer 6 and the column-shaped spacers 12. The alignment film 10 can be formed in such a manner that a coating liquid containing a resin such as polyimide resin is applied by a known method such as spin coating, then dried, and cured by heat or light depending on the situation, and then subjected to rubbing.

The color filter 103 (a display side substrate) obtained as such is faced toward the TFT array substrate (a liquid crystal driving side substrate), and the inner side peripheries of both substrates are bonded with a sealant, so that both substrates are aligned (bonded), maintaining a predetermined distance of a cell gap. Then a liquid crystal is filled in a gap between both substrates and sealed, so that an active matrix type color liquid crystal display device belongs to the liquid crystal panel of the present invention can be obtained.

In order to align (bond) the liquid crystal panel substrate represented by the color filter 103, with an opposite substrate, it is preferable to use a room temperature cell bonding method. In any conventional cell fabricating process for producing a liquid crystal panel, it is common to firstly adhere a color filter substrate onto an array substrate on which spacer beads are scattered or adhere an array substrate onto a color filter substrate on which spacer beads are scattered, via a thermosetting agent such as an epoxy curing agent, under pressure at high temperature, and then fill and seal a liquid crystal between these substrates in vacuum. According to this method, however, the production speed or yield tends to be decreased, since there are a large number of processes of fabricating the panel. In the case of a middle-sized or small-sized liquid crystal panel, the number of pixels thereof is small and thus the driving capacity thereof is also small. Consequently, it is sufficient that actuating drivers are mounted onto three sides of the panel. Thus, the liquid crystal can be poured from the remaining side. On the other hand, in the case of a large-sized liquid crystal panel having fine displaying performance, the number of its pixels is large so that a large driving capacity is needed. For this reason, driver-mounting areas are necessary for four sides of the panel. Thus, when a liquid crystal is poured therein, the reliability of the panel is easily lowered by pollution of the liquid crystal when the driver-mounting areas contact the liquid crystal.

The ODF (One Drop Fill) technology is a technology of dropping a liquid crystal onto a substrate and laminating an opposite substrate to the substrate at one time with a distance of a predetermined cell gap. Conventionally, however, it was difficult to apply the ODF technology to industry because of problems of the unevenness of the cell gap based on spacer beads, a lack in adhesive strength of a sealant, liquid crystal pollution and so on. In recent years, however, the ODF technology has been expected to be applied to industrial production in light of development situation of convex spacers, an improvement in the reliability thereof, development situation of photocuring sealant having a good adhesiveness. Since the convex spacer formed from the curable resin composition of the present invention has a suitable tapered shape with a high accuracy, and a high accuracy of the cell gap, it can also be used suitably for the case that room-temperature cell bonding is performed in the ODF technology.

Furthermore, since the completed liquid crystal panel has a high accuracy of the cell gap, the "display unevenness (display irregularity)" can be prevented. Therefore, the liquid crystal panel of the present invention hardly causes the display unevenness and has a superior image quality.

The above has described the liquid crystal panel substrate of the present invention, giving color filters as examples. However, the present invention can be applied to a display side substrate other than color filters, for example, a monochromic filter. The present invention can also be applied to a liquid crystal driving side substrate, such as a TFT array substrate or a driving substrate in a simple matrix system. When the present invention is applied to a liquid crystal driving side substrate such as a TFT array substrate, spacers on the liquid crystal driving side substrate are arranged in a region which overlaps with a black matrix layer (non-display region) in a display side substrate to be combined. Furthermore, the present invention can be applied to a color filter for a display substrate other than the liquid crystal panel, such as an organic EL display substrate,

EXAMPLE OF THE FIRST ASPECT

EXAMPLE A SERIES (Example of Production A1) Synthesis of Polymer A1

Benzyl methacrylate of 15.6 parts by weight, styrene of 37.0 parts by weight, acrylic acid of 30.5 parts by weight, 2-hydroxy ethyl methacrylate of 16.9 parts by weight, diethylene glycol dimethyl ether (DMDG) of 220 parts by weight are fed into a polymerization tank, and stirred to prepare a solution. Thereafter, 2,2'-azobis(isobutyronitrile) of 0.8 parts by weight is added thereto and homogeneously dissolved therein. Thereafter, under nitrogen gas flow, the solution was stirred at 85° C. for 2 hours, and then reacted at 100° C. for 1 hour. To the resultant solution, 2-methacryloyl oxyethyl isocyanate of 16.9 parts by weight, triethylamine of 0.5 parts by weight, and hydroquinone of 0.1 parts by weight were added. The solution was stirred at 100° C. for 5 hours to yield the target polymer A1 (solid content: 35%).

EXAMPLES A1-A2

COMPARATIVE EXAMPLES A1-A3

Resin compositions for protective layers were prepared as Example A1 and Comparative Example A1, and resin compositions for column-shaped spacers were prepared as Example A2 and Comparative Examples A2 and A3, in which polymer, monomer, additive, initiator and solvent were mixed at respective ratios shown in Table A1.

TABLE A1

| | | Example | | Comparative Example | | |
|---|---|---|---|---|---|---|
| | Compound or Product name | A1 | A2 | A1 | A2 | A3 |
| Polymer | Polymer A1 of Production Example A1 (Solid Content 35%) | 25.7 | 38.6 | 25.7 | 51.4 | 59.1 |
| Photocurable Compound | SR399E *1 | 0 | 0 | 15 | 22.5 | 22.5 |
| Acidic Polyfunctional Photocurable Compound | TO1382 *2 | 15 | 22.5 | 0 | 0 | 0 |
| Epoxy Resin | Epikote180S70 *3 | 3 | 0 | 3 | 0 | 0 |

TABLE A1-continued

|  | Compound or Product name | Example | | Comparative Example | | |
|---|---|---|---|---|---|---|
|  |  | A1 | A2 | A1 | A2 | A3 |
| Polymerization Initiator | IRGACURE907 *4 | 1.5 | 0 | 1.5 | 0 | 0 |
|  | 2,2'-Bis(o-chlorophenyl)-4,5,4'-tetraphenyl-1,2'-bisimidazole *5 | 1.5 | 0 | 1.5 | 0 | 0 |
|  | IRGACURE369 *6 | 0 | 9 | 0 | 4.5 | 1.8 |
| Solvent | Propylene glycol monomethylether acetate | 53.3 | 29.9 | 53.3 | 21.6 | 16.6 |
|  | Total (wt %) | 100 | 100 | 100 | 100 | 100 |

*1 Nippon Kayaku Co., Ltd.
*2 TOAGOSEI Co., Ltd.
*3 Japan Epoxy Resins Co., Ltd.
*4 Ciba Specialty Chemicals
*5 KUROGANE KASEI Co., Ltd.
*6 Ciba Specialty Chemicals <Evaluation>
(Evaluation of Plate Making Property)

Each of resin compositions obtained in Examples A1, A2, and Comparative Examples A1-A3 was applied onto a glass substrate of 10 cm square by using a spin coater (1H-DX2 fabricated by MIKASA CORPORATION) to 1.5 μm in thickness. The obtained coating film was pre-baked at 100° C. for 3 minutes on a hot plate. A photo mask which is designed to form an exposure pattern having a predetermined shape, size and intervals, was disposed on the coating film on the substrate. The substrate was irradiated with UV ray at 100 mJ/cm$^2$ by a proximity aligner, and then spray-developed by using 0.05% by weight of KOH aqueous solution. In this time, time required for the development, residue, residual periphery and adhesiveness were evaluated. Here, the residual periphery refers to whether the periphery of the coating film, which is a thick part produced by spin coating, dissolved or remained. From the residual periphery, it is possible to judge whether the developing property of the resin composition is good or bad.

(Evaluation of Sensitivity)

Each of curable resin compositions obtained by Examples and Comparative Examples was applied onto a glass substrate of 10 cm square by using a spin coater (1H-DX2 fabricated by MIKASA CORPORATION) and then dried to obtain a coating film having a dry-state thickness of 2 μm. This coating film was heated at 90° C. for 3 minutes on a hot plate. After heating, a photo mask was disposed at a distance 100 μm from the coating film. The substrate was irradiated with UV ray at an intensities of 25, 35, 50 and 100 mJ/cm$^2$ (on the basis of 405 nm lighting intensity), respectively, for each region obtained by quadrisecting the same coating film.

After irradiation with UV ray, a rectangle of 1 mm×3 mm of the coating film was scraped off from each of these four regions to partially expose the glass substrate. A film thickness of each irradiation region was measured by a stylus surface profilometer (Dektak 1600 fabricated by ANELVA CORPORATION). The measured thickness is referred to as "the film thickness before development".

Then, potassium hydroxide aqueous solution of 0.05% by weight was sprayed to the exposed part of the coating film by a spin developer (Applied Process Technology, INC., MODEL: 915) for 60 seconds to dissolve and remove the unexposed part. The remained exposed part was washed by pure water for 60 seconds, and thereby developed. After development, the film of the exposed part was heated at 200° C. for 30 minutes in a clean oven (SCOV-250 Hy-So fabricated by OSHITARI LABORATORY, INC.). A film thickness of each region of the obtained film was measured by the same method as described above. The measured thickness is referred to as "the final film thickness after curing".

From the film thickness before development and the final film thickness after curing, which are measured as described above, the residual film ratio was calculated according to the following equation:

Residual film ratio (%)={(final film thickness after curing (μm))÷(film thickness before development (μm))}×100.

On the other hand, the reference residual film ratio was determined as follows__ Firstly, the completely exposed film thickness of the curable resin compound was measured by the same manner for the sample except that an entire surface of the coating film was irradiated at an intensity of 100 mJ/cm$^2$. Then, the coating film exposed at 100 mJ/cm$^2$ was not developed but heated by the same manner for the sample without development The thickness of the obtained film was measured by the same manner as described above and referred to as "the final film thickness without the developing process". From the completely exposed film thickness and the final film thickness without the developing process that are measured as described above, the reference residual film ratio was calculated according to the following equation:

Reference residual film ratio (%)={(final film thickness without the developing process (μm))÷(completely exposed film thickness (μm))}×100.

After calculating the residual film ratio and reference residual film ratio in this way, the smallest exposure amount in the case that the residual film ratio was equal to the reference residual film ratio provided that the error limit was 1% was determined as the minimum exposure amount of the photocurable resin composition.

The plate making property was evaluated for Examples A1, A2 and Comparative Examples A1-A3, and the sensitivity was evaluated for Example A2 and Comparative Example A3. The evaluation result is shown in Table A2.

TABLE A2

|  |  | Example A1 | Example A2 |
|---|---|---|---|
| Plate Making Property | Developing Time | 25 s | 35 s |
|  | Residue | ○ | ○ |
|  | Residual Periphery | ○ | ○ |
|  | Adhesiveness | ○ | ○ |
| Sensitivity (minimum exposure) |  | — | 40 mJ/cm$^2$ |

|  |  | Comparative Example A1 | Comparative Example A2 | Comparative Example A3 |
|---|---|---|---|---|
| Plate Making Property | Developing Time | 40 s | 60 s | 50 s |
|  | Residue | Δ | Δ | Δ |
|  | Residual Periphery | Δ | x | x |
|  | Adhesiveness | ○ | ○ | ○ |
| Sensitivity (minimum exposure) |  | — | — | 100 mJ/cm$^2$ |

—: Not evaluated

Example A1 (using the acidic polyfunctional curable compound (c)) according to the present invention exhibited a superior plate making property. On the contrary, Comparative Example A1 using only the photocurable compound (d) instead of the same amount of the acidic polyfunctional curable compound (c) exhibited an inferior plate making property to Example A1 of the present invention.

Example A2 containing 12.8% based on solid content of the photopolymerization initiator (b) having the tertiary amine structure also exhibited a good plate making property. Also in Example A2, it was found that the sensitivity was improved, in comparison with Comparative Example A3 using a usual amount of photopolymerization initiator.

Comparative Example A2, in which the amount of the copolymer (a) having the acidic functional group was increased but only the photocurable compound (d) was used without using the acidic polyfunctional curable compound (c), exhibited an inferior plate making property, in comparison with Examples of the present invention.

EXAMPLE A3

Fabrication of Liquid Crystal Panel Substrate (1) Formation of Black Matrix

A resin composition for black matrix as shown in Table A3 was applied onto a glass substrate having a thickness of 1.1 mm (AL grade available from ASAHI GLASS CO., LTD.) by using a spin coater and then dried at 100° C. for 3 minutes to form a light blocking layer having a film thickness of about 1 μm. The light blocking layer was exposed in a light blocking pattern with a super high pressure mercury lamp, and then developed with 0.05% potassium hydroxide aqueous solution. Thereafter, the substrate was left in an atmosphere at 180° C. for 30 minutes, so that the substrate was subjected to a heat treatment so as to form the black matrix in a region where the light blocking layer should be formed.

TABLE A3

|  | Compound or Product name | Manufacturer or Distributor |  |
|---|---|---|---|
| Black pigment | TM black #9550 | Dainichiseika Color & Chemicals Mfg. Co., Ltd. | 14 |
| Dispersing Agent | Disperbyk111 | BYK-Chemie Japan KK | 1.2 |
| Polymer | VR60 | SHOWA HIGHPOLYMER CO.. LTD. | 2.8 |
| Photocurable Compound | SR399E | Nippon Kayaku Co.. Ltd. | 3.5 |
| Additive | L-20 | Soken Chemical & Engineering Co., Ltd. | 0.7 |
| Polymerization Initiator | IRGACURE907 | Ciba Specialty Chemicals | 1.6 |
| Other Polymerization Initiator | 4,4-Diethylaminobenzophenone |  | 0.6 |
|  | 2,4-Diethylthioxanthone |  | 0.2 |
| Solvent | Ethylene glycol monobutyl ether |  | 75.4 |
| Total (wt %) |  |  | 100 |

(2) Formation of Color Layer

On the substrate on which the black matrix was formed as described above, a resin composition for red pattern as shown in Table A4 was applied by spin coating (the coating thickness 1.5 μm), and then dried in an oven at 70° C. for 30 minutes.

Then, a photo mask was disposed at a distance of 100 μm from the coating film made of the resin composition for red pattern, and only a region corresponding to a "color layer formation region" was irradiated with UV ray for 10 seconds by a proximity aligner using a 2.0 kW super high pressure mercury lamp. Then, the substrate was soaked in potassium hydroxide aqueous solution of 0.05% by weight (the temperature of the solution: 23° C.) for 1 minute to be subjected to the alkali development, so that only the uncured part of the coating film made of the resin composition for red pattern was removed. Thereafter, the substrate was left in an atmosphere at 180° C. for 30 minutes, so that the substrate was subjected to a heat treatment so as to form a red relief pattern in a region where red pixels should be formed.

Then, a green relief pattern was formed in a region where green pixels should be formed, by the same manner as for forming the red relief pattern, using a resin composition for green pattern as shown in Table A5.

Furthermore, a blue relief pattern was formed in a region where blue pixels should be formed, by the same manlier as for forming the blue relief pattern, using a resin composition for blue pattern as shown in Table A6. Thus, the color layer made of three colors: red (R), green (G) and blue (B) was formed.

TABLE A4

|  | Compound or Product name | Manufacturer or Distributor |  |
|---|---|---|---|
| Red pigment | C.I. Pigment Red 177 |  | 4.8 |
| Yellow pigment | C.I. Pigment Yellow 139 |  | 1.2 |
| Dispersing Agent | Ajisper PB821 | AJINOMOTO FINE TECHNO CO., INC. | 3 |
| Polymer | Polymer A1 of Production Example A1 |  | 5 |
| Photocurable Compound | SR399E | Nippon Kayaku Co., Ltd. | 4 |
| Polymerization Initiator | IRGACURE907 | Ciba Specialty Chemicals | 2.8 |
|  | 2,2'-Bis(o-chlorophenyl)-4,5,4',5'-tetraphenyl-1,2'-biimidazole | KUROGANE KASEI CO., LTD. | 1.2 |
| Solvent | Propylene glycol monomethylether acetate |  | 78 |
| Total (wt %) |  |  | 100 |

TABLE A5

|  | Compound or Product name | Manufacturer or Distributor |  |
|---|---|---|---|
| Green pigment | C.I. Pigment Green 36 |  | 4.2 |
| Yellow pigment | C.I. Pigment Yellow 138 |  | 1.8 |
| Dispersing Agent | Ajisper PB821 | AJINOMOTO FINE TECHNO CO., INC. | 3 |
| Polymer | Polymer A1 of Production Example A1 |  | 5 |
| Photocurable Compound | SR399E | Nippon Kayaku Co., Ltd. | 4 |
| Polymerization Initiator | IRGACURE 907 | Ciba Specialty Chemicals | 2.8 |
|  | 2,2'-Bis(o-chlorophenyl)-4,5.4',5'-tetraphenyl-1,2'-biimidazole | KUROGANE KASEI CO., LTD. | 1.2 |
| Solvent | Propylene glycol monomethylether acetate |  | 78 |
| Total (wt %) |  |  | 100 |

TABLE A6

|  | Compound or product name | Manufacturer or Distributor |  |
|---|---|---|---|
| Blue pigment | C.I. Pigment Blue 15:6 |  | 6 |
| Dispersing Agent | Ajisper PB821 | AJINOMOTO FINE TECHNO CO., INC. | 3 |
| Polymer | Polymer A1 of Production Example A1 |  | 5 |
| Photocurable compound | SR399E | Nippon Kayaku Co., Ltd. | 4 |
| Acidic Polyfunctional Photocurable Compound | TO1382 | TOAGOSEI Co., Ltd. |  |

TABLE A6-continued

| | Compound or product name | Manufacturer or Distributor | |
|---|---|---|---|
| Polymerization Initiator | IRGACURE907 | Ciba Specialty Chemicals | 2.8 |
| | 2,2'-Bis(o-chlorophenyl)-4,5,4',5'-tetraphenyl-1,2'-biimidazole | KUROGANE KASEI CO., LTD. | 1.2 |
| Solvent | Propylene glycol monomethylether acetate | | 78 |
| Total (wt %) | | | 100 |

(3) Formation of Protective Film

The resin composition for protective layer of Example A1 was applied onto a glass substrate, on which the color layer has been formed, by spin coating, and dried to form the coating film having a dried-state film thickness of 2 μm.

A photo mask was disposed at a distance of 100 μm from the coating film made of the resin composition for protective layer, and only a region corresponding to a "color layer formation region" was irradiated with UV ray for 10 seconds by a proximity aligner using a 2.0 kW super high pressure mercury lamp. Then, the substrate was soaked in potassium hydroxide aqueous solution of 0.05% by weight (the temperature of the solution; 23° C.) for 1 minute to be subjected to the alkali development, so that only the uncured part of the coating film made of the resin composition for protective layer was removed. Thereafter, the substrate was left in an atmosphere at 200° C. for 30 minutes, so that the substrate was subjected to a heat treatment so as to form a protective film. Thus, the color filter belongs to the liquid crystal panel substrate of the present invention was obtained.

(4) Formation of Spacers

The resin composition for column-shaped spacers obtained in Example A2 was applied onto a glass substrate, on which the color layer has been formed, by spin coating, and dried to form the coating film having a dried-state film thickness of 5 μm.

A photo mask was disposed at a distance of 100 μm from the coating film made of the resin composition for column-shaped spacers, and only a "spacer formation region" on the black matrix was irradiated with UV ray for 10 seconds by a proximity aligner using a 2.0 kW super high pressure mercury lamp. Then, the substrate was soaked in potassium hydroxide aqueous solution of 0.05% by weight (the temperature of the solution: 23° C.) for 1 minute to be subjected to the alkali development, so that only the uncured part of the coating film made of the resin composition for column-shaped spacers was removed. Thereafter, the substrate was left in an atmosphere at 200° C. for 30 minutes, so that the substrate was subjected to a heat treatment so as to form fixed spacers. Thus, the color filter with spacers of the present invention was obtained.

EXAMPLE A4

Fabrication of Liquid Crystal Panel

A transparent electrode film was formed on a surface including fixed spacers of the color filter obtained in Example A3, by a DC magnetron sputtering method under the condition that the substrate temperature was 200° C., the discharge gas was argon and oxygen, and the target was ITO. Thereafter, an alignment film was also formed on the transparent electrode film.

Then, the color filter was aligned (bonded) with the glass substrate on which the TFT has been formed by using an epoxy resin as a sealant, under pressure of 0.3 kg/cm² at 150° C., to form a cell. TN liquid crystal was filled and sealed in the cell. Thus, the liquid crystal panel of the present invention was fabricated.

COMPARATIVE EXAMPLE A4

Fabrication of Liquid Crystal Panel Substrate

Liquid crystal panel substrates were fabricated in the same manner as in Example A3, except that the resin compositions of Comparative Examples A1, A2 were used, instead of the resin compositions of Examples A1, A2 in Example A3.

COMPARATIVE EXAMPLE A5

Fabrication of Liquid Crystal Panel

A liquid crystal panel was fabricated in the same manner as in Example A4, except that the liquid crystal panel substrate of Comparative Example A4 was used, instead of the color filter of Example A3, in Example A4.

(Evaluation of Tapered Shape)

Figure 5:
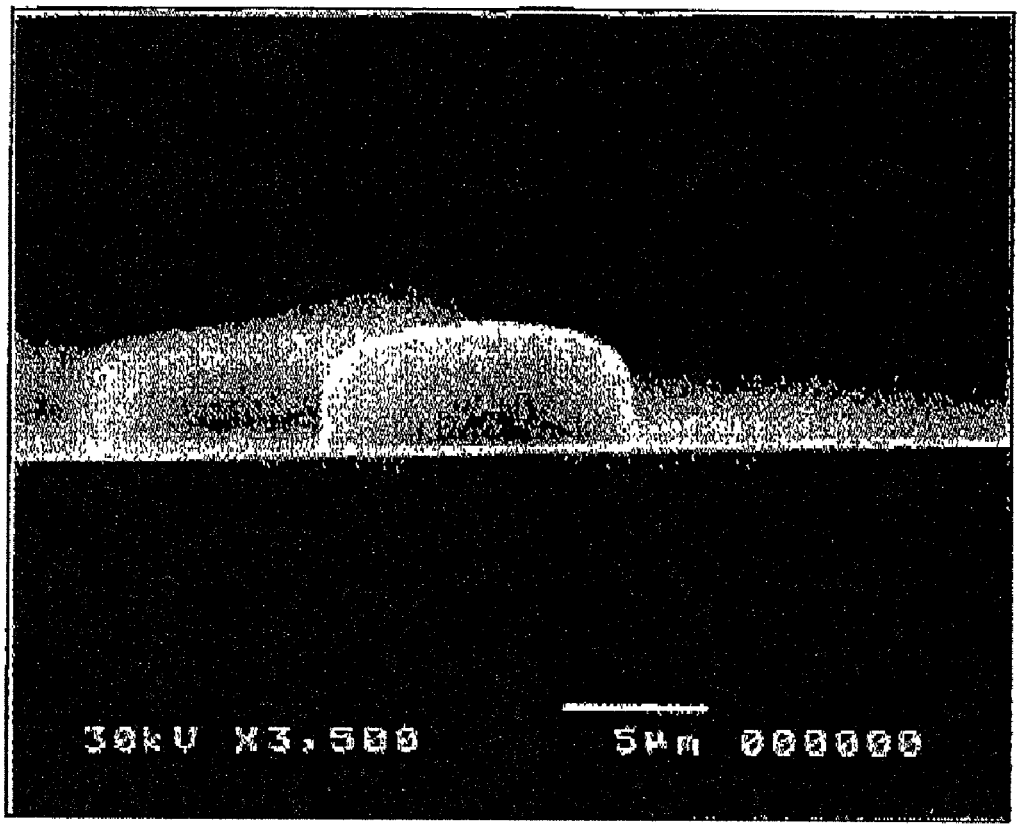
FIG. 5 is a SEM picture showing a side face of a spacer obtained in Example A3 of the first aspect.
Figure 6:
FIG. 6 is a SEM picture showing a side face of a spacer obtained in Comparative Example A4 of the first aspect.

The shape of spacers obtained in Example A3 and Comparative Example A4 was observed from their SEM pictures. These SEM pictures each showing a side surface of each spacer are shown as FIG. 5 and FIG. 6. Furthermore, the upper areas (S2) and the lower areas (S1) were calculated from these SEM pictures, so that the tapered shape (S2/S1) was evaluated. The result is shown in Table A7, with each developing time.

TABLE A7

| | Developing Time (s) | S2/S1 |
|---|---|---|
| Example A3 | 35 | 0.89 |
| Comparative Example A4 | 60 | 0.38 |

In Example A3, a convex spacer was observed having a forward tapered shape, in which S2/S1 was 0.89. The spacer was superior in the developing property, accurate, and had a suitable pattern edge shape. On the other hand, in Comparative Example A4, in which only the polyfunctional photocurable compound to be used as usual was used instead of the same amount of the acidic polyfunctional photocurable compound (c) used in Examples, a spacer was observed having an inverse tapered shape, in which S2/S1 was 0.38. The spacer was inferior in the developing property, and had an inferior pattern edge shape.

(Evaluation of Liquid Crystal Panel Display Unevenness)

It was observed whether or not the display unevenness exists, considering the difference between the used curable resin compositions, by using the liquid crystal panels obtained in Example A4 and Comparative Example A5.

In Example A4, the liquid crystal panel has no display unevenness, and was superior in the image quality. On the contrary, Comparative Example 5 was inferior to Example A4, in view of display unevenness.

As described above, the curable resin composition provided by the first aspect of the present invention comprises: the copolymer (a) having the molecular structure in which the constitutional unit including the acidic functional group and the constitutional unit including the photocurable functional group are linked at least; the photopolymerization initiator (b) having the tertiary amine structure; and the photocurable compound (c) having at least one acidic functional group and at least three photocurable functional groups.

Since the copolymer (a) as mentioned above has the molecular structure in which the constitutional unit including the acidic functional group and the constitutional unit including the photocurable functional group are linked at least, it contributes to both the alkali solubility (developing property) and the curability for improving the cross-link density. However, the amount of the acidic functional group and the photocurable functional group to be incorporated in the molecule of the copolymer (a) has a limit. Furthermore, if the content of the copolymer (a) is excessively high in the composition, the viscosity of the composition disadvantageously increases.

On the contrary, in the first aspect of the present invention, since the acidic polyfunctional photocurable compound (c) is added to the copolymer (a), there are a large amount of the acidic functional group and the photocurable functional group in the composition, even if the amount of the photopolymerization initiator (b) having the tertiary amine structure is increased in order to improve the sensitivity, so that the viscosity of the composition does not increase excessively. Also, since there are a large amount of the acidic functional group in the composition, the disadvantageous influence of the tertiary amine structure to the alkali developing property becomes small in an entire composition. Therefore, it is possible to obtain the curable resin composition superior in any of the sensitivity, the photocurability, and the alkali developing property.

Therefore, the curable resin composition of the present aspect has a high exposure sensitivity and a good developing property, and can form an accurate and precise pattern, and has little residue, and can shorten a time required for pattering and can improve a production speed of the color filter production line.

Furthermore, the curable resin composition of the present aspect is suitable for liquid panel substrates, especially for a protective layer for covering a color layer of a color filter, and especially as a coating material for forming spacers to maintain a cell gap of a liquid crystal panel. That is, it is possible to form a protective film having an improved productivity owing to its high sensitivity, and having a high flatness owing to its superior developing property, and possible to form column-shaped spacers which is accurate and superior in the dimensional stability, by using the curable resin composition of the present aspect.

The liquid crystal panel substrate provided by the present aspect comprises: the transparent substrate; and the color layer disposed on the transparent substrate, and optionally comprises: the protective film for covering the colorant layer; and/or the spacer disposed in the non-display region on the substrate, characterized in that at least one of the protective layer and the spacer is formed by curing the curable resin composition according to the present aspect.

In the liquid crystal panel substrate of the present aspect, since the protective film or spacer is formed from the curable resin composition of the present invention, it is possible to obtain the protective film having a high flatness or obtain the convex spacer having the accurate and suitable pattern edge shape. Therefore, the display unevenness hardly arises, when the liquid crystal panel is assembled.

Furthermore, in the liquid crystal panel of the present aspect, since at least one of the display side substrate such as color filter and the liquid crystal driving side substrate such as TFT array substrate is constructed from the liquid crystal panel substrate according to the present invention, it is possible to maintain the cell gap accurate and uniform in handing during the cell bonding (alignment) and thereafter.

Therefore, the liquid crystal panel of the present aspect hardly causes the display unevenness, and is superior in the image quality.

<Second Aspect>

The curable resin composition provided by the second aspect of the present invention is characterized in that an acidic group-containing monomer (c3) represented by a following formula (11) is used as the photocurable compound (c) in the curable resin composition of the first aspect described above.

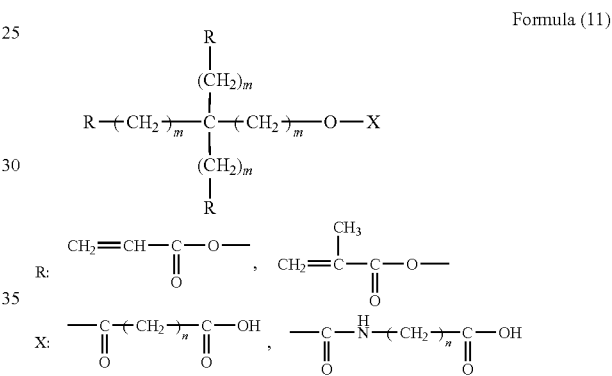

Formula (11)

In the above formula, each of m and n is an integer equal to 1 or more than 1, independently.

In the second aspect, the composition can be prepared and used in the same manner as in the first aspect, except that the acidic group-containing monomer (c3) represented by the formula (11) is used as the acidic polyfunctional photocurable compound (c). In the following description, the parts common to the first aspect are omitted to be described, the only features specific to the present aspect is described.

(Acidic Group-containing Monomer (c3))

The acidic group-containing monomer (c3) is a trifunctional monomer having three ethylenically unsaturated bonds, and the carboxyl group is incorporated therein as the acidic group. The acidic group-containing monomer (c3) is synthesized by reacting a monomer having three acryloyl groups and one hydroxy group in its molecule with a compound or the like having one acid anhydride group in its molecule. Specifically, it can be obtained by reacting pentaerythritol triacrylate with an acid anhydride such as succinic anhydride, 1-dodecenylsuccinic anhydride, maleic anhydride, glutaric anhydride, itaconic anhydride, phthalic anhydride, hexahydro phthalic anhydride, methylhexahydro phthalic anhydride, tetramethylene maleic anhydride, tetrahydro phthalic anhydride, methyltetrahydro phthalic anhydride, endo methylenetetrahydro phthalic anhydride, methyl endo methylenetetrahydro phthalic anhydride, tetrachloro phthalic anhydride, tetrabromo phthalic anhydride, chlorendic anhydride and trimellitic anhydride, in the presence of a catalyst such as N,N-dimethyl benzyl amine, triethyl amine, tributyl amine, triethylene diamine, benzyl trimethyl ammonium chloride, benzyl triethyl ammonium bromide, tetramethyl ammonium bromide, cetyl trimethyl ammonium bromide and zinc oxide, at 60 to 110° C., for 1 to 20 hours.

The acidic group-containing monomer (c3) may be used solely, or may be used as a blend of two or more kinds. In any case, from the viewpoint of improving the alkali developing property of the coating film made from the photosensitive compound, and improving the alkali developing property when the content of the acidic group-containing monomer (c3) represented by the formula (11) is increased in order to improve the cross-link density on curing, it is particularly preferable to use the acidic group-containing monomer (c3) represented by the formula (11) in which R is $CH_2=CHCOO-$, X is $-CO((CH_2)_2)COOH$, m is 1, and n is 2.

The photosensitive compound of the present aspect can be prepared by combining the copolymer (a), as the binder resin, described in the first aspect with the acidic group-containing monomer (c3) represented by the formula (11).

The copolymer (a) can be compounded usually at a ratio of 1 to 50% by weight, relative to a total solid content of the photosensitive composition.

In this case, under condition that no pigment is dispersed in the photosensitive composition, even if the weight percentage of the acidic group-containing monomer relative to a total amount of the binder resin and the acidic group-containing monomer is increased to about 90%, it is possible to easily form the coating film having a good developing property with 0.01 to 2.00 wt % aqueous solution of potassium hydroxide, sodium hydroxide, potassium hydrogen carbonate and sodium hydrogen carbonate.

Furthermore, under condition that a pigment is dispersed in the photosensitive composition (even if an organic pigment is used as the pigment), even if the weight percentage of the pigment relative to the binder resin is increased to about 60%, it is possible to easily form the coating film having a good developing property in the alkali developing solution described above, insofar as the weight percentage of the binder resin relative to a total amount of the binder resin and the acidic group-containing monomer is more than about 20%.

Here, the expression, "having a good solubility in the alkali developing solution" means that a time period from a time when the development starts to a time when the unexposed part of the coating film begins to dissolve is within 20 seconds, and a time period from a time when the dissolution starts to a time when the dissolution ends is within 15 seconds, and a developing time during which the pattern can be maintained is 20 seconds or more from a time when the dissolution ends.

(Polyfunctional Photocurable Compound (d))

In the second aspect, if the bi- or trifunctional monomer is used as the polyfunctional photocurable compound (d) other than the compound (c), the content ratio thereof is preferable about 0 to 40% by weight, relative to a total solid content of the photocurable resin composition. Furthermore, if the polyfunctional monomer higher than tetrafunctional is used, the content ratio thereof is preferably about 0 to 20% by weight, relative to a total solid content of the photocurable resin composition. Owing to compounding the polyfunctional monomer higher than tetrafunctional, it is possible to improve the strength or the adhesiveness of the coating film relative to the underlying layer.

The bifunctional monomer may be for example, diacrylates dimethacrylates of alkylene glycol such as ethylene glycol, propylene glycol and hexane diol; and diacrylates or dimethacrylates of polyalkylene glycol such as polyethylene glycol and polypropylene glycol.

The trifunctional monomer may be: for example, triacrylates or trimethacrylates of polyalcohol higher than trialcohol, specifically, such as trimethylolpropane triacrylate, trimethylolpropane trimethacrylate, pentaerythriol triacrylate and pentaerythritol trimethacrylate.

The polyfunctional monomer higher than tetrafunctional may be pentaerythritol tetracrylate, pentaerythritol tetramethacrylate, dipentaerythritol pentacrylate, dipentaerythritol hexacrylate and dipentaerythritol hexamethacrylate.

(Colorant)

In the case that a color pattern such as the color layer is formed on the substrate of the color filter, from the photosensitive composition of the present invention, the colorant is compounded in the photosensitive composition. The colorant may be optionally selected and used from the organic colorants and the inorganic colorants, depending on the color of the color layer to be formed, such as red (R), green (G) and blue (B).

The organic colorants may be, for example, dyes, organic pigments, natural dyes and the like. The inorganic colorants may be, for example, inorganic pigments, extender pigments and the like. Among them, the organic pigments are preferable, because of its excellent coloration and high heat resistance.

As specific examples of the organic pigments and the inorganic pigments, pigments listed in the fourth aspect as described later can be used also in the present aspect.

In the present aspect, the colorant can be compounded as appropriate within a range less than about 60% by weight, preferably within a range less than 50% by weight in the curable resin, composition. If the content ratio of the colorant is more than the range described above, the alkali developing property of the coating film formed from the curable resin composition becomes excessively low. Thereby, it may be difficult to form the desired color layer with a high patterning accuracy.

(Dispersing Agent)

In the case that the colorant is compounded in the photosensitive composition of the present invention, the dispersing agent may be dispersed in the photosensitive composition, in order to disperse the colorant uniformly and stably. As the dispersing agent, agents listed in the fourth aspect described later can be used also in the present aspect.

The curable resin composition of the second aspect can be prepared in the same manner as in the first aspect.

When this curable resin composition is applied to some substrate to form a coating layer and then the coating layer is irradiated with activation energy beams such as UV rays or electron beam, the solubility in the alkali developing solution differs between a region which is irradiated with the activation energy beams and a region which is not irradiated with any activation energy beams. In other words, in the region which is irradiated with the activation energy beams, the solubility in the alkali developing solution becomes relatively low, since the cross-link is formed inside of the region. On the other hand, in the region which is not irradiated with any activation energy beams, the solubility in the alkali developing solution becomes relatively high, since the cross-link is not formed inside of the region.

In this case, in the curable resin composition of the second aspect, the exposure region and the non-exposure region are distinctly discriminated in their solubilities, in comparison with the case of using a pentafunctional monomer instead of the acidic group-containing monomer (c3), since the exposure sensitivity is improved owing to the acidic group-containing monomer (c3) represented by the formula (11). Also, even in the case that the content of the acidic group-containing monomer (c3) is increased, or in the case that the content of the colorant such as the organic pigment is increased, the alkali solubility of the non-exposed region is advantageously maintained.

Thereby, substantially only the non-exposed region can be dissolved and removed by performing the alkali development after the exposure. As the result, the coating film can be patterned easily with a high accuracy.

The curable resin composition of the second aspect having these technical effects is particularly suitable for forming a color layer of a color filter, a protective layer for covering the color layer, and a convex spacer (column-shaped spacer) for maintaining a cell gap of a liquid crystal panel. Besides, the composition can be suitably used as a material for forming a negative type permanent film in broad fields, for example, a planarized film of a TFT array substrate or an insulation interlayer for semiconductor devices.

For example, the column-shaped spacers used for the liquid crystal panel is required to have a shape satisfying a relationship $S2 \leqq S1$, in which $S1$ represents an area of the lower surface (a surface facing toward an underlying layer) and $S2$ represents an area of the upper surface. By using the curable resin composition of the second aspect, it is possible to easily form such a so-called tapered shaped convex pattern.

Moreover, from the viewpoint of obtaining a liquid crystal panel with a high image quality and a high resolution, it is required that individual pixels become finer. For this purpose, it is required that individual color layers of a color filter become finer and a concentration of a colorant (organic pigment in many cases) in each color layer becomes higher. By using the curable resin composition of the present aspect, it is possible to form such a color layer with a high patterning accuracy.

Furthermore, it is possible to easily prevent a residual periphery. The residual periphery is a phenomenon that an undeveloped (undissolved) region remains at a periphery of the coating film, due to a fact that a relative film thickness of the periphery becomes inevitably thicker, when the coating film formed by spin coating is subjected to the alkali development.

In the second aspect, at least one of the color layer, protective film and spacers of the color filter as shown in FIG. 3 and FIG. 4 is formed by using the curable resin composition of the present invention as described above.

In the case that the color layer 7 is formed by using the curable resin composition as described above, it is possible to easily obtain a high patterning accuracy, even if the concentration of the pigment in the color layer 7 is increased, or even if the pattern is required to be finer. Also, in the case that spacers, especially the column-shaped spacers 12, are formed by using the photosensitive composition as described above, it is possible to easily form high strength spacers with a high patterning accuracy, even if the spacers are required to be finer.

Therefore, from the viewpoint of obtaining a liquid crystal display device with a high image quality and a high resolution, it is preferable to form at least one of the color layer and the spacers by using the photosensitive composition of the second aspect as described above. Especially, it is preferable to form both the color layer and the spacers by using the photosensitive composition as described above.

Next, an explanation is made on the liquid crystal panel substrate of the second aspect, with reference to FIG. 3 and FIG. 4. This liquid crystal panel substrate is provided with a plurality of spacers in the non-display region on the substrate, and the plurality of spacers is formed by curing the photosensitive composition of the present invention.

As is well known, the liquid crystal panel used for display devices is provided with the display side substrate and the liquid crystal driving side substrate (rear surface side substrate), which are opposite to each other, and between which the gap (cell gap) is defined by spacers. The liquid crystal is filled and sealed in this cell gap.

For example, an active matrix type color liquid crystal display device can be obtained by disposing the color filter 103 (a display side substrate) and the TFT array substrate (a liquid crystal driving side substrate: a rear surface side substrate) provided with a plurality of pixel electrodes and a thin film transistor (TAT) so that these two substrates face to each other, and by forming the gap (cell gap) defined the column-shaped spacers 12 between these substrates, and by filling and sealing the liquid crystal therein.

Here, the column-shaped spacers 12 to define the cell gap is not necessarily formed on the color filter 10, but may be formed on the liquid crystal driving side substrate (rear surface side substrate). Regardless that the column-shaped spacers are on either of these substrates, a desired cell gap can be obtained. In any case, the column-shaped spacers 12 are formed in the non-display region.

In this regard, the liquid crystal panel substrate of the present invention refers to one of two substrates constituting a liquid panel, on which spacers (column-shaped spacers) are formed. Therefore, the color filter as described above is an embodiment of the liquid crystal panel substrate.

In the liquid crystal panel substrate of the second aspect, it is easy to improve the patterning accuracy and the spacer strength, even if the spacers are required to become finer, since spacers are formed by using the curable resin composition of the present aspect. Therefore, this liquid crystal panel substrate is suitable for obtaining the liquid panel with a high image quality and a high resolution.

Next, an explanation is made on the liquid crystal panel of the second aspect. In this liquid crystal panel, the display side substrate is made of the color filter of the present invention as described above, or the liquid crystal driving side substrate (rear surface side substrate) is made of the liquid crystal panel substrate of the present invention as described above.

A method of assembling the liquid crystal panel is not limited to any special method. Nevertheless, the ODF (One Drop Fill) method already described is preferable, in the case of assembling a large sized liquid crystal panel.

In the liquid crystal panel of the second aspect, since the spacers (the column-shaped spacers) are formed on either one of the display side substrate and the liquid crystal driving side substrate (rear surface side substrate), by using the photosensitive composition of the present invention as described above, it is possible to easily form high strength spacers with a high patterning accuracy, even if the spacers are required to be finer. Therefore, it is easy to obtain the liquid crystal panel with a high image quality and a high resolution.

In this regard, insofar as the spacers (the column-shaped spacers) are formed on either one of the display side substrate and the rear surface side substrate, by using the photosensitive composition of the present invention as described above, when the liquid crystal panel is fabricated, it is easy to obtain the liquid crystal panel with a high image quality and a high resolution, regardless of a fact that the liquid crystal panel is a liquid crystal panel for monochrome display, or a fact that the rear surface side panel acts also as a color filter, or a fact that the liquid crystal panel is a horizontal electric field type panel.

EXAMPLE OF SECOND ASPECT

EXAMPLE B SERIES

EXAMPLE B1

A photosensitive composition was obtained by stirring and mixing the following materials at a room temperature.
Green pigment (Monostral Green 6Y-CL available from Zeneca): 4.4 parts by weight.
Yellow pigment (Paliotol Yellow D1819 available from BASF): 2 parts by weight.
Dispersing Agent (AJISPER PB821 available from Ajinomoto Fine-Techno. Co. Inc): 3 parts by weight.
Acidic group-containing monomer (a) (TO756 available from TOAGOSEI CO., LTD.)*[1]: 4 parts by weight.
Binder resin*[2]: 4.6 parts by weight.
Photopolymerization initiator 1 (IRGACURE 907 available from Ciba Specialty Chemicals): 2.8 parts by weight.
Photopolymerization initiator 2 (2,2-bis(o-chlorophenyl)-4,5,4',5'-tetraphenyl-1,2'-biimide available from KUROGANE KASEI Co., Ltd.): 1.2 parts by weight.
Solvent (propylene glycol monomethyl ether acetate): 78 parts by weight.

*1: The acidic group-containing monomer (a) is represented by the following formula (18), and this monomer is one of the acidic group-containing monomers (c3) represented by the aforementioned formula (11).

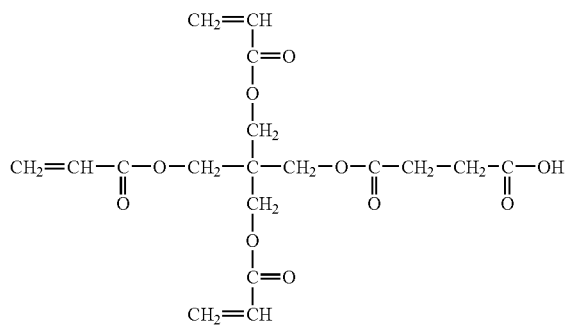

Formula (18)

*2: The binder resin (solid content: 35%) was obtained in such a manner that benzyl methacrylate of 15.6 parts by weight, styrene of 37.0 parts by weight, acrylic acid of 30.5 parts by weight, 2-hydroxy methyl methacrylate of 16.9 parts by weight, diethylene glycol dimethyl ether (DMDG) of 220 parts by weight were fed into a polymerization tank, and stirred to prepare a solution, and then 2,2'-azobis(2-methylbutyronitrile) of 0.8 parts by weight was added thereto and homogeneously dissolved therein, and then, under nitrogen gas flow, the solution was stirred at 85° C. for 2 hours, and then reacted at 100° C. for 1 hour to obtain the resultant solution, and then 2-methacryloyl oxyethyl isocyanate of 16.9 parts by weight, triethylamine of 0.5 parts by weight, and hydroquinone of 0.1 parts by weight were added thereto, and then, the solution was stirred at 100° C. for 5 hours.

COMPARATIVE EXAMPLE B1

A photosensitive composition was obtained in the same manner as in Example B1, except that 4 parts by weight of pentafunctional monomer (SR399E available from NIPPON KAYAKU CO., LTD.) with no acidic group incorporated was used instead of the acidic group containing monomer (c3), and the content of the photopolymerization initiator 1 was 1.4 parts by weight, the content of the photopolymerization initiator 2 was 0.6 parts by weight, and the content of the solvent was 80 parts by weight.

<Evaluation of Developing Property>

Each photosensitive compound obtained in Example B1 and Comparative Example B1 was applied onto a glass substrate of 10 cm square by using a spin coater (1H-DX2 fabricated by MIKASA CORPORATION) to 1.5 μm in thickness. The obtained coating film was pre-baked at 100° C. for 3 minutes on a hot plate. A photo mask which was designed to form an exposure pattern having a predetermined shape, size and intervals, was disposed on the coating film on the substrate. The substrate was irradiated with UV ray at 100 mJ/cm² by a proximity aligner, and then spray-developed (developing time: 60 seconds and 100 seconds) by using 0.05% by weight of KOH aqueous solution (the temperature of the solution: 23° C.), so that the convex pattern was formed.

In this time, the developing property (a time when the coating film starts to dissolve, a time when the coating film ends to dissolve, a pattern maintaining time), whether or not the residue exists after the development, whether or not the residual periphery arises and the shape of the formed convex pattern were compared between the photosensitive composition of Example B1 and the photosensitive composition of Comparative Example B1. In this regard, the evaluation criteria of whether or not the residue exists, and whether or not the residual periphery arises were as follows.

<Whether or Not the Residue Exists>
○: There is no residue.
Δ: Residue can be found with the aid of a projector.
×: Residue can be found without the aid of a projector.

<Whether or Not the Residual Periphery Arises>
○: There is no residual periphery.
Δ: Residual periphery arises only at corners of the substrate.
×: Residual periphery arises at edges of the substrate.

Furthermore in the observation of the shape of the convex pattern, if an area S1 of the lower surface (underlying layer (glass substrate) side surface) and an area S2 of the upper surface of the convex pattern is in a relationship S2<S1, the convex pattern has a forward tapered shape. On the contrary, if S2>S1, the convex pattern has an inverse tapered shape.

TABLE B1

| | | Photosensitive Composition | |
|---|---|---|---|
| | | Example B1 | Comparative Example B1 |
| Developing Property | Dissolution Start Time | 10 s | 25 s |
| | Dissolution Complete Time from Dissolution Start Time | 10 s | 20 s |
| | Pattern Retention Time from Dissolution Complete Time | 65 s | 40 s |
| Residue | | ○ | Δ |
| Residual periphery | | ○ | Δ |
| Shape of convex pattern | | S2 < S1 | S2 > S1 |

As shown in Table B1, the photosensitive composition of Example B1 has a superior alkali developing property and has substantially no residue and the residual periphery, in comparison with the photosensitive composition of Comparative Example B1, even though the content of the colorant (green pigment and yellow pigment) was high (total 6.4% by weight), and the content of monomer was high (4% by weight). Furthermore, it can be patterned easily to a forward tapered shape.

Therefore, the photosensitive composition of Example B1 is suitable for forming the column-shaped spacer, the color layer and the like of the color filter with a high patterning accuracy and a high resolution, and suitable as a material for forming a high strength fine pattern with a high patterning accuracy.

As described above, since the curable resin composition provided by the second aspect includes the acidic group-containing monomer (c3) represented by the formula (11), it is possible to form the coating film having a superior alkali developing property, even if the pigment is contained. Additionally, it is easy to improve the strength after curing. This curable resin composition is suitable as a material for a color layer, a protective layer or a spacer of a liquid crystal panel, for example. Especially, this composition is advantageous to obtain a liquid crystal panel with an improved image quality and an improved resolution.

Also, in the color filter provided by the second aspect, since the color layer, the protective layer or the spacers constructing the color filter is formed by using the curable resin composition, it is easy to improve the patterning accuracy of the color layer, the protective layer or the spacers. Thereby, it is easy to obtain a liquid crystal panel with a high image quality and a high resolution, by using this color filter.

The liquid crystal panel substrate provided by the second aspect is provided with spacers formed by using the curable resin composition. These spacers are easy to improve their strength and patterning accuracy. Thereby, it is easy to obtain a liquid crystal panel with a high image quality and a high resolution, by using this liquid crystal panel.

Furthermore, the liquid crystal panel provided by the second aspect is provided with the color filter as the display side substrate or provided with the liquid crystal panel substrate as the liquid crystal driving side substrate (the rear surface side substrate). Thereby, from the above reasons, it is easy to obtain a liquid crystal panel with a high image quality and a high resolution.

<Third Aspect>

The curable resin composition provided by the third aspect of the present invention is characterized in that the copolymer (a) in the curable resin composition of the first aspect as described above is an imide group-containing copolymer (a1) containing a constitutional unit including the cyclic imide group represented by the following formula (19).

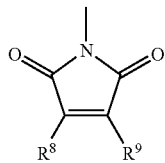

Formula (19)

In the above formula, each of R8 and R9 is an alkyl group having 4 or less carbon atoms independently or one of R8 and R9 is a hydrogen atom and the other is an alkyl group having 4 or less carbon atoms, or both R8 and R9 together form a carbon ring.

When the curable resin composition of the third aspect is applied to some substrate to form a coating film and then the coating film is irradiated with activation energy beams such as ultraviolet rays or electron beam, the cyclic imide group of the imide group-containing copolymer (a1), and the photocurable group of the acidic polyfunctional photocurable compound (c), and further the photocurable group, which may be contained in the imide group-containing copolymer (a1), and polyfunctional photocurable compound (d), which is compounded if needed, cause a photo radical polymerization reaction, and the cyclic imide groups cause a dimerization reaction with each other, so that cross-linking bonds are formed between the imide group-containing copolymer molecules, and then the coating film is cured. After curing, since each of the imide group-containing copolymer (a1) and the acidic polyfunctional photocurable compound (c) has the acidic functional group, a fine pattern can be formed by the alkali development.

There is a limit for the amount of the photocurable group and the acidic functional group, which can be incorporated in the molecule of the binder polymer in order to improve the cross-link density and the alkali solubility of the curable resin composition. Furthermore, if it is contemplated improving the cross-link density and the alkali solubility by simply increasing the amount of the binder polymer having the photocurable group and the acidic functional group, the viscosity of the curable resin composition increases, which often deteriorates the coating property. Also, if the polyfunctional monomer is compounded in the curable resin composition, the cross-link density can be increased, but the alkali solubility can not be increased.

On the contrary, in the present aspect, since the acidic polyfunctional photocurable compound (c) is added to the imide group-containing copolymer (a1), it is possible to improve the reactive site density of the cross-linking reaction, without sacrificing the alkali developing property; and without the excessively increase of the viscosity of the composition. Furthermore, since the cyclic imide group is highly reactive, it is possible to improve the sensitivity of the resin composition. Furthermore, the imide group contained in the imide group-containing copolymer (a1) used for the present aspect has a nature of generating a radical by light irradiation, and performing a photodimerization reaction. Namely, the imide group itself has a photopolymerization initiating function. Thereby, in the curable resin composition of the present invention, since it contains the imide group-containing copolymer, it is advantageously possible to decrease the amount of the polymerization initiator (b) having the tertiary amine structure to be used, and thereby relatively increase the content of the cross-linking components. Therefore, it is possible to obtain the curable resin composition which is superior in any of the sensitivity, the photocurability, the alkali development property. Furthermore, the curable resin composition of the present aspect is superior in a fact that the plastic deformation hardly arises, because the elasticity of the composition at a room temperature after curing is high, owing to a fact that the cyclic imide group is incorporated. Particularly, the composition is suitable for forming the convex spacers.

Therefore, the curable resin composition of the present aspect can form an accurate and precise pattern having various superior physical properties after curing. Furthermore, the composition causes less residue, and has a very high exposure sensitivity, so that it can be cured for a short exposure time. Thereby, it is possible to shorten a time period required for patterning, and improve the production speed of the color filter production line.

In the third aspect, the composition can be prepared and used in the same manner as in the first aspect, except that the imide group-containing copolymer (a1) is used as the copolymer (a). In the following description, the parts common to the first aspect are omitted to be described, the only features specific to the present aspect is described.

(Imide Group-containing Copolymer (a1))

In the present invention, the imide group-containing copolymer (a1) having the molecular structure in which the constitutional unit including the cyclic imide group represented by the following formula (19) and the constitutional unit including the acidic functional group is linked at least, is used as the binder component.

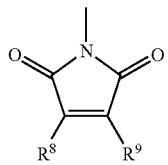

Formula (19)

In the above formula, each of R8 and R9 is an alkyl group having 4 or less carbon atoms independently, or one of R8 and R9 is a hydrogen atom and the other is an alkyl group having 4 or less carbon atoms, or both R8 and R9 together form a carbon ring.

The imide group-containing copolymer (a1) has the cyclic imide group as the photocurable functional group. The cyclic imide group is more reactive than the ethylenically unsaturated bond which is usually used as the photocurable functional group. Thereby, the composition having an improved sensitivity can be obtained by using this imide group-containing copolymer (a1) as the main polymer of the resin composition. Also, since the imide group-containing copolymer (a1) is highly hydrophilic, it has a high compatibility with the acidic polyfunctional photocurable compound (c), so that the applied coating film has advantageously a high uniformity. Furthermore, by containing the imide group-containing copolymer (a1), it is possible to obtain the pattern having high elasticity at a room temperature after curing.

The constitutional unit including the cyclic imide group represented by the formula (19) (the cyclic imide group-containing unit) is a component contributing to the sensitivity of the photocuring reaction, the heat resistance or the chemical resistance of the cured coating film, the elastic deformation modulus or the total deformation modulus at a room temperature after curing, and other physical properties. The content thereof is adjusted, taking into account these physical properties, the extent of the sensitivity required for the curable resin composition, and, if used as spacers, taking into account also the elastic deformation modulus and the total deformation modulus at a room temperature. As the monomer to be used in order to incorporate the cyclic imide group-containing unit into the main chain of the polymer, a compound having the ethylenically unsaturated bond to form a main chain linkage and having the cyclic imide group may be used.

The cyclic imide group represented by the formula (19) may be compounds represented by the following formulae (19a) to (19c), for example.

Formulae (19a) to (19c)

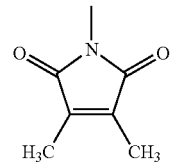

19(a)

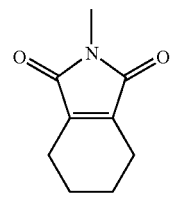

19(b)

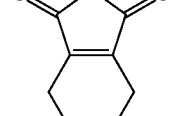

19(c)

The constitutional unit having the cyclic imide group represented by the formula (19) may be units represented by the following formulae (20a) to (20c). Since these constitutional units represented by the formulae (20a) to (20c) are linked to other constitutional units of the main chain, a pendant structure having the cyclic imide group can be incorporated into the molecule of the copolymer.

Formulae (20a) to (20c)

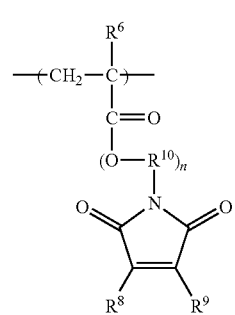

20(a)

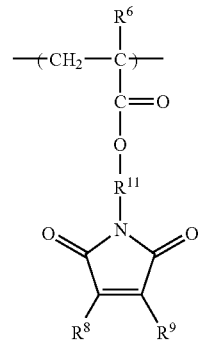

20(b)

-continued

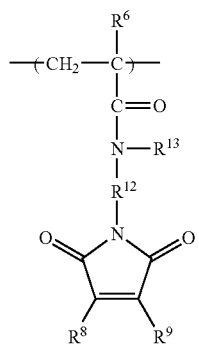

20(c)

In the above formulae, R6 is a hydrogen atom or methyl group. As defined above, each of R8 and R9 is an alkyl group having 4 or less carbon atoms independently, or one of R8 and R9 is a hydrogen atom and the other is an alkyl group having 4 or less carbon atoms, or both R8 and R9 together form a carbon ring. R10 is an alkylene group having 1 to 6 carbon atoms. n is an integer from 1 to 6. R11 is a cycloalkylene group. R12 is an alkylene group or a cycloalkylene group. R13 is a hydrogen atom or an alkyl group.

Among these constitutional units, the cyclic imide group-containing unit represented by the following formula (21) is preferable.

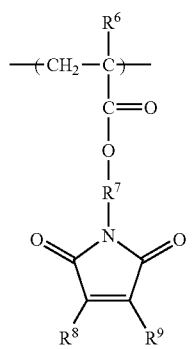

Formula (21)

In the above formula, R6 is a hydrogen atom or methyl group as defined above, R7 is an alkylene group having 1 to 6 carbon atoms. As defined above, each of R8 and R9 is an alkyl group having 4 or less carbon atoms independently, or one of R8 and R9 is a hydrogen atom and the other is an alkyl group having 4 or less carbon atoms, or both R8 and R9 together form a carbon ring.

As the constitutional unit including the acidic functional group, the constitutional unit represented by the formula (3) described above is preferable.

In the case that the imide group-containing copolymer (a1) further contains a constitutional unit including a photocurable functional group other than the cyclic imide group, the cyclic imide group and another photocurable functional group are co-exist as cross-linking functional groups, in the molecule of the imide group-containing copolymer (a1). Thereby, the reactive site density of the cross-linking reaction increases. Therefore, it is possible to obtain the curable resin composition having further improved physical properties such as the strength, the heat resistance, and the chemical resistance of the coating film after curing.

The content of the constitutional unit including the photocurable functional group other than the cyclic imide group (the photocurable functional group-containing unit) is adjusted, depending on the required extent of the photocuring and physical properties after curing.

As the photocurable functional group other than the cyclic imide group, a functional group by which the photocuring reaction is started or promoted can be used. In the context of the present invention, "photocuring" refers to a curing reaction caused by an irradiation with a radiation ray such as UV ray or visible light, a particle beam such as electron beam, or an energy beam having both natures of the particle beam and the radiation ray.

Specifically, a functional group curable by a photoradical reaction such as photoradical polymerization or photoradical dimerization is preferable. Particularly, a photoradical polymerizing functional group having an ethylenically unsaturated bond, such as (meth)acrylic group, is preferable.

As the constitutional unit including the ethylenically unsaturated bond as the photocurable functional group (the ethylenically unsaturated bond-containing unit), the constitutional unit represented by the formula (1) or (2) described above is preferable.

The imide group-containing copolymer (a) may further contain a constitutional unit including an alcoholic hydroxy group (an alcoholic hydroxy group-containing unit). The constitutional unit including an alcoholic hydroxy group (the alcoholic hydroxy group-containing unit, such as alcoholic hydroxy group-containing methylene group or alcoholic hydroxy group-containing methine group) is a constitutional unit which generates radicals by dehydrogenating a hydrogen from the cyclic imide group when the curable resin is subjected to the photocuring, and thereby improves the reactivity of the cyclic imide group and the alcohol hydroxy group-containing unit. In this regard, the alcoholic hydroxy group may be contained in the cyclic imide group-containing unit.

As a monomer to be used in order to incorporate the constitutional unit including the alcoholic hydroxy group into the main chain of the polymer, a compound having the ethylenically unsaturated bond and the alcoholic hydroxy group can be used.

As the alcoholic hydroxy group-containing unit, a constitutional unit represented by the formula (6) described above is preferable.

The copolymer may further contain a constitutional unit including an aromatic carbon ring (an aromatic carbon ring-containing unit). As the aromatic carbon ring-containing unit, a unit represented by the formula (7) described above is preferable.

The copolymer may further a constitutional unit including an ester group (an ester group-containing unit). As the ester group-containing unit, a unit represented by the formula (8) described above is preferable.

As a monomer to be used in order to incorporate each constitutional unit into the main chain of the imide group containing copolymer (a1), one of listed monomers, or a blend of two or more kinds of listed monomers, may be used.

As a particularly preferable cyclic imide group-containing copolymer, there may be a random copolymer or block copolymer represented by the following formula (22) or (23), especially random copolymer. In this regard, the main chain of these copolymers may contain other constitutional units for the main chain, if needed.

Formula (22)

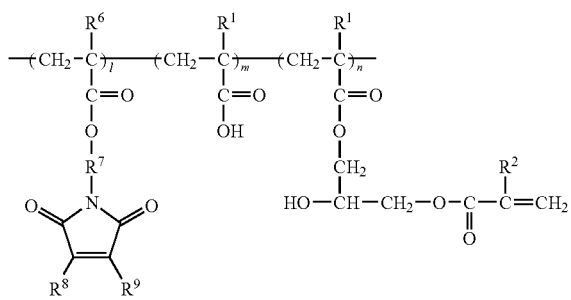

In the above formula, R1, R2, R6 to R8 are the same as defined above, and each R1 may be the same, or may be different from each other. L, m and n are integers.

Formula (23)

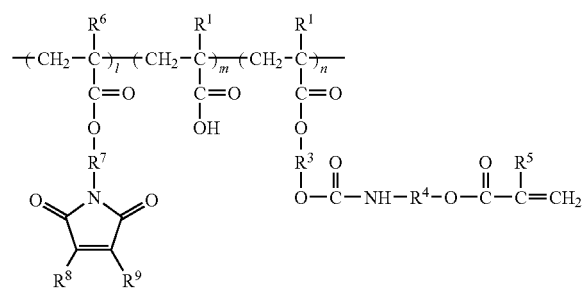

In the above formula, R1, R3 to R5, and R6 to R8 are the same as defined above, and each R1 may be the same, or may be different from each other. L, m and n are integers.

In the present invention, the content ratio of each constitutional unit composing a molecular structure of the imide group-containing copolymer(a) is adjusted as appropriate. If the content ratio of the cyclic imide group-containing unit is excessively low, the sensitivity of the photocuring reaction can not be improved sufficiently. Especially, in the case that spacers are formed, it becomes difficult to adjust the elastic deformation modulus and the total deformation modulus in a suitable range at a room temperature after curing. On the other hand, if the content ratio of the cyclic imide group-containing unit is excessively high, the curing is promoted only at the surface of the coating film, but the curing is insufficient inside of the coating film. Furthermore, if the amount of the acidic functional group-containing unit is excessively low, the alkali solubility becomes insufficient, or if excessively high, the solubility in solvent decreases. Furthermore, if the amount of the photocurable functional group-containing unit is excessively low, the curability becomes insufficient. On the other hand, if the amount of the constitutional unit including the ethylenically unsaturated bond as the photocurable functional group is excessively high, the adhesiveness to substrate decreases.

Specifically, by adjusting the content ratio of the cyclic imide group-containing unit in the imide group-containing copolymer (a1) in a range from 10 mol % to 90 mol %, especially from 40 mol % to 80 mol %, on the basis of monomer feed rate, it is possible to optimize physical properties to which the cyclic imide group-containing unit relates, such as the elastic deformation modulus, the total deformation modulus and the photocuring reactivity.

Specifically, in the case of the copolymer represented by the formula (22) described above, the cyclic imide group-containing unit is in the order of 10 mol % to 90 mol %, (meth)acrylic acid as the acidic functional group-containing unit and as a pendant linkage site of the ethylenically unsaturated bond is in the order of 5 mol % to 85 mol %, and glycidyl(meth)acrylate as a pendant incorporation site of the ethylenically unsaturated bond is in the order of 5 mol % to 45 mol %, on the basis of monomer feed rate.

Furthermore, in the case of the copolymer represented by the formula (23) described above, the cyclic imide group-containing unit is in the order of 10 mol % to 90 mol %, (meth)acrylic acid as the acidic functional group-containing unit is in the order of 8 mol % to 88 mol %, hydroxy alkyl (meth)acrylate as the alcoholic hydroxy group-containing unit and as a pendant linkage site of the ethylenically unsaturated bond is in the order of 1 mol % to 81 mol %, and an isocyanate compound as a pendant incorporation unit of the ethylenically unsaturated bond is in the order of 1 mol % to 45 mol %, on the basis of monomer feed rate.

There is a limit for the amount of the acidic functional group and the cyclic imide group (a total amount of the cyclic imide group and other photocurable functional groups, in the case of containing the cyclic imide group and other photocurable functional groups) to be incorporated into the imide group-containing copolymer (a1), because it is restricted by the copolymer content ratio described above. In the present aspect, however, it is possible to remarkably increase the amount of the acidic functional group and the photocurable functional group in the curable composition, by adding the acidic polyfunctional photocurable compound (c).

A method of synthesizing the copolymer (a) has been described above, and the imide group-containing copolymer (a1) can be synthesized also in the same manner.

The imide group-containing copolymer (a1) may be a random copolymer, or may be a block copolymer. The weight-average molecular weight and the acid value of the imide group-containing copolymer (a1) is the same as in the copolymer (a).

In the present invention, it is preferable to contain the imide group-containing copolymer (a1) in a range of usually 5 to 40% by weight, more preferably 10 to 30% by weight, in the curable resin composition, on the basis of solid content. The imide group-containing copolymer (a1) itself is a cross-linking component. However, if the content of the copolymer (a1) is excessively high, the content of the acidic polyfunctional photocurable compound (c) and/or the content of another polyfunctional photocurable compound (d), which are superior to the copolymer (a1) in the ability of improving the cross-link density, become relatively low. Therefore, if the content of the imide group-containing copolymer (a1) is more than 40% by weight, the cross-link density of the coating film after curing becomes insufficient, resulting in failing to obtain a suitable mechanical strength. On the other hand, if the content of the imide group-containing copolymer (a1) is less than 5% the developing property of the coating liquid deteriorates, which may cause problems including the uneven development, the generation of residue and the like. Furthermore, since the elastic deformation modulus of the pattern formed from the curable resin composition via the light exposure and development becomes small, it becomes difficult to form a pattern having a high elastic deformation modulus and a low plastic deformation modulus in a broad temperature range. Here, the elastic deformation modulus (%) and the plastic deformation modulus (%) are calculated from the following formulae, respectively.

Equation of elastic deformation modulus:

[(elastic deformation amount/total deformation amount)×100](%)

Equation of plastic deformation modulus:

[(plastic deformation amount (T2)/total deformation amount (T1))]×100](%)

(Acidic Polyfunctional Photocurable Compound (c))

In the present aspect, similarly to other aspects, the acidic polyfunctional photocurable compound (c) having a relatively low molecular size, usually less than 3,000 is used.

By using the acidic polyfunctional photocurable compound (c), the flatness of the protective film is improved, the accuracy of the pattern edge shape is improved in the case that the column-shaped spacers are used, and a suitable forward tapered shape can be formed satisfying a relationship, $0.4 \leq (S2/S1) \leq 1$, in which S1 and S2 represent the lower area and the upper area of the column-shaped spacer, respectively.

In the present aspect, it is preferable to use the acidic polyfunctional photocurable compound (c1) or (c2) represented by the formula (9) or (10) described in the first aspect In the third aspect, it is preferable to contain the acidic polyfunctional photocurable compound (c) of 40% by weight or more, more preferably 50% by weight or more, in the curable resin composition, on the basis of solid content. Insofar as the content is in any of listed ranges, it is possible to improve the cross-link density when the resin composition cures, and improve the alkali developing property.

(Photopolymerization Initiator (b) Having the Tertiary Amine Structure, and Other Initiators)

In the third aspect, similarly to other aspects, the photopolymerization initiator (b) having the tertiary amine structure, other initiators and sensitizers are used.

The imide group contained in the imide group-containing copolymer used in the present invention generates radicals via the light irradiation, and causes a photo dimerization reaction. Namely, the imide group itself has a photopolymerization initiating function. Thereby, it is possible to reduce the amount of the polymerization initiator (b), because the curable resin composition of the third aspect contains the imide group-containing copolymer. There is a merit that the content of the cross-linking components can be relatively increased. In the present aspect, the polymerization initiator (b) is contained in the curable resin composition, usually in a range from 0.05 to 5% by weight, on the basis of solid content.

If the content of the polymerization initiator (b) is 5% by weight or less, the exposed part can be usually cured uniformly and sufficiently. If the content of the initiator (b) is more than 5% by weight, the final size of the column-shaped spacer tends to be large relative to the mask aperture, and thereby the size control of the column-shaped spacer may become difficult, although the sensitivity is further improved. On the other hand, if the content of the initiator (b) is less than 0.05% by weight, the photocuring reaction is not promoted, so that the residual film ratio, the beat resistance, and the chemical resistance may be deteriorated.

(Polyfunctional Photocurable Compound (d) Other than the Compound (c))

Also in the third aspect, similarly to other aspects, the polyfunctional photocurable compound (d) having a relatively small molecular size, usually less than 3000 of molecular weight, is used.

Particularly, in the third aspect, it is preferable to use the compound having at least two ethylenically unsaturated bonds and an alcoholic hydroxy group. In the case that the polyfunctional photocurable compound (d) has an alcoholic hydroxy group, it is possible to improve the reactivity of the cyclic imide group and the alcoholic hydroxy group-containing polyfunctional photocurable compound of the copolymer (a), and thereby further improves the sensitivity and the curability of the resin composition, when the curable resin composition is subjected to the photocuring, owing to the dehydrogenation effect of the cyclic imide group of the imide group-containing copolymer (a) on the alcoholic hydroxy group-containing polyfunctional photocurable compound (d).

Specific examples of the polyfunctional photocurable compound (d) having alcoholic hydroxy group includes: 2-hydroxy-1-(meth)acryloxy-3-(meth)acryloxypropane; pentaerythritol di(meth)acrylate monostearate; tetramethylolmethane tri(meth)acrylate; pentaerythritol tri(meth)acrylate; dipentaerythritol hydroxypenta(meth)acrylate; epichlorohydrin modified bisphenol A di(meth)acrylate; epichlorohydrin modified diethylene glycol di(meth)acrylate; epichlorohydrin modified 1,6-hexanediol di(meth)acrylate; triglycerol di(meth)acrylate and so on.

In the third aspect, the content of the polyfunctional photocurable compound (d) is preferably controlled in such a manner that a total content of the acidic polyfunctional photocurable compound (c) and the polyfunctional photocurable compound (d) is usually 60% by weight or more, more preferably 70% by weight or more, in the curable resin composition, on the basis of solid content. The content ratio between the acidic polyfunctional photocurable compound (c) and the polyfunctional photocurable compound (d) is preferably controlled in such a manner that the solid content weight ratio ((c)/{(c)+(d)}) of the acidic polyfunctional photocurable compound (c) relative to a total of the acidic polyfunctional photocurable compound (c) and the polyfunctional photocurable compound (d) is in a range from 0.1 to 1, in view of easy control in the plate making property and the curability of the coating film.

Also, the content ratio among the imide group-containing copolymer (a1), the acidic polyfunctional photocurable compound (c) and the polyfunctional photocurable compound (d) is preferably controlled in such a manner that a solid content weight ratio ((a1)/(c)) of the photocurable compound (c) to the imide group-containing copolymer (a1) in a case that the curable resin composition includes no photocurable compound (d), or a solid content weight ratio ((a1)/{(c)+(d)}) of a total of the photocurable compound (c) and the photocurable compound (d) to the imide group-containing copolymer (a1) in a case that the curable resin composition includes the photocurable compound (d), is 0.7 or less.

Since this weight ratio ((a1)/(c)) or ((a1)/{(c)+(d)}) is 0.7 or less, there is a merit that the curability of the coating film to be formed is sufficient, and various physical strengths such as the adhesiveness and the heat resistance become suitable.

Furthermore, a polyfunctional thiol compound may be added to the curable resin composition of the third aspect. The polyfunctional thiol compound is a compound having at least two, preferably three or more, more preferably four or more mercapto groups (—SH) in its molecule, and has an effect of improving the photocuring reactivity of the curable resin composition and thereby improving the sensitivity and the curability of the curable resin composition and an effect of improving the beat discoloration resistance of the curable resin composition, for example owing to a fact that the cyclic imide group of the imide group-containing copolymer (a) dehydrogenates a hydrogen from the mercapto group of the thiol compound and thereby generates a radical.

Specific examples of the polyfunctional thiol compound includes: mercaptopropionic acid derivatives such as ethylene glycol bisthiopropionate (EGTP), butandiol bisthiopropionate (BDTP), trimethylolpropane tristhiopropionate (TMTP), pentaerithritol tetrakisthiopropionate (PETP), and THEIC-BMPA represented by the following formula (24);

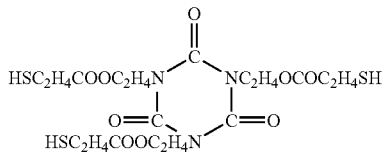

Formula (24)

thioglycolic acid derivatives such as ethylene glycol bisthioglycol ate (EGTG), butandiol bisthioglycolate (BDTG), hexanediol bisthioglycolate (HDTG), trim ethylolpropane tristhioglycolate (TMTG), and pentaerithritol tetrakisthioglycolate (PETG); thiols such as 1,2-benzenedithiol, 1,3-benzenedithiol, 1,2-ethanedithiol, 1,3-propanedithiol, 1,6-hexamethylenedithiol, 2,2'-(ethylenedithio)ethanethiol, meso-2,3-dimercaptosuccinic acid, p-xylenedithiol, and m-xylenedithiol; mercaptoethers such as di(mercaptoethyl) ether.

Among the above listed, pentaerithritol tetrakisthiopionate (PETP), THEIC-BMPA represented by the above formula (24), and pentaerithritol tetrakisthioglycolate (PETG) are preferable.

The polyfunctional thiol compound may cause a problem of the storage stability and the safety work because of its strong odor, when used in large amount. Thereby, in the case that the polyfunctional thiol compound is added to the curable resin composition of the present invention, the content thereof is usually 0.01 to 60% by weight, preferably 10 to 40% by weight, on the basis of solid content. Furthermore, in the case that the polyfunctional photocurable compound (d) is also compounded, an effect of improving the sensitivity of the curable resin composition, even if the content of the polyfunctional thiol compound is low. Thereby, in the case that the polyfunctional photocurable compound (d) is compounded in the curable resin composition, the polyfunctional thiol compound is contained usually in a range from 0.01 to 20% by weight, preferably from 0.1 to 10% by weight, on the basis of solid content, in order to obtain the sufficient sensitivity.

The curable resin composition of the third aspect can be prepared in the same manner as in the first aspect.

When the curable resin composition of the third aspect is applied to some substrate to form a coating film, and the coating film is irradiated with an activation energy beam such as a UV ray or an electron beam, the cyclic imide group or photocurable functional group of the imide group-containing copolymer (a1), the acidic polyfunctional photocurable compound (c), and the polyfunctional photocurable compound (d) or polyfunctional thiol compound optionally added depending on a situation cause a photocuring reaction to form a cross-linking bond between molecules and thereby cured. In this photocuring reaction, the cyclic imide group of the imide group-containing copolymer (a1) is involved in a cross-linking reaction for itself, as well as dehydrogenating a hydrogen from a mercapto group of the polyfunctional thiol compound to form a radical and thereby improving the sensitivity.

Particularly, in the case that the imide group-containing copolymer (a1), the acidic polyfunctional photocurable compound (c) and/or the polyfunctional photocurable compound (d) have a photoradical polymerizing functional group such as an ethylenically unsaturated bond, the cross-linking bond is formed also between the cyclic imide group of the imide group-containing copolymer (a1) and these constitutional units or compounds. This contributes to improving physical properties after curing, and facilitates to obtain physical properties superior in the elastic deformation modulus, the total deformation modulus, the hardness, the strength heat resistance, the adhesiveness, and so on. The cured coating film can be developed in an alkali developing solution such as sodium hydroxide.

In the curable resin composition of the present aspect, even if the content of the polymerization initiator (b) is high, the cross-link density and the alkali solubility can be improved by compounding the acidic polyfunctional photocurable compound (c). Furthermore, even if the acidic polyfunctional photocurable compound (c) is compounded in large amount, the viscosity does not become excessively high. Therefore, the curable resin composition can be applied to a substrate uniformly. The sensitivity thereof is high, during the exposure, so that it cures quickly for a short time. And it has physical properties superior in various points including the hardness, the strength, the adhesiveness, the elastic deformation modulus and the like of the coating film after curing. Furthermore, it is superior in the alkali developing property including the developing speed, the shape after the development, the residue and so on.

In the third aspect, it is possible to obtain a very high sensitive the curable resin composition, of which the minimum light exposure determined by the aforementioned evaluation of the exposure sensitivity is 100 mJ/cm$^2$ or less, preferably 50 mJ/cm$^2$ or less, more preferably 35 mJ/cm$^2$ or less, still more preferably 25 mJ/cm$^2$ or less.

The curable resin composition of the third aspect has not only the superior sensitivity, developing property and curability, but also a high elasticity at a room temperature, because the cyclic imide group is incorporated. Thereby, it is suitable for forming the protective layer for covering the color layer of the color filter and suitable for forming convex spacers to maintain the cell gap of the liquid crystal panel substrate. Especially, it is suitable for forming convex spacers. Besides, it is suitable for forming a negative type permanent film in broad fields, for example, a planarized film of a TFT array substrate or an insulation interlayer for semiconductor devices.

The liquid crystal panel substrate of the third aspect comprises: a transparent substrate; and a colorant layer disposed on the transparent substrate, and optionally comprising: a protective film for covering the colorant layer; and/or a spacer disposed in a non-display region on the substrate, and characterized in that at least one of the protective layer and the spacer is formed by curing the curable resin composition according to the present aspect.

The liquid crystal panel of the third aspect comprises: a display side substrate; a liquid crystal driving side substrate opposite to the display side substrate; and a liquid crystal filled and sealed between these two substrates, and characterized in that at least one of the display side substrate and the liquid crystal driving side substrate is the liquid crystal panel substrate according to the present invention.

In the third aspect, at least one of the color layer, the protective layer and spacers of the liquid crystal panel represented by the color filter 103 as shown in FIG. 3 and FIG. 4 is formed by using the curable resin composition of the present aspect.

Particularly, in the case that the convex spacers of the liquid crystal panel substrate is formed by using the curable resin composition of the present aspect, elastic deformation modulus [(elastic deformation amount/total deformation amount)× 100] against a compressed load of 2.0 GPa at a room temperature is 60% or more, preferably 70% or mote, more preferably 80% or more.

In the present invention, "room temperature" means an environmental temperature common in the daily life, which does not have a distinctive range but includes at least a temperature range from 1° C. to 35° C.

Figure 7:
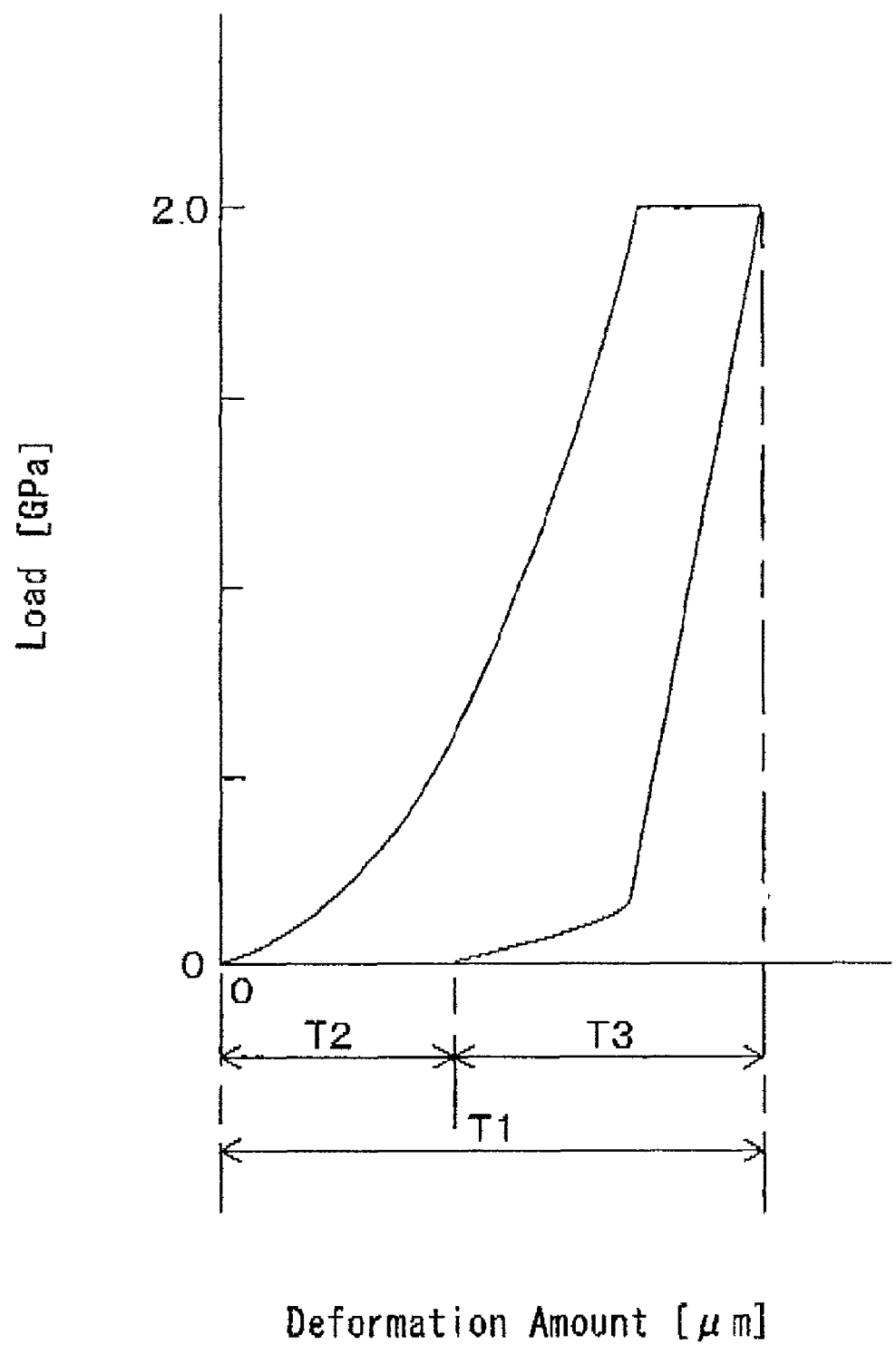
FIG. 7 is a graph showing a relationship between the load and the deformation modulus of a convex spacer.

The elastic deformation modulus of the convex spacers can be determined by the following procedure. As an apparatus for measuring a deformation amount by applying a load to the convex spacers, FisherScopeH-100 (a head of Vickers indenter (square pyramid) is polished to obtain an indenter having a plane of 100μm×100 μm, and this indenter is used) available from Fischer Instruments K.K. can be used. FIG. 7 shows a relationship among the behavior of the spacer, the total deformation amount (T1), the plastic deformation amount (T2) and the elastic deformation amount (T3), in the course of pressing convex spacers having a height, T, and releasing the load with the aid of such an apparatus. The color filter 103 or another liquid crystal panel substrate according to the present invention is first allowed to be left at a room temperature and then the above-mentioned device is used to bring the indenter into contact with the top portion of the above-mentioned spacer and pushed onto the top portion so as to apply a load toward the height direction of the convex spacer (the thickness direction of the film) while the load is increased at a rate of 22 mPa/second. When the compressive load reaches 2.0 GPa, the load is kept for 5 seconds and the total deformation amount (T1) of the convex spacer is measured. Next, by raising up the intender pushed onto the convex spacer, the load is removed at a rate of 22 mPa/second. When the compressive load is returned to zero, the remaining deformation amount, that is, the plastic deformation amount (T2) is measured. By subtracting the plastic deformation amount (T2) from the total deformation amount (T1), the deformation amount restored immediately after the release of the load, that is, the elastic deformation amount (T3) is calculated. By substituting the thus-obtained values of the total deformation amount (T1) and the elastic deformation amount (T3) for the equation of "(elastic deformation amount (T3)/total deformation amount (T1))×100", the elastic deformation modulus (%) can be obtained.

If the elastic deformation modulus of the convex spacer at a room temperature is less than 60%, the spacer undergoes plastic deformation easily at a room temperature so that the spacer does not fulfill its original function, which is the function of maintaining a precise and even cell gap, sufficiently. Specifically, in this case, troubles as described in the following are caused: when a color filter and a liquid crystal driving side substrate are assembled by a room-temperature cell bonding method, pressure unevenness cannot be relieved or absorbed so that gap unevenness is easily generated; when external force such as impact or pressing force is applied to the fabricated liquid crystal panel, the panel is kept in a distorted state and is not apt to be restored to its original state; or the spacer cannot follow thermal contraction and expansion of the liquid crystal within a wide temperature range including room temperature, so that foams are easily generated in the liquid crystal layer.

In the present invention, it is preferable that the elastic deformation modulus of the convex spacer is 60% or more against a compressive load of 2.0 GPa at a room temperature and further the total deformation modulus "=(total deformation amount (T1)/height of the spacer (T)×100)" is 80% or less. If the total deformation modulus is more than 80%, the color filter and the liquid crystal driving side substrate are apt to contact each other so that the color filter or the liquid crystal driving side substrate is injured, at the time of cell bonding process. As a result, display unevenness may be generated.

In the case that the curable resin composition of the third aspect is used, it is possible to form convex spacers having a good pattern edge shape and having the upper area (S2) and the lower area (S1) satisfying a relationship $0.3 \leq (S2/S1) \leq 1$.

Since the convex spacers formed by using the curable resin composition of the present aspect can maintain the gap even if the gap is narrow, the ODF (One Drop Fill) method can be applied.

Furthermore, the completed liquid crystal panel has a high accuracy of cell gap and thereby can prevent the display unevenness. Therefore, the liquid crystal panel of the present aspect hardly causes the display unevenness, and thereby superior in the image quality.

EXAMPLE OF THIRD ASPECT

EXAMPLE C SERIES

EXAMPLE OF PRODUCTION C1

Synthesis of Polymer 3,4,5,6-tetrahydrophthalimide ethylmethacrylate (THPI-MA) of 80 parts by weight, methacrylic acid (MAA) of 20 parts by weight, diethylene glycol dimethyl ether (DMDG) of 185 parts by weight are fed into a polymerization tank, and stirred to prepare a solution. Thereafter, 2,2'-azobis(2-methylbutyronitrile) of 4 parts by weight is added thereto and homogeneously dissolved therein. Thereafter, under nitrogen gas flow, the solution was stirred at 85° C. for 2 hours, and then reacted at 100° C. for 1 hour. To the resultant solution, glycidyl methacrylate (GMA) of 10 parts by weight, triethylamine of 0.5 parts by weight, and hydroquinone of 0.1 parts by weight were added. The solution was stirred at 100° C. for 5 hours to yield the target copolymer resin solution C1 (solid content: 35%).

EXAMPLE OF PRODUCTION C2

Synthesis of Polymer C2

Methyl methacrylate (MMA) of 80 parts by weight, methacrylic acid (MAA) of 20 parts by weight, diethylene glycol dimethyl ether (DMDG) of 185 parts by weight are fed into a polymerization tank, and stirred to prepare a solution. Thereafter, 2,2'-azobis(2-methylbutyronitrile) of 4 parts by weight is added thereto and homogeneously dissolved therein. Thereafter, under nitrogen gas flow, the solution was stirred at 85° C. for 2 hours, and then reacted at 100° C. for 1 hour. To the resultant solution, glycidyl methacrylate (GMA) of 10 parts by weight, triethylamine of 0.5 parts by weight, and hydroquinone of 0.1 parts by weight were added. The solution was stirred at 100° C. for 5 hours and further reacted at 100° C. for 1 hour. To the resultant solution, glycidyl methacrylate (GMA) of 10 parts by weight, triethylamine of 0.5 parts by weight, and hydroquinone of 0.1 parts by weight were added. The solution was stirred at 100° C. for 5 hours to yield the target copolymer resin solution C2 (solid content; 35%).

EXAMPLES C1 TO C2

COMPARATIVE EXAMPLES C1 TO C3

Resin compositions for protective layers were prepared as Example C1 and Comparative Example C1, and resin compositions for column-shaped spacers were prepared as Example C2 and Comparative Examples C2 and C3, in which polymer, monomer, additive, initiator and solvent were mixed at respective ratios shown in Table C1.

In this regard, abbreviations in Table C1 represent the following meanings.

SR399E: dipentaerythritol pentacrylate available from NIPPON KAYAKU CO., LTD.

TO1382: a mixture of dipentaerithritol pentacrylate dibasic anhydride adduct and dipentaerithritol hexacrylate, which are mixed with the mass ratio 3:7, available from TOAGOSEI CO., LTD.

Epikote 180870 orthocresolnovolac type epoxy resin available from Japan Epoxy Resins Co., Ltd.

IRGACURE 907: 2-methyl-1-(4-methylthiophenyl)-2-morpholinopropanone-1 available from Ciba Specialty Chemicals.

IRGACURE 369: 2-benzyl-2-dimethylamino-1-(4-morpholinophenyl)-butanone-1 available from Ciba Specialty Chemicals.

TABLE C1

|  | Compound or Product name | Example C1 | Example C2 | Comparative Example C1 | Comparative Example C2 | Comparative Example C3 |
|---|---|---|---|---|---|---|
| Polymer | Polymer C1 of Production Example C1 (solid content 35%) | 25.7 | 12.9 | 25.7 | 51.4 | 0 |
|  | Polymer C2 of Production Example C2 (solid content 35%) | 0 | 0 | 0 | 0 | 14.35 |
| Photocurable Compound | SR399E | 0 | 0 | 15 | 22.5 | 36.8 |
| Acidic Polyfunctional Photocurable Compound | TO1382 | 16.5 | 38.25 | 0 | 0 | 0 |
| Epoxy Resin | Epikote180S70 | 3 | 0 | 3 | 0 | 0 |
| Polymerization Initiator | IRGACURE907 | 0.75 | 0 | 1.5 | 0 | 0 |
|  | 2,2'-Bis(o-chlorophenyl)-4,5,4',5'-tetraphenyl-1,2'-bisimidazole | 0.75 | 0 | 1.5 | 0 | 0 |
|  | IRGACURE369 | 0 | 2.25 | 0 | 4.5 | 2.25 |
| Solvent | Propylene glycol monomethylether acetate | 53.3 | 46.6 | 53.3 | 21.6 | 46.6 |
|  | Total (wt %) | 100 | 100 | 100 | 100 | 100 |
|  | Ethylenically unsaturated bond group concentration (in solid content) (mmol/g) | — | 7.8 | — | — | 7.8 |

<Evaluation>

(Evaluation of Plate Making Property)

The plate making property was evaluated for each resin composition obtained by Example C1, C2 and Comparative Example C1 to C3, in the same manner as in Example A series of the first aspect. The result is shown in Table C2.

(Evaluation of Sensitivity)

The sensitivity was evaluated for Example C2 and Comparative Example C3, in the same manner as in Example A series of the first aspect. The result is shown in Table C2.

TABLE C2

|  |  | Example C1 | Example C2 |
|---|---|---|---|
| Plate making property | Developing Time | 15 s | 30 s |
|  | Residue | ○ | ○ |
|  | Residual Periphery Adhesiveness | ○ | ○ |
|  |  | — | ○ |
| Sensitivity (minimum exposure) |  | — | 30 mJ/cm² |

|  |  | Comparative Example C1 | Comparative Example C2 | Comparative Example C3 |
|---|---|---|---|---|
| Plate making property | Developing Time | 25 s | 40 s | 80 s |
|  | Residue | Δ | Δ | Δ |
|  | Residual Periphery Adhesiveness | Δ | Δ | X |
|  |  | — | — | ○ |
| Sensitivity (minimum exposure) |  | — | — | 50 mJ/cm² |

—: Not evaluated

Comparative Example C1, in which the imide group-containing copolymer (a1) was used in the same amount of that of Example C1, and the acidic polyfunctional curable compound (c) was not used but only the photocurable compound (d) was used, was inferior to Example C1 of the present invention, in the plate making property.

Comparative Example C2, in which the content of the imide group-containing copolymer (a1) having the acidic functional group was increased, but the acidic polyfunctional curable compound (c) was not used and only the photocurable compound (d) was used, was inferior to Example of the present invention, in the plate making property.

Comparative Example C3, in which the copolymer containing no imide group but containing the photocurable functional group was used instead of the imide group-containing copolymer (a1), had a lower sensitivity than that of Example C2, in which the concentration of the ethylenically unsaturated bond in the solid content of the composition was the same as Comparative Example C3. Namely, it was observed that the sensitivity of Example C2 of the present invention was high. Also, Comparative Example C3 was inferior to Example in the plate making property.

EXAMPLE C3

Fabrication of Liquid Crystal Panel Substrate (1) Formation of Black Matrix

A resin composition for black matrix as shown in Table C3 was applied to a glass substrate having a thickness of 1.1 mm. Thereafter, the black matrix is formed in the same manner as in Example A3 of the first aspect.

TABLE C3

| | Compound or Product name | Manufacturer or Distributor | |
|---|---|---|---|
| Black pigment | TM black #9550 | Dainichiseika Color & Chemicals Mfg. Co., Ltd. | 14 |
| Dispersing Agent | Disperbyk111 | BYK-Chemie Japan KK | 1.2 |
| Polymer | VR60 | SHOWA HIGHPOLYMER CO., LTD. | 2.8 |
| Photocurable Compound | SR399E | Nippon Kayaku Co., Ltd. | 3.5 |
| Additive | L-20 | Soken Chemical & Engineering Co., Ltd. | 0.7 |
| Polymerization Initiator (c) | IRGACURE907 | Ciba Specialty Chemicals | 1.6 |
| Other Polymerization Initiator | 4,4-Diethylamino benzophenone 2,4-Diethylthioxanthone | | 0.6 0.2 |
| Solvent | Ethylene glycol monobutylether | | 75.4 |
| | Total (wt %) | | 100 |

(2) Formation of Color Layer

A color layer made of three colors, red (R), green (G) and blue (B), was formed on the substrate on which the black matrix had been formed as described above, in the same manner as in Example A3 of the first aspect, using a resin composition for red pattern as shown in Table C4, a resin composition for green pattern as shown in Table C6 and a resin composition for blue pattern as shown in Table C6.

TABLE C4

| | Compound or product name | Manufacturer or Distributor | |
|---|---|---|---|
| Red pigment | C.I. Pigment Red 177 | | 4.8 |
| Yellow pigment | C.I. Pigment Yellow 139 | | 1.2 |
| Dispersing Agent | Ajisper PB821 | AJINOMOTO FINE TECHNO CO., INC. | 3 |
| Polymer | Polymer C1 of Production Example C1 | | 5 |
| Photocurable Compound | SR399E | Nippon Kayaku Co., Ltd. | 4 |
| Polymerization Initiator (c) | IRGACURE907 2,2'-Bis(o-chlorophenyl)-4,5,4',5'-tetraphenyl-1,2'-biimidazole | Ciba Specialty Chemicals KUROGANE KASEI CO., LTD. | 2.8 1.2 |
| Solvent | Propylene glycol monomethylether acetate | | 78 |
| | Total (wt %) | | 100 |

TABLE C5

| | Compound or Product name | Manufacturer or Distributor | |
|---|---|---|---|
| Green pigment | C.I. Pigment Green 36 | | 4.2 |
| Yellow pigment | C.I. Pigment Yellow 138 | | 1.8 |
| Dispersing Agent | Ajisper PB821 | AJINOMOTO FINE TECHNO CO., INC. | 3 |
| Polymer | Polymer C1 of Production Example C1 | | 5 |
| Photocurable Compound | SR399E | Nippon Kayaku Co., Ltd. | 4 |
| Polymerization Initiator (c) | IRGACURE907 2,2'-Bis(o-chlorophenyl)-4,5,4',5'-tetraphenyl-1,2'-biimidazole | Ciba Specialty Chemicals KUROGANE KASEI CO., LTD. | 2.8 1.2 |
| Solvent | Propylene glycol monomethylether acetate | | 78 |
| | Total (wt %) | | 100 |

TABLE C6

| | Compound or Product name | Manufacturer or Distributor | |
|---|---|---|---|
| Blue pigment | C.I. Pigment Blue 15:6 | | 6 |
| Dispersing Agent | Ajisper PB821 | AJINOMOTO FINE TECHNO CO., INC. | 3 |
| Polymer | Polymer C1 of Production Example C1 | | 5 |
| Photocurable Compound | SR399E | Nippon Kayaku Co., Ltd. | 4 |
| Polymerization Initiator (c) | IRGACURE907 | Ciba Specialty Chemicals | 2.8 |
| | 2,2'-Bis(o-chlorophenyl)-4,5,4',5'-tetraphenyl-1,2'-biimidazole | KUROGANE KASEI CO., LTD. | 1.2 |
| Solvent | Propylene glycol monomethylether acetate | | 78 |
| | Total (wt %) | | 100 |

(3) Formation of Protective Film

A protective film was formed on the glass substrate on which the color layer had been formed, in the same manner as in Example A3 of the first aspect, using a resin composition for protective layer of Example C1. Thus, a color filter belongs to the liquid crystal panel substrate of the third aspect was obtained.

(4) Formation of Spacers

Fixed spacers were formed on the glass substrate on which the color layer had been formed, in the same manner as in Example A3 of the first aspect, using a resin composition for column-shaped spacers obtained in Example C2. Thus, a liquid crystal panel substrate of the third aspect was obtained.

EXAMPLE C4

Fabrication of Liquid Crystal Panel

A polyimide alignment film was formed on a surface including fixed spacers of the color filter obtained in Example C3, in the same manner as in Example A4 of the first aspect. Then, this color filter was aligned (bonded) with a glass substrate on which TFT had been formed, so as to obtain a cell in which TN liquid crystal was filled and sealed. Thus, a liquid crystal panel of the third aspect was fabricated.

COMPARATIVE EXAMPLE C4

Fabrication of Liquid Crystal Panel Substrate

A liquid crystal panel substrate was fabricated in the same manner as in Example C3, except that resin compositions of Comparative Examples C1, C2 were used instead of resin compositions of Examples C1, C2.

COMPARATIVE EXAMPLE C5

Fabrication of Liquid Crystal Panel

A liquid crystal panel was fabricated in the same manner as in Example C4, except that the liquid crystal panel substrate of Comparative Example C4 was used instead of the liquid crystal panel substrate of Example C3.

(Evaluation of Elastic Deformation Modulus)

A load of 2 GPa was applied on the fixed spacers of each liquid crystal panel substrate obtained in Example C2 and Comparative Example C2, in such a manner that the load is applied in a thickness direction of the spacer with a ratio 22 MPa/second at a room temperature with the aid of Fisher-Scope H-100 available from Fischer Instruments K.K. provided with an indenter having a plane of 100 μm×100 μm obtained by polishing a Vickers indenter (square pyramid). After retaining for 5 seconds, a deformation amount (μm) was measured when the load was released in the thickness direction with a ratio of 22 MPa/second. Then, a total deformation amount T1, a plastic deformation amount T2 and an elastic deformation amount T3 as shown in FIG. 7 are determined. From these, an elastic deformation modulus [(T3/T1)×100] was calculated. The result is shown in Table C7.

TABLE C7

| | | Example C3 | Comparative Example C4 |
|---|---|---|---|
| Performance (Load: 200 mN) (Diameter of column: 12 μmφ) | Total deformation amount (μm) | 1.7 | 1.8 |
| | Plastic deformation amount (μm) | 0.17 | 0.82 |
| | Elastic deformation modulus (%) | 90% | 54% |

(Evaluation of Tapered Shape)

Figure 8:
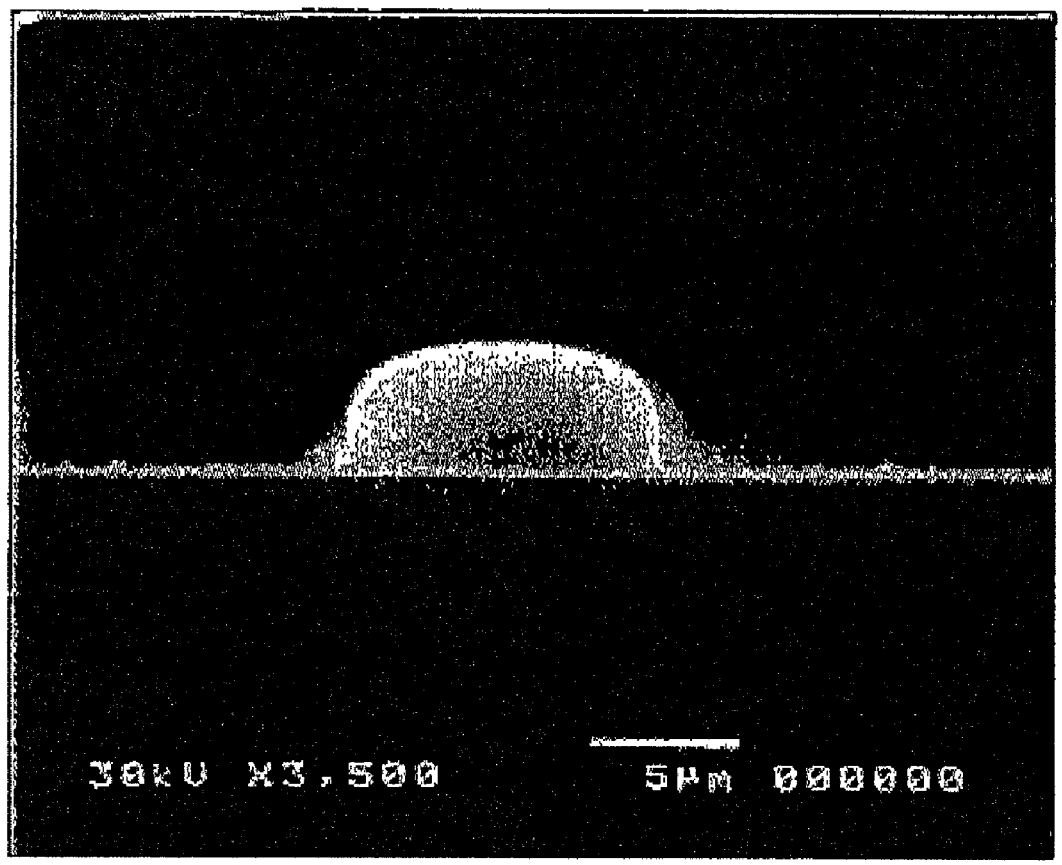
FIG. 8 is a SEM picture showing a side face of a spacer obtained in Example C3.
Figure 9:
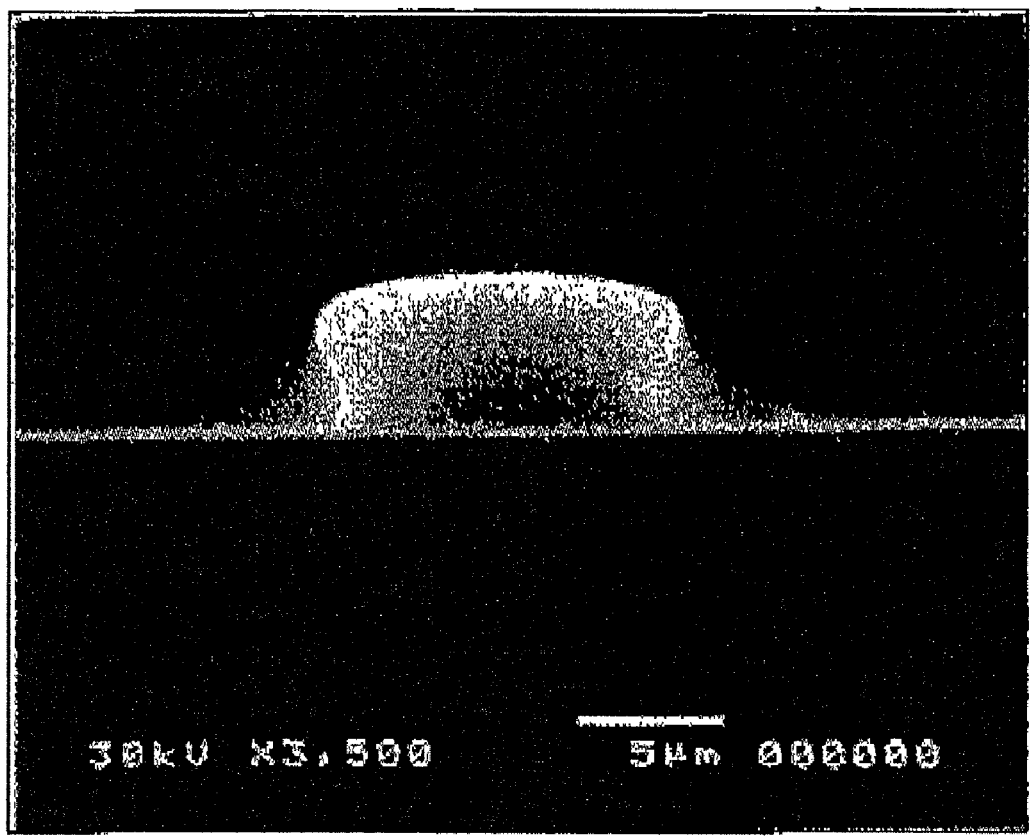
FIG. 9 is a SEM picture showing a side face of a spacer obtained in Comparative Example C4.

The shape of each spacer obtained in Example C3 and Comparative Example C4 was observed from their SEM pictures. These SEM pictures each showing a side surface of each spacer are shown as FIG. 8 and FIG. 9. Furthermore, the upper areas (S2) and the lower areas (S1) were calculated from these SEM pictures, so that the tapered shape (S2/S1) was evaluated. The result is shown in Table C8, with each developing time.

TABLE C8

| | Example C3 | Comparative Example C4 |
|---|---|---|
| Developing time (s) | 30 | 40 |
| S2/S1 | 0.95 | 1.2 |

Example C3 provided a forward tapered shape convex spacer having an improved developing property and an accurate pattern edge shape. On the contrary, Comparative Example C4, in which only the conventional polyfunctional photocurable compound was used instead of the same amount of the acidic polyfunctional photocurable compound (c) used in Example, provided an inverse tapered shape spacer having an inferior developing property and an inferior pattern edge shape.

(Evaluation of Liquid Crystal Panel Display Unevenness)

It was observed whether or not the display unevenness exists, considering the difference between the used curable resin compositions, by using the liquid crystal panels obtained in Example C4 and Comparative Example C5.

In Example C4, the liquid crystal panel has no display unevenness, and was superior in the image quality. On the contrary, Comparative Example C5 was inferior to Example C4, in view of display unevenness.

As described above, in the third aspect, since the imide group-containing copolymer (a1) was used as the binder resin, and the acidic polyfunctional photocurable compound (c) was added thereto, the cross-link density can be increased by the polyfunctional photocurable group without sacrificing the alkali developing property, so that a coating film exhibiting a high elasticity after curing can be obtained. Furthermore, the imide group contained in the imide group-containing copolymer (a1) used in the present aspect has a nature of generating a radical with the light irradiation to cause a photodimerization reaction. Namely, the imide group itself has a photopolymerization initiating function. Thereby, since the curable resin composition of the present aspect contains the imide group-containing copolymer, there is a merit of reducing the amount of the polymerization initiator (b) and increasing the content of the cross-linking components relatively. Therefore, it is possible to obtain the curable resin composition superior in any of the sensitivity, the photocurability, and the alkali developing property.

Therefore, the curable resin composition of the third aspect can form an accurate and precise pattern, which is superior in various physical properties after curing. Furthermore, the curable resin composition of the third aspect has less residue, and has a high exposure sensitivity, so that is can be cured for a short time. Therefore, a time required for pattering can be shortened and a production speed of the color filter production line can be increased.

Furthermore, the curable resin composition of the third aspect is suitable for liquid panel substrates, especially for a protective layer for covering a color layer of a color filter, and especially as a coating material for forming spacers to maintain a cell gap of a liquid crystal panel. Using the curable resin composition of the present aspect makes it possible to form a high flatness protective film or a convex spacer having a accurate and suitable pattern edge shape. Thereby the display unevenness hardly causes when the liquid crystal panel is assembled.

Furthermore, in the liquid crystal panel substrate, it is possible to form spacers having a sufficient hardness and resilience hardly causing a plastic deformation against a compressive load at a room temperature, and having a flexibility allowing to follow an expansion and contraction of the liquid crystal in a temperature range of a use environment of the liquid crystal display device.

Therefore, in the case that the liquid crystal panel substrate of the third aspect is aligned (bonded) with the opposite substrate by a room temperature cell bonding method, it is possible to prevent the gap unevenness from arising by releasing or absorbing the pressure unevenness and uniformizing the load over the entire substrate. As well, it is possible to recover to an original height almost completely after releasing the compressive load and thereby maintain the cell gap at a predetermined distance.

As well, even if the complete liquid crystal panel is deformed temporarily when an external force such as impact or compressive force is applied thereto, the cell gap recovers to its original state. Therefore, it is possible to maintain the cell gap accurately and uniformly, even in the case that the display area of the liquid crystal display device is large, or the case that the cell gap is very narrow. Furthermore, since it can follow the thermal expansion or contraction of the liquid crystal in a broad temperature range including a room temperature, gas bubbles can be prevented from generating.

Therefore, the liquid crystal panel of the third aspect can hardly cause the display unevenness, and superior in the image quality.

<Fourth Aspect>

The curable resin composition provided by the fourth aspect of the present invention is characterized in that a colorant (e) is further contained in the curable resin composition of the first aspect described above and the composition is used for forming a color pattern.

In the curable resin composition of the present aspect, a superior curability and alkali developing property can be obtained, since the cross-link density and the alkali solubility can be improved by compounding the acidic polyfunctional photocurable compound (c), even in the case that a component having no curability and no alkali solubility such as photopolymerization initiator, colorant and dispersing agent is contained in large amount.

In the fourth aspect, the composition can be prepared and used in the same manner as in the first aspect, except that the colorant (e) is added. In the following description, the parts common to the first aspect are omitted to be described, the only features specific to the present aspect are described.

(Colorant (e))

The colorant (e) such as pigment or dye is contained in the curable resin composition for color pattern of the present aspect. As the colorant, a colorant having a heat resistance to withstand a heating process for the color filter and being made of fine particles capable of suitably dispersing can be selected and used from organic colorants and inorganic colorants, depending on a desired color such as R,G,B of the color layer or the black matrix layer.

The organic colorants may be, for example, dyes, organic pigments, natural dyes and the like. The inorganic colorants may be, for example, inorganic pigments, extender pigments and the like.

Specific examples of the organic pigments includes compounds classified as Pigments by Color Index (C.I.; The Society of Dyers and Colourists), that is, compounds having color index numbers (C.I.) as listed below: a yellow pigment such as C.I. pigment yellow 1, C.I. pigment yellow 3, C.I. pigment yellow 12, C.I. pigment yellow 13, C.I. pigment yellow 138, C.I. pigment yellow 150, C.I. pigment yellow 180, and C.I. pigment yellow 185; a red pigment such as C.I. pigment red 1, C.I. pigment red 2, C.I. pigment red 3, C.I. pigment red 254, and C.I. pigment red 171; and a blue pigment such as C.I. pigment blue 15, C.I. pigment blue 15:3, C.I. pigment blue 15:4, C.I. pigment blue 16:6; C.I. pigment violet 23:19;and C.I. pigment green 36.

As well, specific examples of the organic pigments or extender pigments includes titanium oxide, barium sulfate, calcium carbonate, zinc flower, lead sulfate, yellow lead, zinc yellow, iron red (red ferric oxide(III)), cadmium red, ultramarine blue, iron blue, chromium oxide green, cobalt green, umber, titanium black, synthesized iron black, carbon black and so on. In the present invention, the colorant may be used solely, or as a blend of two or more kinds.

In order to obtain the sufficient color concentration, the colorant is contained usually at 20 to 80% by weight, preferably at 25 to 60% by weight, in the curable resin composition, on the basis of solid content. In the curable resin composition of the present invention, a superior curability and alkali developing property can be obtained, since the cross-link density and the alkali solubility can be improved by compounding the acidic polyfunctional photocurable compound (c), even in the case that the colorant is compounded in large amount.

(Photopolymerization Initiator (b))

In the fourth aspect, the photopolymerization initiator (b) having the tertiary amine structure and if needed, another photopolymerization initiator can be used in the same manner as in the first aspect.

(Acidic Poly Functional Photocurable Compound (c))

As the acidic polyfunctional photocurable compound (c), similarly to the first aspect, a compound having a relatively small molecular size, usually less than 3,000 of the weight-average molecular weight is used.

If the acidic polyfunctional photocurable compound (c) is compounded in the photocurable resin composition, the cross-link density is increased owing the photopolymerizing group of the compound (c), and the alkali solubility is improved owing the acidic group of the compound (c). Thereby, a superior curability and alkali developing property can be obtained, since the cross-link density and the alkali solubility can be improved by adding the acidic polyfunctional photocurable compound (c), even in the case that the content of a component of the photocurable resin composition having no curability and having no alkali solubility such as the colorant, the dispersing agent and the photopolymerization initiator is increased.

As the acidic polyfunctional photocurable compound (c), a compounds represented by the above general formulae (9) and (10) are preferable. Specifically, it may be compounds represented by the above formulae (12) to (17), especially the formulae (12) and (13).

(Binder)

As the binder, the copolymer (a) described above can be used in the same manner as in the first aspect, and if needed, a binder resin of the copolymer (a) may be additionally used. In the present aspect, the imide group-containing copolymer (a1) described above is preferably used from among the copolymer (a).

In the curable resin composition of the fourth aspect, the copolymer (a) is preferably contained at usually 5 to 25% by weight, more preferably 10 to 20% by weight. In the case of a high concentration color resist having a colorant content 20% by weight or more, if the content of the copolymer (a) is more than 25% by weight, the curability of the coating film decreases, and the adhesiveness to the substrate deteriorates. On the other hand, if the content of the copolymer (a) is less than 5% by weight, the plate making property of the coating film deteriorates, which may cause problems such as the developing unevenness or residue generation.

(Another Photocurable Compound (d))

In the fourth aspect, similarly to other aspects, a photocurable compound (d) having two or more photocurable functional groups (polyfunctional photocurable compound (d)) may be compounded with the acidic polyfunctional photocurable compound (c).

In the case that the polyfunctional photocurable compound (d) is compounded, the content thereof is usually 27% by weight or less, preferably 20% by weight or less, on the basis of solid content. The content ratio between the acidic polyfunctional photocurable compound (c) and the polyfunctional photocurable compound (d) preferably satisfies a relationship that the weight ratio $((c)\{(c)+(d)\})$ of the acidic polyfunctional photocurable compound (c) relative to a total of the acidic polyfunctional photocurable compound (c) and the polyfunctional photocurable compound (d) is in a range from 0.1 to 1, on the basis of solid content, in view of easy control in the plate making property and the curability of the coating film.

As well, the content ratio among the copolymer (a) as the binder, the acidic polyfunctional photocurable compound (c) and the polyfunctional photocurable compound (d) preferably satisfies a relationship that the weight ratio $((a)/\{(c)+(d)\})$ of the copolymer (a) relative to a total of the acidic polyfunctional photocurable compound (c) and the polyfunctional photocurable compound (d) is 1.5 or less, on the basis of solid content. If the weight ratio $((a)/\{(c)+(d)\})$ is 1.5 or less, the curability of the coating film to be formed becomes sufficient, and various physical properties such as the adhesive strength and the heat resistance becomes suitable.

(Dispersing Agent)

In the curable resin composition for color pattern of the fourth aspect, the colorant (e) is compounded as an essential component. Thereby, a dispersing agent is preferably compounded in the curable resin composition, in order to disperse the colorant uniformly and stably. As the dispersing agent, various surfactants may be used, including cationic type, anionic type, nonionic type, amphoteric type, silicone type, fluorine type and so on, for example. Among these surfactants, polymer surfactants (a polymer dispersing agent) such as listed below are preferable.

That is, polymer surfactants may be preferably used including: polyoxymethylene alkylethers such as polyoxymethylene lauryl ether, polyoxymethylene stearylether, and polyoxymethylene oleylether; polyoxyethylene alkylphenylethers such as polyoxyethylene octylphenylether, and polyoxyethelene nonylphenylether; polyethylene glycol diesters such as polyethylene glycol dilaurate, and polyethylene glycol distearate; sorbitan fatty acid esters; fatty acid modified polyesters; tertiary amine modified polyurethanes and so on.

The curable resin composition of the fourth aspect can be prepared in the same manner as in the first aspect.

The curable resin composition of the fourth aspect is superior in its curability, because the content ratio of the polymerization initiator (b) can be increased, and the cross-link density can be improved by compounding the acidic polyfunctional photocurable compound (c). That is, during the light exposure, the sensitivity is high to cure quickly at a less light exposure. Furthermore, it is possible to provide various physical properties superior in the adhesiveness, the strength, the hardness of the coating film after curing.

According to the present aspect, it is possible to obtain such a very high sensitive photocurable resin composition of which the minimum exposure amount, which is determined in the above-described way, is 100 mJ/cm$^2$ or less, preferably 50 mJ/cm$^2$ or less, more preferably 35 mJ/cm$^2$ or less, and more preferably 25 mJ/cm$^2$ or less.

Furthermore, the curable resin composition of the present aspect is superior in the color concentration and the alkali developing property, because the alkali solubility can be improved by compounding the acidic polyfunctional photocurable compound (c), even if the colorant and the dispersing agent are contained in large amount. That is, the developing speed is high during the development, the color layer after the development has a high color concentration, and a forward tapered shape can be obtained (the area ratio represented by the upper area (S2)/the lower area (S1) is 1 or less). Therefore, the superior strength can be obtained, and a precise and accurate pattern edge can be obtained. As well, there is less residue (insufficient development) at the periphery of the color layer.

The curable resin composition of the present invention is particularly suitable for forming the black matrix layer and the color layer of the color filter.

The color filter of the present aspect comprises a transparent substrate; and a pixel disposed on the transparent substrate, and optionally comprises: a black matrix layer, and characterized in that the pixel and/or the black matrix layer are formed by curing the curable resin composition for color pattern according to the present invention.

The liquid crystal panel of the present aspect comprises: a display side substrate; a liquid crystal driving side substrate opposite to the display side substrate; and a liquid crystal filled and sealed between these two substrates, and characterized in that the display side substrate is the color filter according to the present invention.

Also in the present aspect, the pixel and the black matrix layer of the liquid crystal panel represented by the color filter 103 as shown in FIG. 3 and FIG. 4 are formed in the same manner as in other aspects.

In the case that the curable resin composition of the present invention is used, it is possible to form a high concentration fine pixel having a suitable edge shape and a tapered shape.

Thus, the color filter of the present invention has been explained on focusing a usual color filter. Nevertheless, the curable resin composition of the present invention can be also applied to a display side substrate such as a monochromic color filter.

The color filter for which the black matrix layer and/or the color layer such as pixel are formed by using the curable resin composition of the present aspect is a color filter with a high image quality and a high resolution.

The liquid crystal panel of the present invention, which is superior in the display quality, is obtained by aligning (bonding) the obtained color filter 103 (the display side substrate) with the TFT array substrate (the liquid crystal driving side substrate).

EXAMPLE OF FOURTH ASPECT

EXAMPLE D SERIES

EXAMPLE OF PRODUCTION D1

Synthesis of Polymer D1

Benzyl methacrylate of 15.6 parts by weight, styrene of 37.0 parts by weight, acrylic acid of 30.5 parts by weight, 2-hydroxyethyl methacrylate of 16.9 parts by weight, diethylene glycol dimethyl ether (DMDG) of 200 parts by weight are fed into a polymerization tank, and stirred to prepare a solution. Thereafter, 2,2'-azobis(isobutyronitrile) of 0.8 parts by weight is added thereto and homogeneously dissolved therein. Thereafter, under nitrogen gas flow, the solution was stirred at 85° C. for 2 hours, and then reacted at 100° C. for 1 hour. To the resultant solution, 2-methacryloyl oxyethyl isocyanate of 16.9 parts by weight, triethylamine of 0.5 parts by weight, and hydroquinone of 0.1 parts by weight were added. The solution was stirred at 100° C. for 5 hours to yield the target polymer D1 (solid content: 37.2%).

EXAMPLE D1

COMPARATIVE EXAMPLE D1

Preparation of Resin Composition for Black Matrix

Beads were added to a dispersing solution composition (pigment, dispersing agent and solvent) and dispersed by using a paint shaker for 3 hours. Thereafter, the dispersing solution from which the beads were removed was mixed with a clear resist composition (polymer, monomer, additive, initiator and solvent) to prepare a composition having each content ratio as shown in Table D1.

TABLE D1

|   | Compound or Product name | Manufacturer or Distributor | Example D1 | Comparative Example D1 |
|---|---|---|---|---|
| Black pigment | TM black #9550 | Dainichiseika Color & Chemicals Mfg. Co., Ltd. | 14 | 14 |
| Dispersing Agent | Disperbyk111 | BYK-Chemie Japan KK | 1.2 | 1.2 |
| Polymer | VR60 | SHOWA HIGHPOLYMER CO., LTD. | 2.8 | 2.8 |
| Photocurable Compound | SR399E | Nippon Kayaku Co., Ltd. |  | 3.5 |
| Acidic Polyfunctional Photocurable Compound | TO1382 | TOAGOSEI Co., Ltd. | 3.5 |  |
| Additive | L-20 | Soken Chemical & Engineering Co., Ltd. | 0.7 | 0.7 |
| Polymerization Initiator (b) | IRGACURE907 | Ciba Specialty Chemicals | 1.6 | 1.6 |
| Other Polymerization Initiator | 4,4-Diethylamino benzophenone |  | 0.6 | 0.6 |
|  | 2,4-Diethyl thioxanthone |  | 0.2 | 0.2 |
| Solvent | Ethylene glycol monobutylether |  | 75.4 | 75.4 |
| Total (wt %) |  |  | 100 | 100 |

EXAMPLE D2

COMPARATIVE EXAMPLE D2

Preparation of Resin Composition for Red Pattern

Beads were added to a dispersing solution composition (pigment, dispersing agent and solvent) and dispersed by using a paint shaker for 3 hours. Thereafter, the dispersing solution from which the beads were removed was mixed with a clear resist composition (polymer, monomer, additive, initiator and solvent) to prepare a composition having each content ratio as shown in Table D2.

TABLE D2

|  | Compound or Product name | Manufacturer or Distributor | Example D2 | Comparative Example D2 |
| --- | --- | --- | --- | --- |
| Red pigment | C.I. Pigment Red 177 |  | 4.8 | 4.8 |
| Yellow pigment | C.I. Pigment Yellow 139 |  | 1.2 | 1.2 |
| Dispersing Agent | Disperbyk2001 | BYK-Chemie Japan KK | 3 | 3 |
| Polymer | Polymer D1 of Production Example D1 |  | 5 | 5 |
| Photocurable Compound | SR399E | Nippon Kayaku Co., Ltd. |  | 4 |
| Acidic Polyfunctional Photocurable Compound | TO1382 | TOAGOSEI Co., Ltd. | 4 |  |
| Polymerization Initiator (b) | IRGACURE907 | Ciba Specialty Chemicals | 2.8 | 2.8 |
|  | 2,2'-Bis(o-chlorophenyl)-4,5,4',5'-tetraphenyl-1,2'-biimidazole | KUROGANE KASEI CO., LTD. | 1.2 | 1.2 |
| Solvent | Propylene glycol monomethyl ether acetate |  | 78 | 78 |
|  | Total (wt %) |  | 100 | 100 |

EXAMPLE D3

COMPARATIVE EXAMPLE D3

Preparation of Resin Composition for Green Pattern

Beads were added to a dispersing solution composition (pigment, dispersing agent and solvent) and dispersed by using a paint shaker for 3 hours. Thereafter, the dispersing solution from which the beads were removed was mixed with a clear resist composition (polymer, monomer, additive, initiator and solvent) to prepare a composition having each content ratio as shown in Table D3.

TABLE D3

|  | Compound or Product name | Manufacturer or Distributor | Example D2 | Comparative example D2 |
| --- | --- | --- | --- | --- |
| Green pigment | C.I. Pigment Green 36 |  | 4.2 | 4.2 |
| Yellow pigment | C.I. Pigment Yellow 138 |  | 1.8 | 1.8 |
| Dispersing Agent | Disperbyk2001 | BYK-Chemie Japan KK | 3 | 3 |
| Polymer | Polymer D1 of Production Example D1 |  | 5 | 5 |
| Photocurable Compound | SR399E | Nippon Kayaku Co., Ltd. |  | 4 |

TABLE D3-continued

| | Compound or Product name | Manufacturer or Distributor | Example D2 | Comparative example D2 |
|---|---|---|---|---|
| Acidic Polyfunctional Photocurable Compound | TO1382 | TOAGOSEI Co., Ltd. | 4 | |
| Polymerization Initiator (b) | IRGACURE907 | Ciba Specialty Chemicals | 2.8 | 2.8 |
| | 2,2'-Bis(o-chlorophenyl)-4,5,4',5'-tetraphenyl-1,2'-biimidazole | KUROGANE KASEI CO., LTD. | 1.2 | 1.2 |
| Solvent | Propylene glycol monomethylether acetate | | 78 | 78 |
| | Total (wt %) | | 100 | 100 |

EXAMPLE D4

COMPARATIVE EXAMPLE D4

Preparation of Resin Composition for Blue Pattern

Beads were added to a dispersing solution composition (pigment, dispersing agent and solvent) and dispersed by using a paint shaker for 3 hours. Thereafter, the dispersing solution from which the beads were removed was mixed with a clear resist Composition (polymer, monomer, additive, initiator and solvent) to prepare a composition having each content ratio as shown in Table D4.

TABLE D4

| | Compound or Product name | Manufacturer or Distributor | Example D2 | Comparative Example D2 |
|---|---|---|---|---|
| Blue pigment | C.I. Pigment Blue 15:6 | | 6 | 6 |
| Dispersing Agent | Disperbyk2001 | BYK-Chemie Japan KK | 3 | 3 |
| Polymer | Polymer D1 of Production Example D1 | | 5 | 5 |
| Photocurable Compound | SR399E | Nippon Kayaku Co., Ltd. | | 4 |
| Acidic Polyfunctional Photocurable Compound | TO1382 | TOAGOSEI Co., Ltd. | 4 | |
| Polymerization Initiator (b) | IRGACURE907 | Ciba Specialty Chemicals | 2.8 | 2.8 |
| | 2,2'-Bis(o-chlorophenyl)-4,5,4',5'-tetraphenyl-1,2'-biimidazole | KUROGANE KASEI CO., LTD. | 1.2 | 1.2 |
| Solvent | Propylene glycol monomethylether acetate | | 78 | 78 |
| | Total (wt %) | | 100 | 100 |

(Evaluation of Developing Property)

Each of resin compositions for black matrix and colorant was applied onto a glass substrate of 10 cm square by using a spin coater (1H-DX2 fabricated by MIKASA CORPORATION) to 1.5 μm in thickness. The obtained coating film was pre-baked at 100° C. for 3 minutes on a hot plate. A photo mask, which is designed to form an exposure pattern having a predetermined shape, size and intervals, was disposed on the coating film on the substrate. The substrate was irradiated with UV ray at 100 mJ/cm$^2$ by a proximity aligner, and then spray-developed by using 0.05% by weight of KOH aqueous solution. In this time, time required for the development, residue, residual periphery and adhesiveness were evaluated. Here, the residual periphery refers to whether the periphery of the coating film, which is a thick part produced by spin coating, dissolves or remains. From the residual periphery, it is possible to judge whether the developing property of the resin composition is good or bad.

The result of Examples D1 to D4 and Comparative Examples D1 to D4 is shown in Table D5.

TABLE D5

| | | Example D1 | Example D2 | Example D3 | Example D4 |
|---|---|---|---|---|---|
| Plate Making | Developing Time | 20 s | 15 s | 15 s | 15 s |

TABLE D5-continued

| Property | | | | | |
|---|---|---|---|---|---|
| | Residue | none | none | none | none |
| | Residual Periphery | none | none | none | none |
| | Adhesiveness | ◯ | ◯ | ◯ | ◯ |

| | | Comparative Example D1 | Comparative Example D2 | Comparative Example D3 | Comparative Example D4 |
|---|---|---|---|---|---|
| Plate Making Property | Developing Time | 60 s | 50 s | 48 s | 55 s |
| | Residue | exist | none | none | none |
| | Residual Periphery | exist | exist | exist | exist |
| | Adhesiveness | Δ | Δ | Δ | Δ |

Any of Examples D1 to D4 exhibited a good developing property and no residual periphery. On the contrary, any of Comparative Examples D1 to D4, in which only the conventional polyfunctional photocurable compound was used instead of the same amount of the acidic polyfunctional photocurable compound (c) used in Examples, exhibited some residual periphery and a poor developing property.

EXAMPLE D5

COMPARATIVE EXAMPLE D5

Beads were added to a dispersing solution composition (pigment, dispersing agent and solvent) and dispersed by using a paint shaker for 3 hours. Thereafter, the dispersing solution from which the beads were removed was mixed with a clear resist composition (polymer, monomer, additive, initiator and solvent) to prepare a composition having each content ratio as shown in Table D6.

TABLE D6

| | Compound or Product name | Manufacturer or Distributor | Example D5 | Comparative Example D5 |
|---|---|---|---|---|
| Blue pigment | C.I. Pigment Blue 15:6 | | 6 | 6 |
| Dispersing Agent | Disperbyk2001 | BYK-Chemie Japan KK | 3 | 3 |
| Polymer | Polymer D1 of Production Example D1 (solid content 37%) | | 4.3 | 7 |
| Photocurable Compound | SR399E | Nippon Kayaku Co., Ltd. | | 4 |
| Acidic Polyfunctional Photocurable Compound | TO1382 | TOAGOSEI Co., Ltd. | 4 | |
| Polymerization Initiator (b) | IRGACURE907 | Ciba Specialty Chemicals | 2.8 | 1.4 |
| | 2,2'-Bis(o-chlorophenyl)-4,5,4',5'-tetraphenyl-1,2'-biimidazole | KUROGANE KASEI CO., LTD. | 1.9 | 0.6 |
| Solvent | Propyleneglycol monomethylether acetate | | 78 | 78 |
| | Total (wt %) | | 100 | 100 |

(Evaluation of Sensitivity)

In the same manner as in Example A series of the first aspect, the sensitivity was evaluated for Example D5 and Comparative Example D5. As well, the developing property was evaluated for Example D5 and Comparative Example D5, in the same manner as in Example D1. The result is shown in Table D7.

TABLE D7

| | | Example D5 |
|---|---|---|
| Plate Making Property | Developing Time | 20 s |
| | Residue | none |
| | Residual Periphery | none |
| | Adhesiveness | ◯ |
| Sensitivity (minimum exposure) | | 60 mJ/cm$^2$ |

| | | Comparative Example D5 |
|---|---|---|
| Plate Making Property | Developing Time | 35 s |
| | Residue | exist |
| | Residual Periphery | exist |
| | Adhesiveness | Δ |
| Sensitivity (minimum exposure) | | 100 mJ/cm$^2$ |

Example D5, in which the solid content of the tertiary amine structure photopolymerization initiator (b) was 20% or more, exhibited a higher sensitivity and a superior developing property, in comparison with Comparative Example D5, in which the solid content of the tertiary amine structure photopolymerization initiator (b) was 10% or less, and the acidic

EXAMPLE D6

Fabrication of Color Filter (1) Formation of Black Matrix

The resin composition for black matrix of Example D1 was applied onto a glass substrate having a thickness of 1.1 mm (AL grade available from ASAHI GLASS CO., LTD.) by using a spin coater. Thereafter a black matrix was formed in the same manner as in Example A3 of the first aspect.

(2) Formation of Color Layer

On the substrate on which the black matrix had been formed as described above, a color layer made of three colors, red (R), green (G) and blue (B), was formed in the same manner as in Example A3 of the first aspect, using the resin composition for red pattern of Example D2, the resin composition for green pattern of Example D3 and the blue curable resin composition of Example D4.

(3) Formation of Protective Layer

On the glass substrate on which the color layer had been formed, a protective film was formed in the same manner as in Example A3 of the first aspect, using a resin composition for protective layer as shown in Table D8.

TABLE D8

| | Compound or Product name | Manufacturer or Distributor | |
|---|---|---|---|
| Photocurable Compound | SR399E | Nippon Kayaku Co., Ltd. | 7.1 |
| Polymer | Polymer D1 of Production Example D1 | | 8.8 |
| Epoxy Resin | Epikote180S70 | Japan Epoxy Resins Co., Ltd. | 9.7 |
| Polymerization Initiator | IRGACURE907 | Ciba Specialty Chemicals | 2.4 |
| | 2,2'-Bis(o-chlorophenyl)-4,5,4',5'-tetraphenyl-1,2'-biimidazole | KUROGANE KASEI CO., LTD. | 2 |
| Solvent | Propylene glycol monomethylether acetate | | 70 |
| | Total (wt %) | | 100 |

(4) Formation of Spacers

On the glass substrate on which the color layer had been formed, fix spacers were formed in the same manner as in Example A3 of the first aspect, using a resin composition for column-shaped spacers as shown in Table D9. Thus, a color filter of the present invention was obtained.

TABLE D9

| | Compound or Product name | Manufacturer or Distributor | |
|---|---|---|---|
| Polymer | Polymer D1 of Production Example D1 | | 32 |
| Photocurable Compound | SR399E | Nippon Kayaku Co., Ltd. | 24 |
| Polymerization Initiator | IRGACURE369 | Ciba Specialty Chemicals | 4 |
| Solvent | DMDG | | 40 |
| | Total (wt %) | | 100 |

EXAMPLE D7

Fabrication of Liquid Crystal Panel

In the same manner as in Example A4 of the first aspect, a polyimide alignment film was formed on a surface containing fix spacers of the color filter obtained in Example D6. Then, this color filter was aligned (bonded) with a glass substrate on which TFT had been formed, to obtain a cell. TN liquid crystal was filled and sealed therein. Thus, a liquid crystal panel of the fourth aspect was fabricated.

As described above, in the curable resin composition of the fourth aspect, even if the photopolymerization initiator (b) having the tertiary amine structure as an oxygen quencher is compounded in large amount, and the colorant and the dispersing agent are compounded in large amount, the cross-link density and the alkali solubility can be improved, because that the acidic polyfunctional photocurable compound (c) is compounded. Thereby, the curable resin composition of the fourth aspect is superior in the curability and the alkali developing property, and has a high sensitivity during light exposure, and has a high developing speed during the development. As well, an accurate fine color pattern having a high color concentration and a forward tapered shape can be formed. Furthermore, there is less residue of the exposed part.

Therefore, the curable resin composition of the present aspect is suitable for forming a color filter, especially as a coating material for forming a color layer such as pixel or black matrix of the color filter. That is, by using the curable resin composition of the present aspect, it is possible to form an accurate color pattern superior in the dimensional stability, because of its superior developing property, and a high productivity owing to its high sensitivity.

The color filter of the present aspect is a color filter with a high image quality and a high resolution, because that the black matrix layer and/or the color layer having a tapered shape and a suitable edge shape with a high color concentration, by using the curable resin composition of the present aspect.

The liquid crystal panel formed by using the color filter of the present aspect with a high image quality and a high resolution is superior in its image quality.

What is claimed is:

1. A curable resin composition comprising:
   a copolymer (a) having a molecular structure in which a constitutional unit including an acidic functional group and a constitutional unit including a photocurable functional group are linked at least;
   a photopolymerization initiator (b) having a tertiary amine structure;
   a photocurable compound (c) having at least one acidic functional group and
   at least three photocurable functional groups; and
   at least a kind of colorant (e),
   wherein the photocurable compound (c) is an acidic group-containing monomer (c3) represented by a following formula (11); and
   wherein a weight ratio $[(a)/\{(a)+(c3)\}\times 100\%]$ of the copolymer (a) to a total amount of the copolymer (a) and the acidic group-containing monomer (c3) is 20% to 30%:

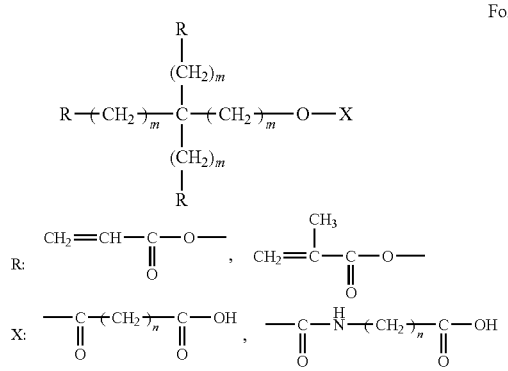

Formula (11)

wherein each of m and n is an integer equal to 1 or more than 1, independently.

2. The curable resin composition according to claim 1, capable of forming a convex pattern having a lower area S1 and an upper area S2 satisfying a relationship S2≦S1, in processes including: forming a coating film and subjecting the coating film sequentially to a selective exposure and an alkali developing treatment.

3. The curable resin composition according to claim 1, further comprising
   a photocurable compound (d) having at least two photocurable functional groups with the proviso that the photocurable compound (d) is other than the photocurable compound (c).

4. A color filter comprising:
   a transparent substrate; and
   a color layer disposed on the transparent substrate, wherein the color layer is formed by curing the curable resin composition according to claim 1; the color filter optionally comprising:
   a protective film for covering the color layer; and/or
   a spacer disposed in a non-display region on the transparent substrate.

5. The curable resin composition according to claim 1, wherein the photopolymerization initiator (b) having the tertiary amine structure is contained at least 5% by weight, on the basis of solid content.

6. The curable resin composition according to claim 1, wherein the copolymer (a) has a molecular weight of 3,000 to 1,000,000.

7. The curable resin composition according to claim 1, wherein the curable resin composition is used for forming a colorant pattern for a color filter.

8. A liquid crystal panel comprising:
   a display side substrate;
   a liquid crystal driving side substrate opposite to the display side substrate; and
   a liquid crystal filled and sealed between these two substrates, wherein the display side substrate is the color filter according to claim 4.

9. The curable resin composition according to claim 1, containing the photocurable compound (c) of 3 to 30% by weight, on the basis of solid content.

* * * * *